United States Patent
Funayama et al.

(10) Patent No.: US 8,569,144 B2
(45) Date of Patent: Oct. 29, 2013

(54) METHOD OF MANUFACTURING SEMICONDUCTOR INTEGRATED CIRCUIT DEVICE

(75) Inventors: Kota Funayama, Kanagawa (JP); Hiraku Chakihara, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/365,183

(22) Filed: Feb. 2, 2012

(65) Prior Publication Data

US 2012/0129317 A1 May 24, 2012

Related U.S. Application Data

(63) Continuation of application No. 12/956,338, filed on Nov. 30, 2010, now Pat. No. 8,133,795.

(30) Foreign Application Priority Data

Dec. 1, 2009 (JP) ................................ 2009-273241

(51) Int. Cl.
*H01L 21/76* (2006.01)
*G03C 5/18* (2006.01)

(52) U.S. Cl.
USPC .................... 438/424; 257/E21.548; 430/147

(58) Field of Classification Search
USPC .......................................................... 438/424
See application file for complete search history.

(56) References Cited

U.S. PATENT DOCUMENTS

| 6,440,816 | B1 | 8/2002 | Farrow et al. |
| 2006/0028868 | A1 | 2/2006 | Okazaki et al. |
| 2006/0108647 | A1 | 5/2006 | Yuan |
| 2007/0170494 | A1 | 7/2007 | Park et al. |
| 2009/0050956 | A1 | 2/2009 | Ishimaru et al. |
| 2009/0122609 | A1 | 5/2009 | Okazaki et al. |

FOREIGN PATENT DOCUMENTS

| JP | 5-326358 A | 12/1993 |
| JP | 9-289153 A | 11/1997 |
| JP | 11-121701 A | 4/1999 |
| JP | 2006-49737 A | 2/2006 |
| JP | 2009-54707 A | 3/2009 |

*Primary Examiner* — William D Coleman
(74) *Attorney, Agent, or Firm* — Miles & Stockbridge P.C.

(57) ABSTRACT

In the present invention, in the exposure to light of a memory cell array or the like of a semiconductor memory or the like, when a group of unit openings for etching the STI trench regions in which the unit openings for etching the STI trench regions each having a rectangular shape are arranged in rows and columns are transferred by the exposure onto a negative resist film, multiple exposure is appropriately used which includes a first exposure step using a first optical mask having a group of first linear openings extending in a column direction and a second exposure step using a second optical mask having a group of second linear openings extending in a row direction.

15 Claims, 48 Drawing Sheets

FIG. 5

| | | CGL0 | MGL | SL0 | BL0 | SELECTED CELL |
|---|---|---|---|---|---|---|
| WRITING | SOURCE-SIDE INJECTION | 1.0 | 10 | 5 | 0.4 | BIT1 |
| ERASING | BTBT | 0 | -6 | 6 | OPEN | CELL COUPLED TO BOTH OF SL0 AND MGL |
| | HOLE INJECTION FROM GATE BY FN TUNNELING | 0 | 15 | 0 | 0 | ALL |
| | HOLE INJECTION FROM SUBSTRATE BY FN TUNNELING | 0 | -15 | 0 | 0 | ALL |
| READING | DIRECTION REVERSE TO THAT FOR WRITING | 1.5 | 1.5 | 0 | 1.5 | BIT1 |
| | SAME DIRECTION AS THAT FOR WRITING | 1.5 | 1.5 | 1.5 | 0 | BIT1 |

METHOD OF MANUFACTURING SEMICONDUCTOR INTEGRATED CIRCUIT DEVICE

CROSS-REFERENCE TO RELATED APPLICATIONS

The application is a continuation of application Ser. No. 12/956,338 filed Nov. 30, 2010 now U.S. Pat. No. 8,133,795. The disclosure of Japanese Patent Application No. 2009-273241 filed on Dec. 1, 2009 including the specification, drawings and abstract is incorporated herein by reference in its entirety.

BACKGROUND OF THE INVENTION

The present invention relates to a technology which is effective when applied to a lithography technique in a method of manufacturing a semiconductor integrated circuit device (or semiconductor device).

In Japanese Unexamined Patent Publication No. Hei 5(1993)-326358 (Patent Document 1), a technology is disclosed in which one negative resist film is exposed to light twice using two masks having respective band-like light shielding portions orthogonal to each other so as to prevent the shape of a corner portion of a contact hole from being rounded.

In Japanese Unexamined Patent Publication No. Hei 9 (1997)-289153 (Patent Document 2), a technology is disclosed in which, in photolithographic processing using a polycide gate electrode and a positive resist in a polycide pattern proximate thereto, one negative resist film is exposed to light twice using two masks having different shielding patterns so as to prevent the shape of a corner portion of the pattern from being rounded.

In Japanese Unexamined Patent Publication No. Hei 11 (1999)-121701 (Patent Document 3), a technology is disclosed in which, in association with photolithography of a Shallow Trench Isolation (STI) region of a NOR-type semiconductor memory device, to avoid an end portion of a rectangular pattern from being rounded due to a proximity effect, a silicon substrate is dry-etched using a hard mask pattern and a line-and-space pattern formed of resist films orthogonal thereto as an etching-resistant mask, and thereby formed with trenches.

In Japanese Unexamined Patent Publication No. 2006-49737 (Patent Document 4) or US Patent Publication No. 2009-122609 (Patent Document 5) corresponding thereto, a technology is disclosed in which, in a flash memory having a split-gate flash memory cell having a Metal Oxide Nitride Oxide Semiconductor (MONOS) structure or a Silicon Oxide Nitride Oxide Silicon (SONOS) structure, write disturb applied to a non-selected memory cell adjacent to a write selected memory cell via a source region is prevented.

In Japanese Unexamined Patent Publication No. 2009-54707 (Patent Document 6) or US Patent Publication No. 2009-050956 (Patent Document 7) corresponding thereto, a technology is disclosed in which, in a flash memory having a split-gate flash memory cell using a MONOS structure or a SONOS structure, disturb resistance during writing in accordance with a Source Side Injection (SSI) method is improved.

PRIOR ART DOCUMENTS

Patent Documents

[Patent Document 1]
    Japanese Unexamined Patent Publication No. Hei 5 (1993)-326358
[Patent Document 2]
    Japanese Unexamined Patent Publication No. Hei 9 (1997)-289153
[Patent Document 3]
    Japanese Unexamined Patent Publication No. Hei 11 (1999)-121701
[Patent Document 4]
    Japanese Unexamined Patent Publication No. 2006-49737
[Patent Document 5]
    US Patent Publication No. 2009-122609
[Patent Document 6]
    Japanese Unexamined Patent Publication No. 2009-54707
[Patent Document 7]
    US Patent Publication No. 2009-050956

SUMMARY OF THE INVENTION

In a semiconductor integrated circuit device having a structure in which a plurality of transistor cells having a common gate are arranged in an array, in the step of patterning Shallow Trench Isolation (STI) regions, a STI pattern having a laterally elongated rectangular shape needs to be formed as a repeated pattern in a longitudinal direction. When the minimum dimension of the rectangular shape is on the same level as or shorter than an exposure wavelength (wavelength of an exposing light beam or electromagnetic wave), a proximity effect becomes prominent at an end portion of the rectangular shape to increase the deformation of the pattern. There is a concern that such pattern deformation may affect device parameters such as the gate width of a memory gate longitudinally traversing the vicinity of the end portion.

The present invention has been achieved in order to solve these problems.

An object of the present invention is to provide a manufacturing process for a semiconductor integrated circuit device with high reliability.

The above and other objects and novel features of the present invention will become apparent from a statement in the present specification and the accompanying drawings.

The following is a brief description of the outline of a representative aspect of the invention disclosed in the present application.

That is, in accordance with an aspect of the present invention, in the exposure to light of a memory cell array or the like of a semiconductor memory or the like, when a group of unit openings for etching STI trench regions in which the unit openings for etching the STI trench regions each having a rectangular shape are arranged in rows and columns are transferred by the exposure onto a negative resist film, multiple exposure is appropriately used which includes a first exposure step using a first optical mask having a group of first linear openings extending in a column direction and a second exposure step using a second optical mask having a group of second linear openings extending in a row direction (in which either the first exposure step or the second exposure step may be performed first).

The following is a brief description of effects achievable by the representative aspect of the invention disclosed in the present application.

That is, in the exposure to light of a memory cell array or the like of a semiconductor memory or the like, when the group of unit openings for etching the STI trench regions in which the unit openings for etching the STI trench regions each having a horizontally elongated substantially rectangular shape are arranged in rows and columns are transferred by the exposure onto a negative resist film, the multiple exposure is appropriately used which includes the first exposure step using the first optical mask having the group of first linear openings extending in the column direction and the second exposure step using the second optical mask having the group of second linear openings extending in the row direction. Therefore, it is possible to avoid a proximity effect at an end portion of the rectangular shape.

BRIEF DESCRIPTION OF THE DRAWINGS

FIG. 5 shows an example of conditions for voltages applied to individual lines (a selection gate line, a memory gate line, a source line, and a bit line) during writing, erasing, and reading to and from a selected cell in the split-gate flash memory shown in FIG. 1;

Figure 1:
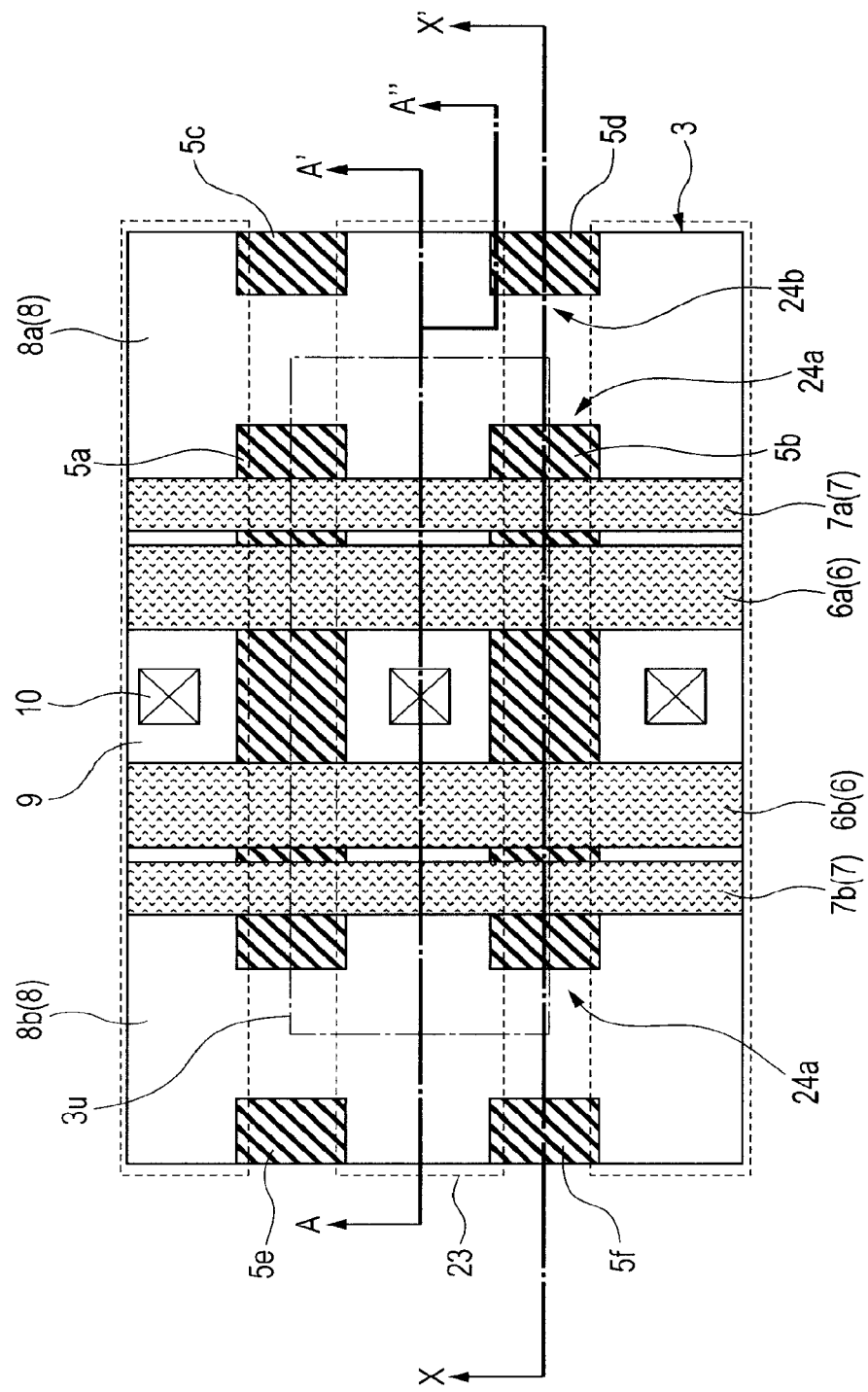
FIG. 1 is a partial top view of a memory cell array in a split-gate flash memory having a MONOS memory structure as an example of a device as a target of a method of manufacturing a semiconductor integrated circuit device in an embodiment of the present invention.

DESCRIPTION OF THE PREFERRED EMBODIMENTS (Explanation of Description Form, Basic Terminology, and Use Thereof in Present Invention)

1. In the present invention, if necessary for the sake of convenience, the description of an embodiment may be such that the embodiment is divided into a plurality of sections in the description thereof. However, they are by no means independent of or distinct from each other unless particularly explicitly described otherwise, and one of the individual parts of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a specific number, or unless it is obvious from the context that the constituent element is indispensable.

Also in the present invention, when a "semiconductor device" or semiconductor integrated circuit device" is mentioned, it primarily refers to various single-element transistors (active elements), and to a device in which a resistor, a capacitor, and the like are integrated around such a single-element transistor over a semiconductor chip or the like (e.g., a single-crystal silicon substrate). Representative examples of various transistors that can be shown include Metal Insulator Semiconductor Field Effect Transistors (MISFETs) represented by a Metal Oxide Semiconductor Field Effect Transistor (MOSFET). Representative examples of an integrated circuit structure that can be shown include Complementary Metal Insulator Semiconductor (CMIS) integrated circuits represented by a Complementary Metal Oxide Semiconductor (CMOS) integrated circuit which is a combination of an N-channel MISFET and a P-channel MISFET.

In general, a wafer process for a present-day semiconductor integrated circuit device, i.e., Large Scale Integration (LSI) can be roughly sub-divided into a Front End of Line (FEOL) process from the loading of a silicon wafer as a raw material to a premetal process (process including the formation of an interlayer insulating film between the lower end of a MI wiring layer and a gate electrode structure or the like, the formation of a contact hole, the burying of a tungsten plug, and the like) or the like and a Back End of Line (BEOL) process starting with the formation of the MI wiring layer, and ending at the formation of a pad opening in a final passivation film over an aluminum-based pad electrode or the like (a wafer-level packaging process is also included in the BEOL process). In the FEOL process, a gate electrode patterning step, a contact hole forming step, and the like are microfabrication steps in which particularly fine fabrication is required. On the other hand, in the BEOL process, microfabrication is particularly required in the step of forming vias and trenches, especially in local wiring in relatively low layers (for example, M1 to around M3 in buried wiring of an approximately four layer structure, and M1 to around M5 in buried wiring of an approximately ten layer structure) and the like. Note that "MN (N=1 to about 15 is normally satisfied)" represents an N-th layer wiring from the bottom, and M1 and M3 are a first-layer wiring and a third-layer wiring, respectively.

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise, or unless it is obvious from the context that it excludes such a material, a composition, or the like. For example, when a component is mentioned, the wording means "X containing A as a main component" or the like. It will be appreciated that, even when a "silicon member" or the like is mentioned, it is not limited to pure silicon, and a member containing a SiGe alloy, another multi-element alloy containing silicon as a main component, another additive, or the like is also included. Likewise, it will also be appreciated that, even when a "silicon dioxide film", "silicon-oxide-based insulating film", or the like is mentioned, it includes not only a relatively pure undoped silicon dioxide, but also a thermal oxide film of Fluorosilicate Glass (FSG), TEOS-based silicon oxide, Silicon Oxicarbide (SiOC), Carbon-doped Silicon oxide, Organosilicate glass (OSG), Phosphorus Silicate Glass (PSG), Borophosphosilicate Glass (BPSG), or the like, a CVD oxide film, a coated silicon oxide such as Spin ON Glass (SOG) or Nano-Clustering Silica (NCS), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless particularly explicitly described otherwise. Likewise, when "SiCN" is mentioned, it includes both of SiCN and SiCNH unless particularly explicitly described otherwise.

SiC has properties similar to those of SiN but, in most cases, SiON should rather be categorized into a silicon-oxide-based insulating film.

Silicon nitride films are not only greatly used as etch stop films in a Self-Aligned Contact (SAC) technology, but also as stress applying films in a Stress Memorization Technology (SMT).

Likewise, when "nickel silicide" is mentioned, it typically refers to nickel monosilicide, but includes not only relatively pure nickel monosilicide but also an alloy, a mixed crystal, and the like each containing nickel monosilicide as a main component. Also, silicide is not limited to nickel silicide, and may be conventionally used cobalt silicide, titanium silicide, tungsten silicide, or the like. As a metal film for silicidation, not only a nickel (Ni) film, but also a nickel alloy film such as, e.g., a Ni—Pt alloy film (alloy film of Ni and Pt), a Ni—V alloy film (alloy film of Ni and V), a Ni—Pd alloy film (alloy film of Ni and Pd), a Ni—Yb alloy film (alloy film of Ni and Yb), or a Ni—Er alloy film (alloy film of Ni and Er) or the like can be used. Note that such silicide containing nickel as a main metal element thereof is generally referred to as "nickel-based silicide".

3. Likewise, it will also be appreciated that, although a preferred example is shown in association with a graphical figure, a position, an attribute, or the like, the graphical figure, position, or attribute is not strictly limited thereto unless particularly explicitly described otherwise, or unless it is obvious from the context that the graphical figure, position, or attribute is strictly limited thereto.

4. Further, when a specific numerical value or numerical amount is mentioned, it may be either more or less than the specific numerical value unless particularly explicitly described otherwise, unless the numerical value is theoretically limited to the number, or unless it is obvious from the context that the numeral value is limited to the number.

5. When a "wafer" is mentioned, it typically refers to a single-crystal silicon wafer over which a semiconductor integrated circuit device (the same as a semiconductor device or an electronic device) is formed, but it will be appreciated that the "wafer" also includes a composite wafer of an insulating substrate and a semiconductor layer or the like, such as an epitaxial wafer, a SOI substrate, or an LCD glass substrate.

6. When "chemical mechanical polishing" or CMP is mentioned, it includes not only CMP using floating abrasive grains, but also CMP using fixed abrasive grains.

(Detailed Description of Embodiment)

Embodiments of the present invention will be further described in detail. In each of the drawings, the same or similar parts are denoted by the same or similar marks or reference numerals, and a description thereof will not be repeated in principle.

In the accompanying drawings, hatching or the like may be omitted even in a cross section when hatching or the like results in complicated illustration or when the distinction between the section to be hatched and a vacant space is distinct. In relation thereto, even a two-dimensionally closed hole may have a background outline thereof omitted when it is obvious from the description or the like that the hole is two-dimensionally closed and so on. On the other hand, even a portion other than a cross section may be hatched to clearly show that the hatched portion is not a vacant space.

§1. Description of Basic Operation of Split-Gate Flash Memory Using MONOS Structure or SONOS Structure as Example of Device as Target of Method of Manufacturing Semiconductor Integrated Circuit Device in Embodiment of Present Invention, Etc. (Mainly Using FIGS. 1 to 5)

Flash memories described herein are typically used as embedded memories which are embedded in a Central Processing Unit (CPU), and other chips such as a logic circuit chip and a signal processing circuit chip. Accordingly, a wiring system is normally, e.g., a multi-layer copper damascene wiring, but only a first-layer wiring thereof is described herein. Note that, as a dedicated memory, a flash memory can also be mounted on an independent chip.

Figure 2:
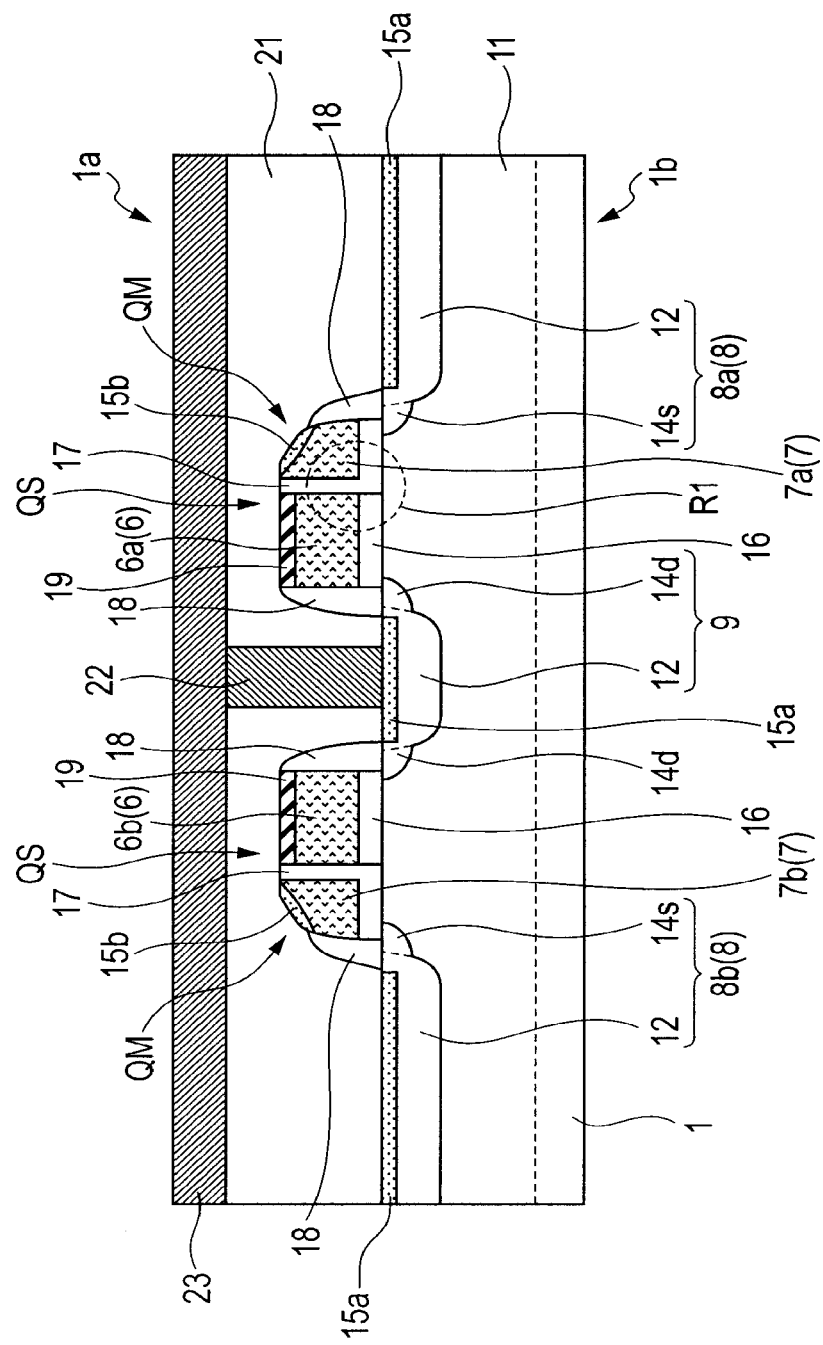
FIG. 2 is a device schematic cross-sectional view corresponding an A-A' cross section of FIG. 1.
Figure 3:
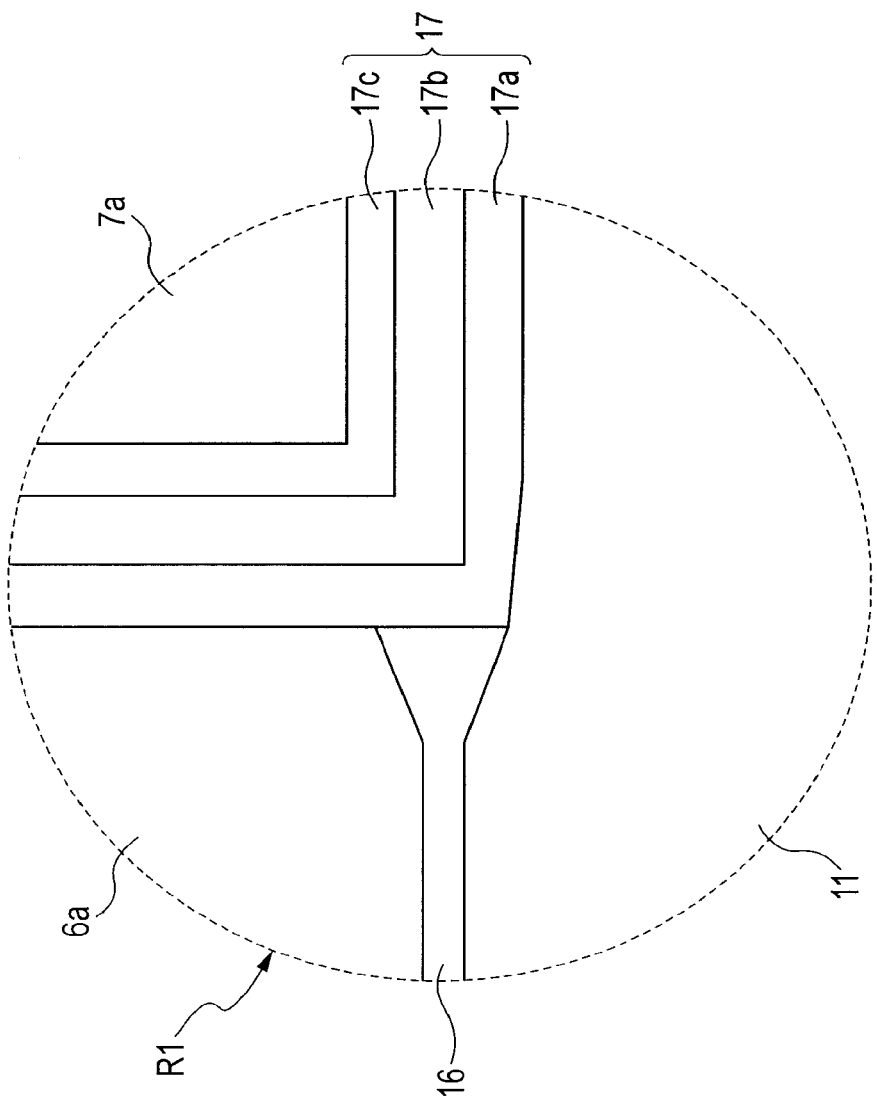
FIG. 3 is a partial enlarged cross-sectional view of a peripheral portion R1 of an ONO film shown in FIG. 2.
Figure 4:
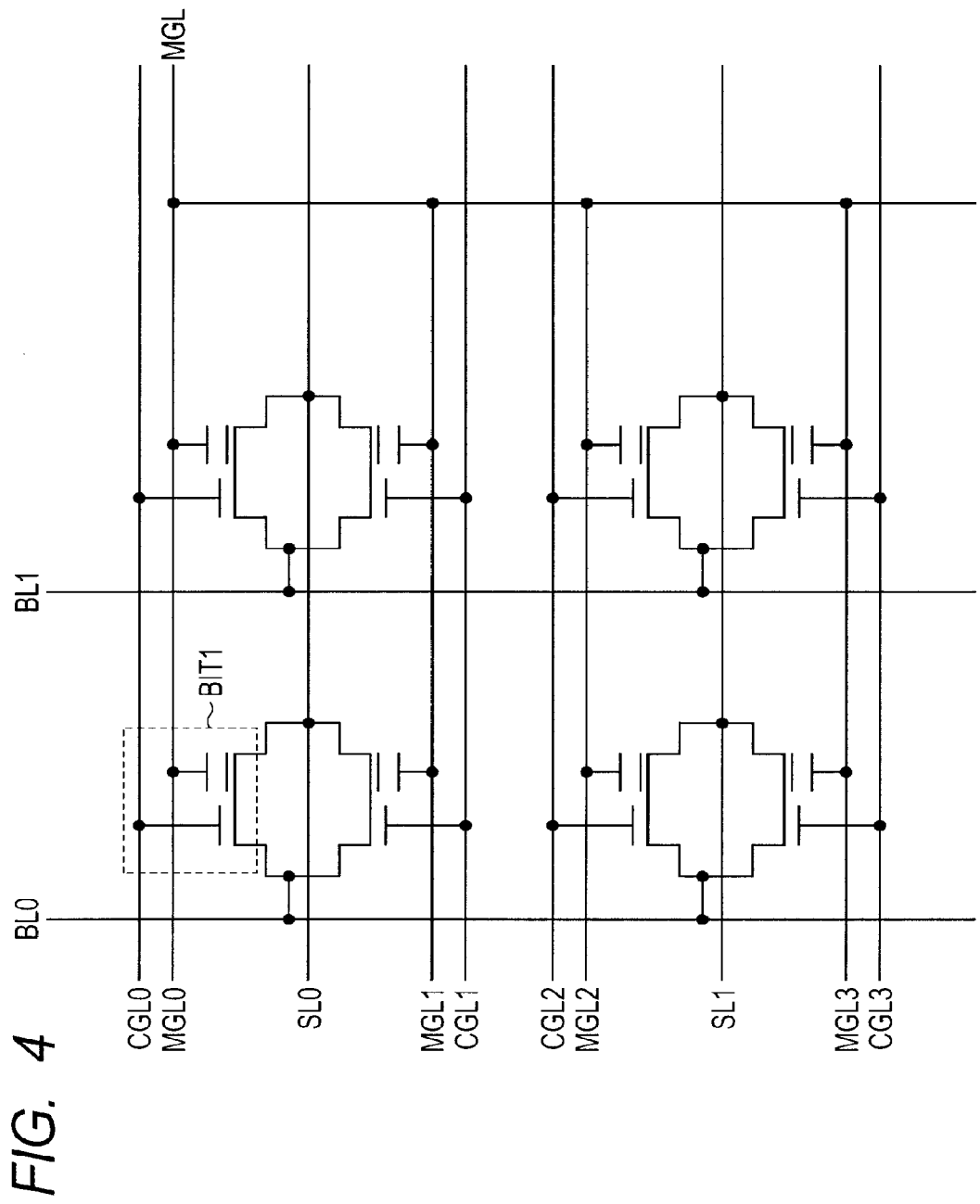
FIG. 4 is a circuit structural diagram of a memory cell array in the split-gate flash memory shown in FIG. 1.

FIG. 1 is a partial top view of a memory cell array in a split-gate flash memory having a MONOS memory structure as an example of a device as a target of a method of manufacturing a semiconductor integrated circuit device in an embodiment of the present invention. FIG. 2 is a device schematic cross-sectional view corresponding an A-A' cross section of FIG. 1. FIG. 3 is a partial enlarged cross-sectional view of a peripheral portion R1 of an ONO film shown in FIG. 2. FIG. 4 is a circuit structural diagram of a memory cell array in the split-gate flash memory shown in FIG. 1. FIG. 5 shows an example of conditions for voltages applied to individual lines (a selection gate line, a memory gate line, a source line, and a bit line) during writing, erasing, and reading to and from a selected cell in the split-gate flash memory shown in FIG. 1.

First, an example of a structure of a split-gate MONOS memory cell which is a device as the target of the method of manufacturing the semiconductor integrated circuit device in the embodiment of the present invention will be described using FIGS. 1 to 3. Based on the drawings, a description will be given of a memory cell structure of the split-gate flash memory using a MONOS structure or a SONOS structure as an example of the device as the target of the method of manufacturing the semiconductor integrated circuit device in the embodiment of the present invention, a basic structure of the memory cell array thereof, and a basic operation thereof.

First, a structure of a memory cell portion 3 (memory cell array) will be described. The memory cell portion 3 has a two-dimensional repeated structure having a memory-cell repeated unit region 3u as a unit cell or a unit lattice. As shown in FIGS. 1 to 3, a semiconductor substrate 1 is comprised of, e.g., p-type single-crystal silicon, and a p-well 11 is formed therein through introduction of a p-type impurity at a concentration higher than that of the substrate portion. In an active region of a first main surface 1a (device formation surface, i.e., a surface opposite to a back surface 1b) of the semiconductor substrate 1, an n-channel MISFET (QS) for selecting a memory cell and an n-channel MISFET (QM) for a memory purpose are arranged. A drain region 9 and source regions 8a and 8b of the memory cell have, e.g., relatively low-concentration n⁻-type semiconductor regions 14d and 14s (which are respectively an N-type drain extension region and an N-type source extension region), and a relatively high-concentration n⁺-type semiconductor region (N-type high-concentration region) having a relatively high impurity concentration higher than those of the n⁻-type semiconductor regions 14d and 14s (Lightly Doped Drain (LDD) structure). The n⁻-type semiconductor regions 14d and 14s are disposed closer to the channel region of the memory cell, while the n⁺-type semiconductor region 12 is disposed at a position away from the channel region of the memory cell by a distance corresponding to the n⁻-type semiconductor regions 14d and 14s. Over the n⁺-type semiconductor region 12, a silicide layer 15a (over source/drain regions) such as a nickel silicide layer is provided.

Over the main surface 1a of the semiconductor substrate 1 between the drain region 9 and the source regions 8a and 8b, selection gate electrodes 6a and 6b of the selection re-channel MISFET (QS) described above, i.e., a selection transistor and memory gate electrodes 7a and 7b of the memory n-channel MISFET (QM) described above, i.e., a memory transistor extend in adjacent relation, and a plurality of memory cells lie adjacent to each other in the extending direction thereof via isolation portions 5a, 5b, 5c, 5d, 5e, and 5f (STI regions). That is, a pair of word lines 6a and 6b longitudinally traverse, at predetermined space intervals, each row of a group of the STI regions arranged in a matrix.

In the same manner as over the source/drain regions and as described above, over the memory gate electrodes 7a and 7b, silicide layers 15b such as nickel silicide layers are provided. Over the selection gate electrodes 6a and 6b, cap insulating films 19 are provided. In addition, outside the memory gate electrodes 7a and 7b and inside the selection gate electrodes 6a and 6b, sidewall spacers 18 are provided.

Between the selection gate electrodes 6a and 6b and the main surface of the semiconductor substrate 1, gate insulating films 16 each comprised of, e.g., a thin silicon dioxide film having a thickness of about 1 to 5 nm are provided. As each of the gate insulating films 16, not only a silicon dioxide film, but also a silicon oxynitride film or a metal oxide film having a dielectric constant higher than that of a silicon nitride film such as a hafnium dioxide film, an aluminum oxide (alumina) film, or a tantalum oxide film may be used.

The memory gate electrodes 7a and 7b are provided in sidewall shapes over respective one side surfaces of multi-layer films comprised of the selection gate electrodes 6a and 6b and the cap insulating films 19. By charge accumulation insulating films 17 (ONO films) in each of which a lower-layer insulating film 17a (insulating film in a layer under a charge accumulation film), a charge accumulation layer 17b (charge accumulation film), and an upper-layer insulating film 17c (insulating film in a layer over a charge accumulation film) are stacked, insulation is provided between the selection gate electrodes 6a and 6b and the memory gate electrodes 7a and 7b.

The charge accumulation layer 17b is provided in a state vertically interposed between the insulating films 17a and 17b, comprised of, e.g., a silicon nitride film, and having a thickness of, e.g., about 5 to 20 nm. A silicon nitride film is an insulating film having a discrete trap level therein, and having the function of accumulating charges at the trap level. In the present embodiment, as an insulating film having a trap level, a silicon nitride film 9b is formed, but the insulating film having the trap level is not limited to a silicon nitride film. For example, a high-dielectric-constant film having a dielectric constant higher than that of a silicon nitride film, such as an aluminum oxide (alumina) film, a hafnium oxide film, or a tantalum oxide film, may also be used. Otherwise, the insulating film having the trap level may also be formed from a silicon nanodot. Each of the insulating films 17a and 17c is comprised of, e.g., a silicon dioxide film or the like. The thickness of the lower-layer insulating film 17a is, e.g., about 1.5 to 6 nm, and the thickness of the upper-layer insulating film 17c is, e.g., about 1 to 8 nm. Each of the insulating films 17a and 17c can also be formed of a silicon dioxide film containing nitrogen.

Over the selection gate electrodes 6a and 6b and the memory gate electrodes 7a and 7b, an interlayer insulating film 21 (premetal insulating film) comprised of a silicon nitride film and a silicon dioxide film is formed. In the interlayer insulating film 21, a contact hole 10 reaching the drain region 9 is formed. To the drain region 9, a first-layer wiring 23 extending in a second direction (row direction) intersecting the memory gate electrodes 7a and 7b (or the selection gate electrodes 6a and 6b) extending in a first direction (column direction) is coupled via the plug 22 (tungsten plug) buried in the contact hole 10. The wiring 23 forms the bit line of each of the memory cells.

Due to a plan configuration as shown in FIG. 1, there is a concern that, in the patterning of the STI regions 5, 5b, 5d, and the like, the horizontally elongated rectangular shapes thereof may be distorted at the end portions 24a and 24b thereof due to a proximity effect or the like to vary the gate widths of MISFETs (QS and QM) provided in proximity thereto or vary the widths of the source regions 8 between the end portions 24a and 24b. Therefore, in Sections 3 and 5, the problem is overcome through a process improvement.

Next, using FIG. 4, an example of an array structure of split-gate MONOS memory cells will be described. Note that, in FIG. 4, only 2 by 4 memory cells are shown for simpler illustration.

Selection gate lines (word lines) CGL0 to CGL3 coupling the selection gate electrodes 6 of the individual memory cells, memory gate lines MGL0 to MGL3 coupling the memory gate electrodes 7, and source lines SL0 and SL1 coupling the source regions 8 each shared by the adjacent two memory cells extend in parallel in the first direction (column direction). On the other hand, bit lines BL0 and BL1 coupling the drain regions 9 of the memory cells extend in the second direction (row direction), i.e., the direction orthogonal to the selection gate line CGL0 or the like. Note that, in principle, these lines extend in the directions mentioned above not only in a circuit diagram, but also in a layout of the individual memory cells or the lines. The selection gate line CGL0 or the like may also be formed of the selection gate electrode 6 or a line coupled to the selection gate electrode 6.

To each of the source lines SL0 and SL1 and the memory gate lines MGL0 to MGL3, a high voltage is applied during writing or erasing so that a voltage boosting driver comprised of a high-breakdown-voltage MISFET is coupled thereto. On the other hand, to each of the selection gate lines CLG0 to CGL3, only a low voltage of about 1.5 V is applied so that a low-breakdown-voltage and high-speed voltage boosting driver is coupled thereto. To each local bit line, sixteen, thirty-two, or sixty-four memory cells are coupled. The local bit line is coupled to a global bit line via a MISFET for selecting the local bit line. The global bit line is coupled to a sense amplifier.

In the array structure shown in FIG. 4, each of the source lines SL0 and SL1 is independently routed, while a plurality of the memory gate lines MGL0 to MGL3 are coupled to each other to provide a common memory gate line MGL. However, it is also possible that a plurality of the source lines SL0 and SL1 may be coupled to each other to provide a common source line, and a plurality of the memory gate lines MGL0 to MGL3 may be coupled to each other to provide a common memory gate line. By providing the common lines, the number of high-breakdown-voltage drivers for driving the individual lines is reduced to allow a reduction in chip area. Conversely, it is also possible that each of the source lines SL0 and SL1 and the memory gate lines MGL0 to MGL3 may be independently routed. In this case, the number of the high-breakdown-voltage drivers increases, but a time during which disturb is received during writing and erasing can be reduced.

Next, an example of a memory operation (writing, erasing, and reading) of a split-gate MONOS memory cell will be described using FIG. 5. Here, the injection of electrons into the charge accumulation layer 17b is defined as "writing", and the injection of holes into the charge accumulation layer 17b is defined as "erasing".

A description will be given of "writing".

Writing is performed by a so-called SSI method. As shown in FIG. 5, a voltage Vs applied to the source region 8 of a selected cell BIT1 is set to 5 V, a voltage Vmg applied to the memory gate electrode 7 is set to 10 V, and a voltage Vsg applied to the selection gate electrode 6 is set to 1 V. Then, a voltage Vd applied to the drain region 9 is controlled such that a channel current during writing has a given set value. The voltage Vd at this time is determined by the set value of the channel current and the threshold voltage of the selection MISFET (QS), and becomes about 0.4 V at a set current value of, e.g., 1 µA. A voltage Vwell applied to the p-well 11 is 0 V.

Next, the movement of charges when a write voltage is applied to the selected cell BIT1 will be described. By applying a voltage higher than that applied to the drain region 9 to the selection gate electrode 6 to bring the selection MISFET (QS) into an ON state, and applying a positive high voltage to the source region 8, electrons flow from the drain region 9 to the source region 8. The electrons flowing in a channel region are accelerated in the channel region (between the source region 8 and the drain region 9) under the vicinity of the boundary between the selection gate electrode 6 and the memory gate electrode 7 to become hot electrons. The hot electrons are attracted to the memory gate electrode 7 by the positive voltage applied to the memory gate electrode 7, and injected into the charge accumulation layer 17b under the memory gate electrode 7. The injected hot electrons are trapped by a trap level in the charge accumulation layer 17b, and consequently the electrons are accumulated in the charge accumulation layer 17b to raise the threshold voltage of the memory n-channel MISFET (QM). Next, a description will be given of "erasing".

As shown in the "Erasing" column of FIG. 5, erasing is performed by BTBT erasing in which holes are generated through a Band-to-Band Tunneling (BTBT) phenomenon, and accelerated with an electric field so that hot holes are injected into the charge accumulation layer 17b or by FN erasing in which holes are injected from the memory gate electrode 7 or the semiconductor substrate 1 into the charge accumulation layer by Fowler-Nordheim (FN) tunneling.

In the case where the BTBT erasing is performed, the voltage Vmg applied to the memory gate electrode 7 is set to −6 V, the voltage Vs applied to the source region 8 is set to 6 V, and the voltage Vsg applied to the selection gate electrode 6 is set to 0 V, while the drain region 9s is brought into a floating state. To the p-well 11, 0 V (Vwell) is applied. When the voltages shown above are applied, holes generated at the end portion of the source region 8 by the voltage applied between the source region 8 and the memory gate electrode 7 through the BTBT phenomenon are accelerated by the high voltage applied to the source region 8 to become hot holes, and the hot holes are attracted in the direction of the memory gate electrode 7 by the high voltage applied to the memory gate electrode 7, and injected into the charge accumulation layer 17b. The injected hot holes are trapped by the trap level in the charge accumulation layer 17b so that the threshold voltage of the memory n-channel MISFET (QM) lowers.

In the case of performing the FN erasing in which holes are injected from the memory gate electrode 7, to increase the likeliness of FN tunneling injection of holes to occur, a structure is adopted in which the thickness of the upper-layer insulating film 17c is adjusted to be not more than 3 nm or the upper-layer insulating film 17c is not provided in FIG. 3. In the case of adopting the structure with the upper-layer insulating film 17c, to increase the likeliness of the holes to be injected, a configuration may be provided appropriately in which a silicon nitride film or an amorphous silicon film having a thickness of about 1 nm is inserted between the memory gate electrode 7 and the upper-layer insulating film 17c. On the other hand, in the case of adopting the structure without the upper-layer insulating film 17c, to increase the likeliness of the holes to be injected, the charge accumulation layer 17b may be provided appropriately with a configuration using a silicon oxynitride film or a configuration in which a silicon nitride film and a silicon oxynitride film are stacked in succession over the semiconductor substrate. As voltages applied for the FN erasing in which holes are injected from the memory gate electrode 7, the voltage Vmg applied to the memory gate electrode 7 is set to 15 V, and the other applied voltages, i.e., the voltage Vs applied to the source region 8, the voltage Vsg applied to the selection gate electrode 6, the voltage Vd applied to the drain region 9, and the voltage Vwell applied to the p-well 11 are each set to 0 V. When the voltages shown above are applied, holes are injected from the memory gate electrode 7 into the charge accumulation layer 17b by FN tunneling. In addition, electrons accumulated in the charge accumulation layer 17b during writing are extracted to the memory gate electrode 7.

In the case of performing the FN erasing in which holes are injected from the semiconductor substrate 1, to increase the likeliness of FN tunneling injection of holes to occur, a structure is adopted in which the thickness of the lower-layer insulating film 17a is adjusted to be not more than 3 nm in the memory cell shown in FIG. 3. Alternatively, to increase the likeliness of holes to be injected, a structure is adopted in which a silicon nitride film or an amorphous silicon film having a thickness of about 1 nm is inserted between the semiconductor substrate 1 and the lower-layer insulating film 17a. As voltages applied for the FN erasing in which holes are injected from the semiconductor substrate 1, the voltage Vmg applied to the memory gate electrode 7 is set to −15 V, and the other applied voltages, i.e., the voltage Vs applied to the source region 8, the voltage Vsg applied to the selection gate electrode 6, the voltage Vd applied to the drain region 9, and the voltage Vwell applied to the p-well 11 are each set to 0 V. When the voltages shown above are applied, holes are injected from the semiconductor substrate 1 into the charge accumulation layer 17b by tunneling. In addition, electrons accumulated in the charge accumulation layer 17b during writing are extracted to the semiconductor substrate 1.

Next, a description will be given of "reading".

As shown in the "reading" column of FIG. 5, reading is performed by two types of methods in which reading is performed by allowing a current to flow in a direction reverse to that for writing and in which a current is allowed to flow in the same direction as that for writing. As shown in FIG. 5, in the case of allowing a current to flow in the direction reverse to that for writing to perform reading, the voltage Vd applied to the drain region 9 is set to 1.5 V, the voltage Vs applied to the source region 8 is set to 0 V, the voltage Vsg applied to the selection gate electrode 6 is set to 1.5 V, and the voltage Vmg applied to the memory gate electrode 7 is set to 1.5 V. In the case of allowing a current to flow in the same direction as that for writing to perform reading, the voltage Vd applied to the drain region 9 and the voltage Vs applied to the source region 8 are switched and respectively set to 0 V and 1.5 V.

The voltage Vmg applied to the memory gate electrode 7 during reading is set between the threshold voltage of the memory n-channel MISFET (QM) in a write state and the threshold voltage of the memory n-channel MISFET (QM) in an erase state. When the respective threshold voltages in the write state and the erase state are set to 4 V and −1 V, the foregoing voltage Vmg during reading has a middle value therebetween. By setting the voltage Vmg at the middle value, even if the threshold voltage in the write state lowers by 2 V or the threshold voltage in the erase state rises by 2 V during data retention, the write state or the erase state can be recognized so that the margin of a data retention property increases. If the threshold voltage of the memory cell in the erase state is set sufficiently low, it is also possible to set the voltage Vmg during reading to 0 V. By setting the voltage Vmg during reading to 0 V, it is possible to avoid read disturb, i.e., fluctuations in threshold voltage due to the application of a voltage to the memory gate electrode MG.

§2. Description of Outline of Wafer Process in Method of Manufacturing Semiconductor Integrated Circuit Device in Embodiment of Present Invention, Etc. (Mainly Using FIGS. 6 to 29)

Figure 6:
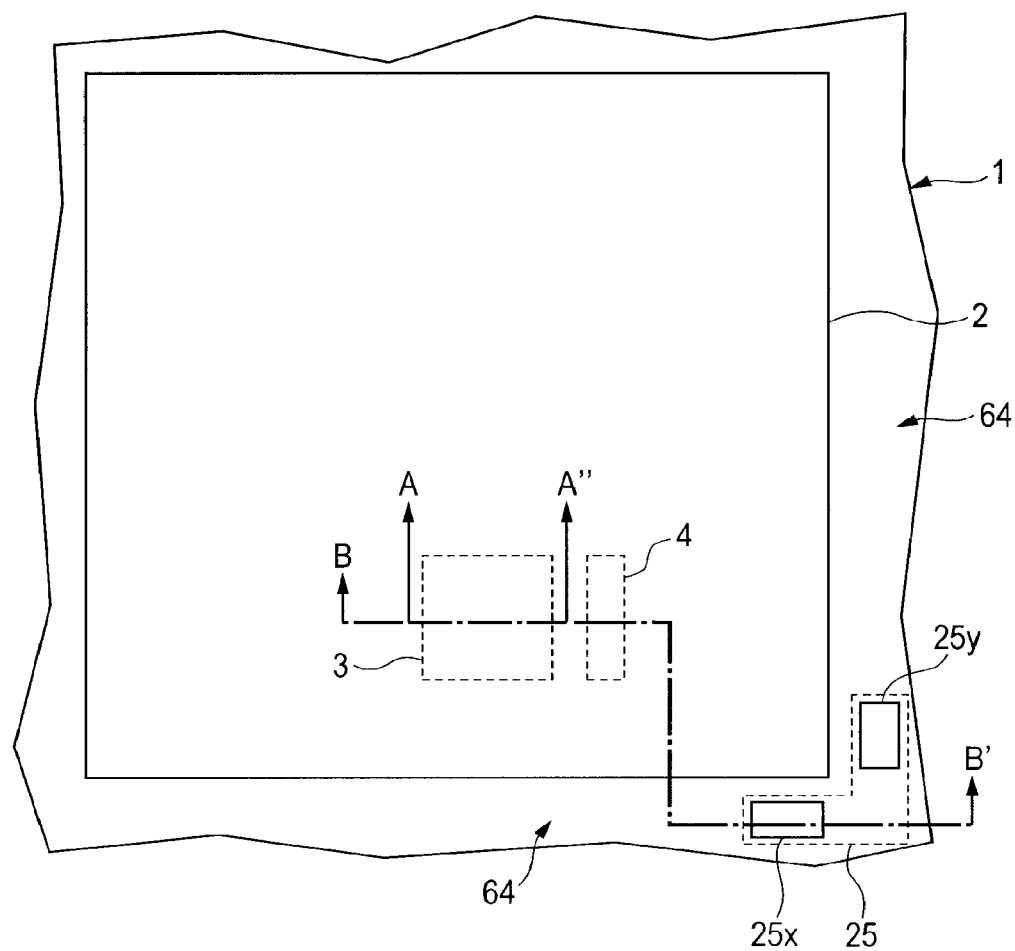
FIG. 6 is a partial top view of a wafer illustrating mutual positional relations among a memory cell portion, a peripheral circuit portion, an alignment target pattern, and a chip region in the split-gate flash memory shown in FIG. 1.
Figure 7:
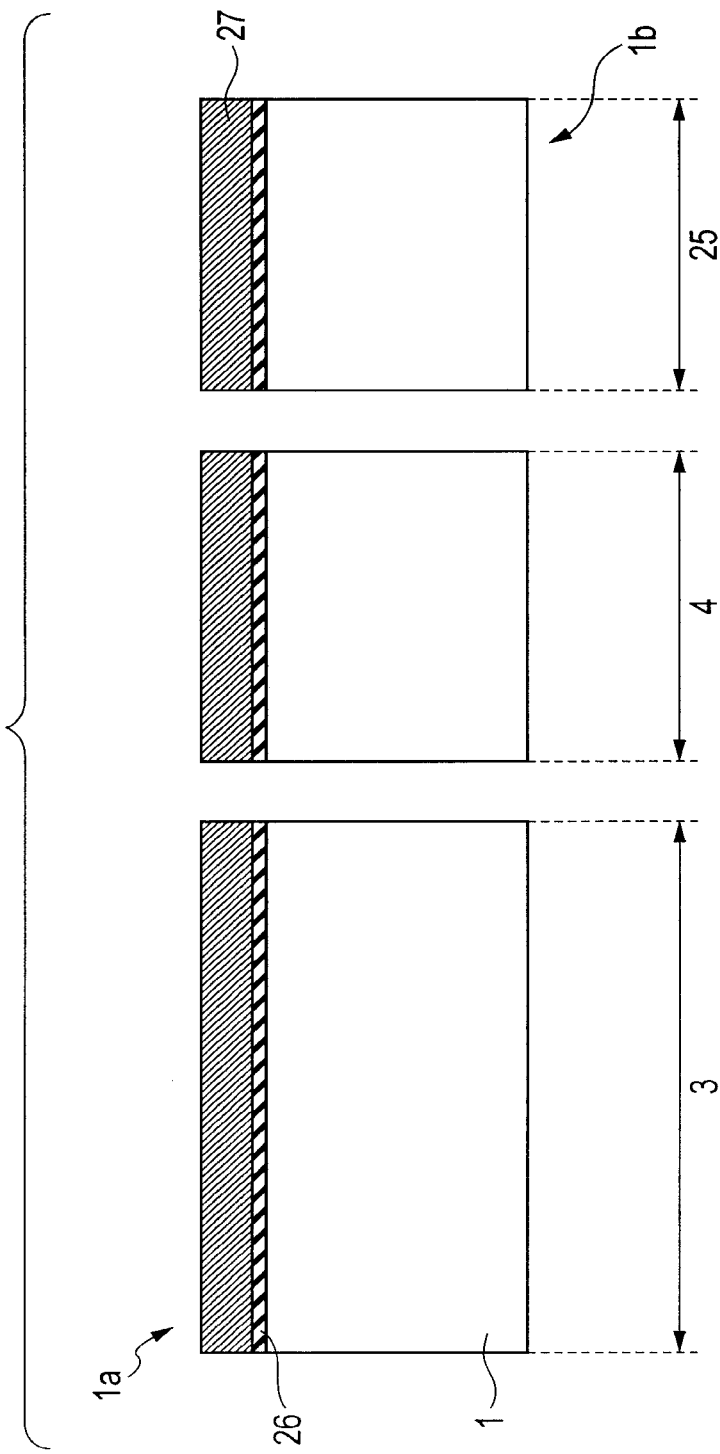
FIG. 7 is a device process flow cross-sectional view corresponding to a B-B' cross section of FIG. 6 (in which a memory cell array portion further corresponds to an A-A" cross section of FIG. 1, and the same applies to the subsequent drawings of FIGS. 8 to 29) (in the step of depositing a silicon nitride film for processing STI regions)
Figure 8:
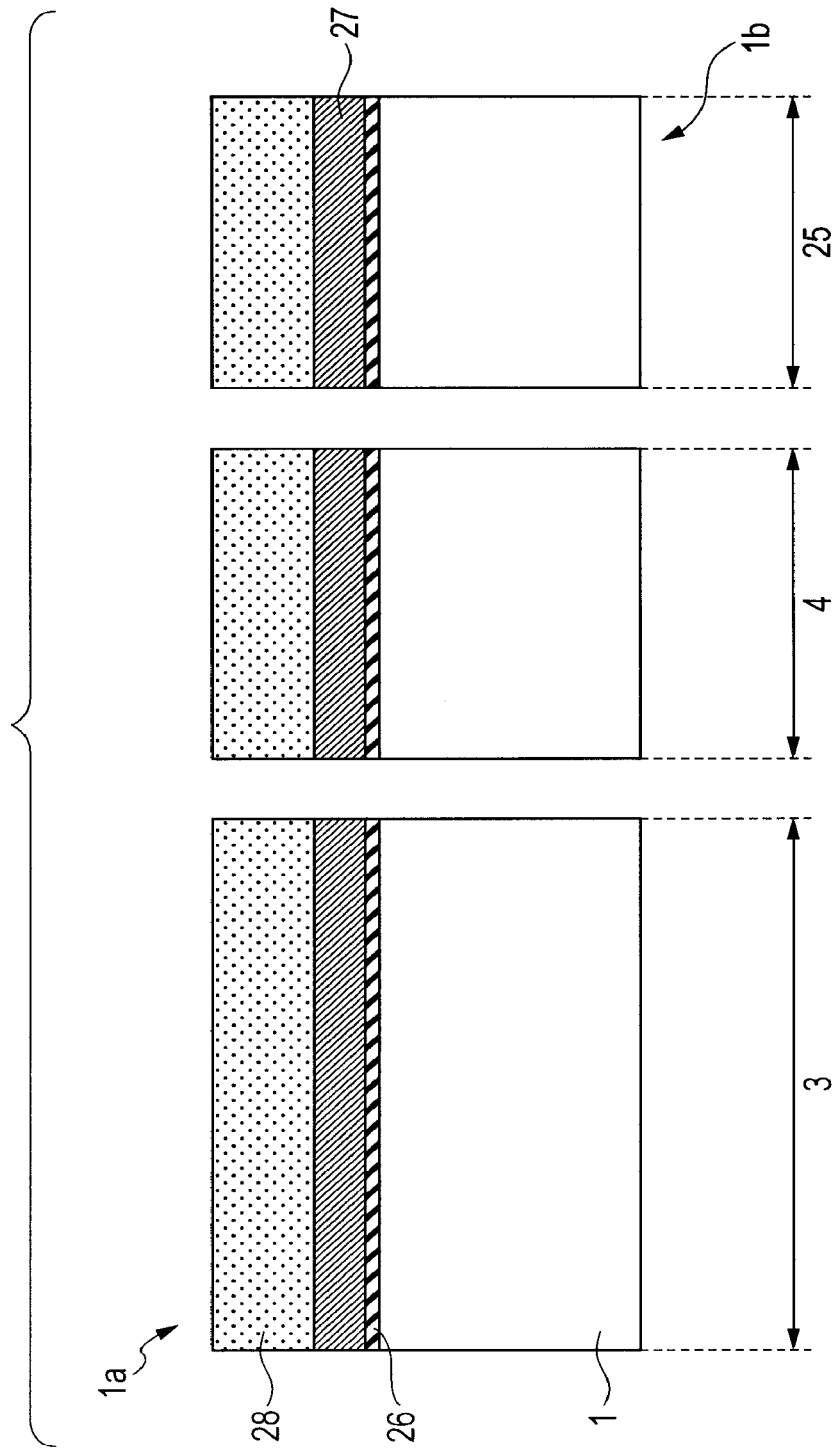
FIG. 8 is a device process flow cross-sectional view corresponding to the B-B' cross section of FIG. 6 (in the step of coating a resist film for processing the STI regions)
Figure 9:
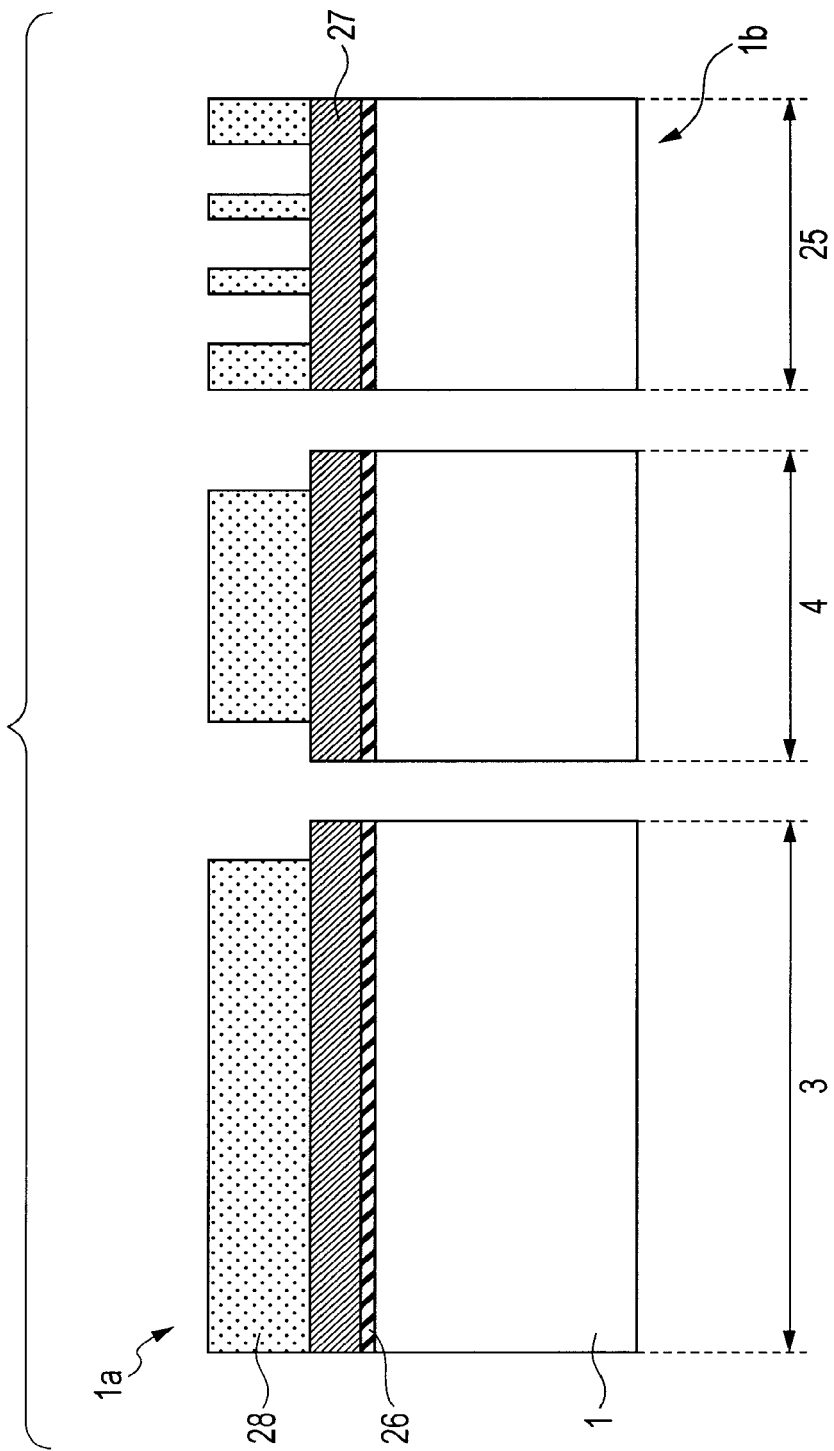
FIG. 9 is a device process flow cross-sectional view corresponding to the B-B' cross section of FIG. 6 (in the step of patterning the resist film for processing the STI regions)
Figure 10:
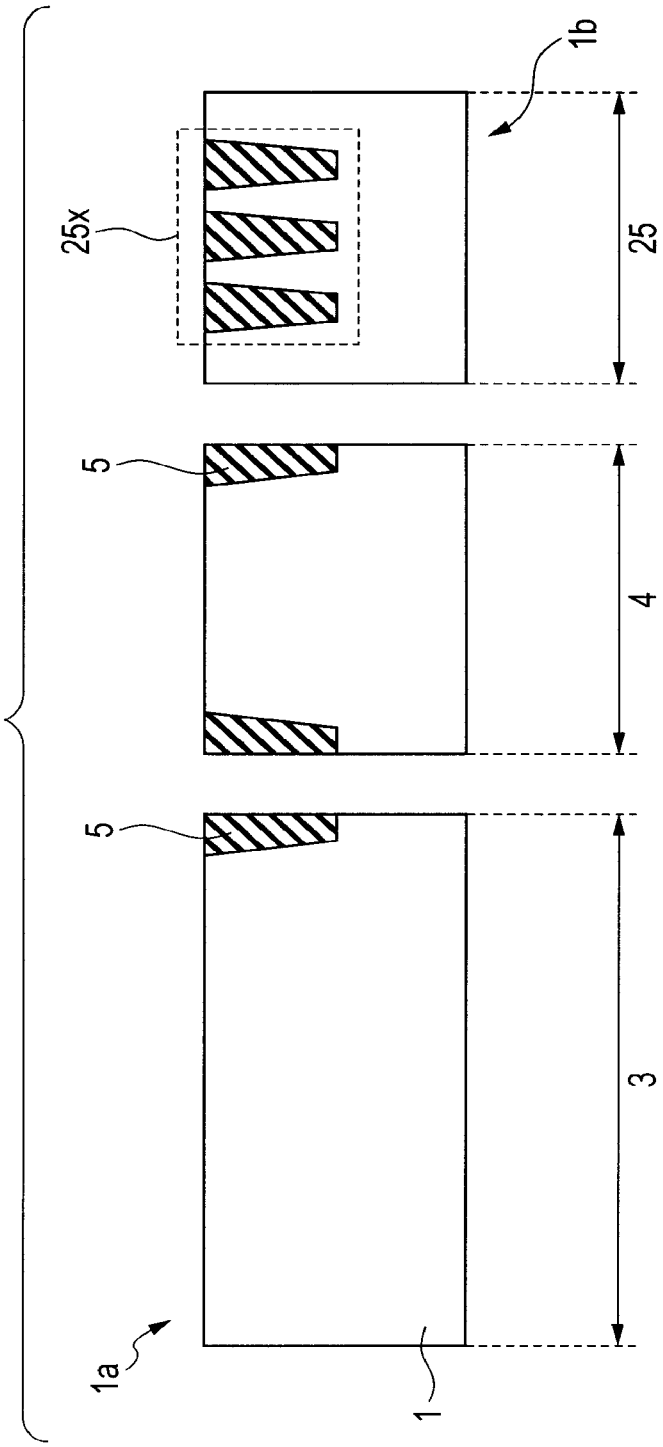
FIG. 10 is a device process flow cross-sectional view corresponding to the B-B' cross section of FIG. 6 (in the step of filling and planarizing the STI regions)
Figure 11:
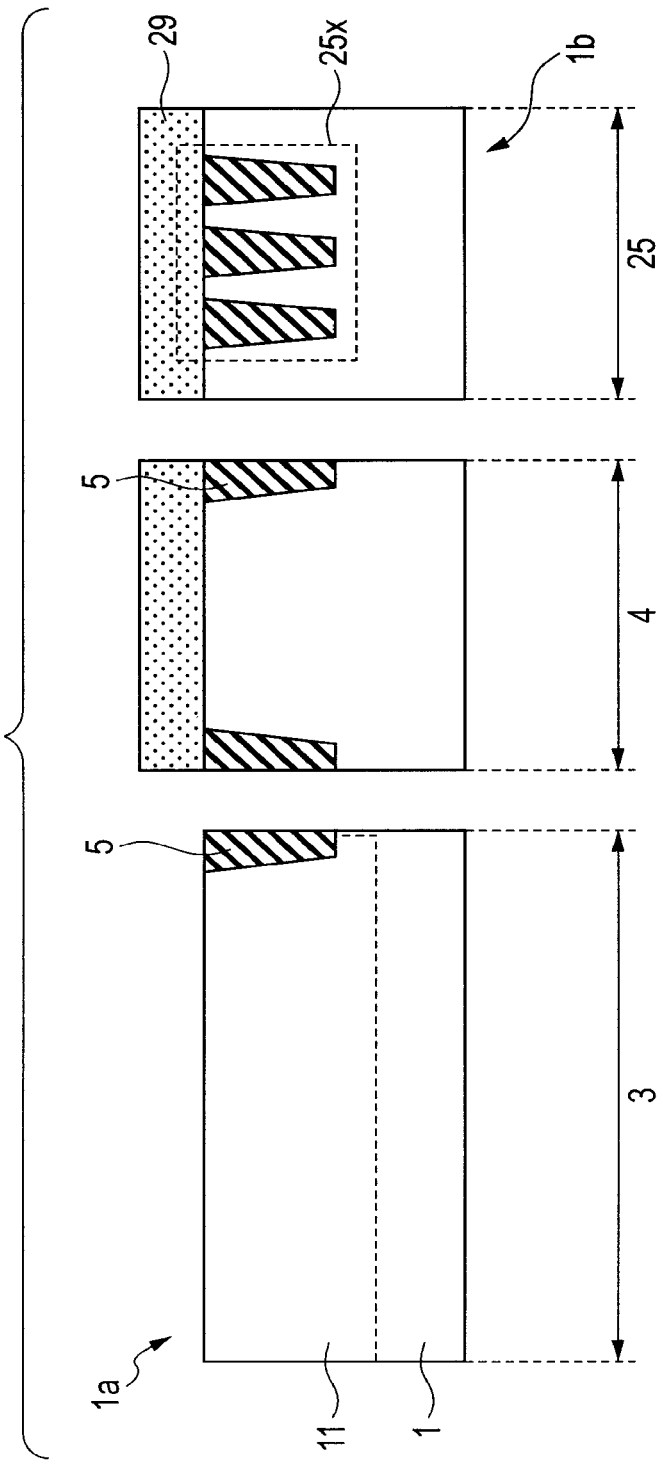
FIG. 11 is a device process flow cross-sectional view corresponding to the B-B' cross section of FIG. 6 (in the step of introducing a P-type well)
Figure 12:
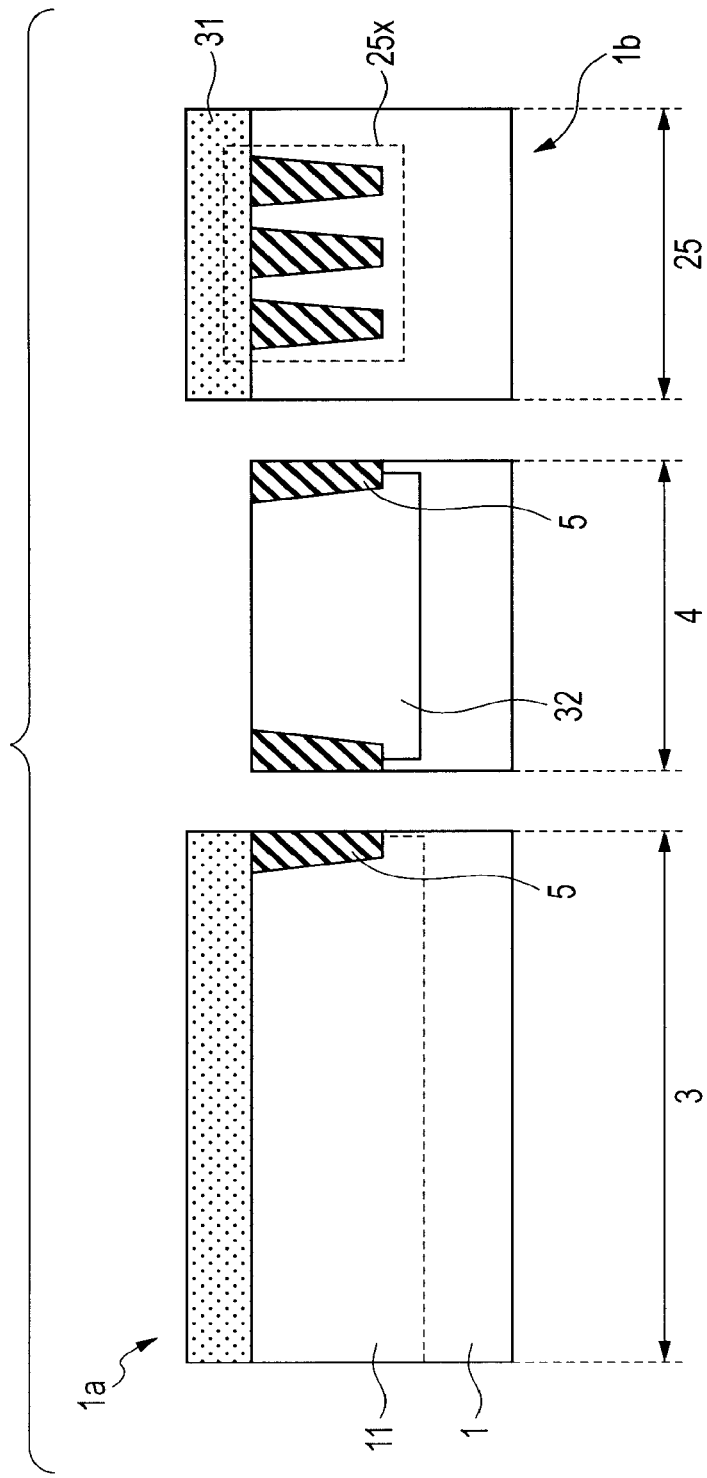
FIG. 12 is a device process flow cross-sectional view corresponding to the B-B' cross section of FIG. 6 (in the step of introducing an N-type well)
Figure 13:
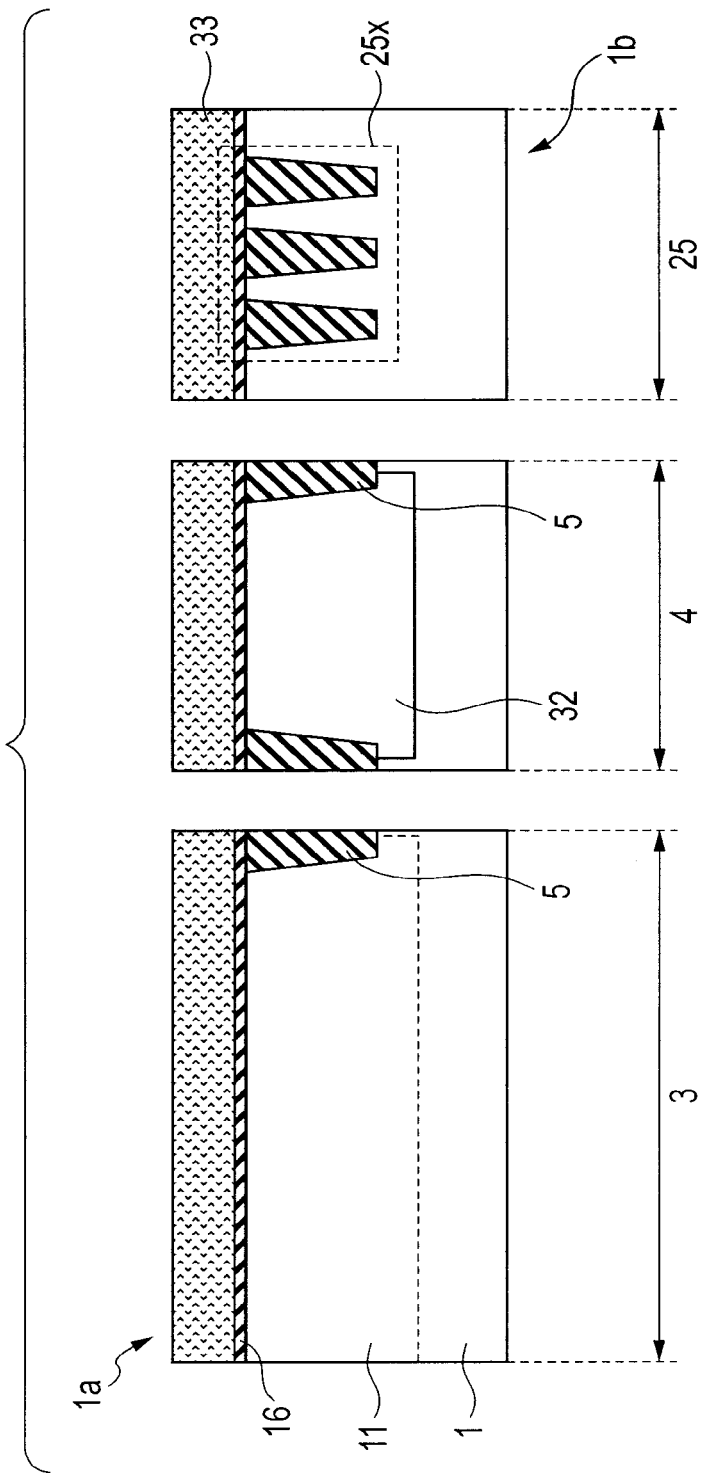
FIG. 13 is a device process flow cross-sectional view corresponding to the B-B' cross section of FIG. 6 (in the steps of gate oxidation, and depositing a first polysilicon layer)
Figure 14:
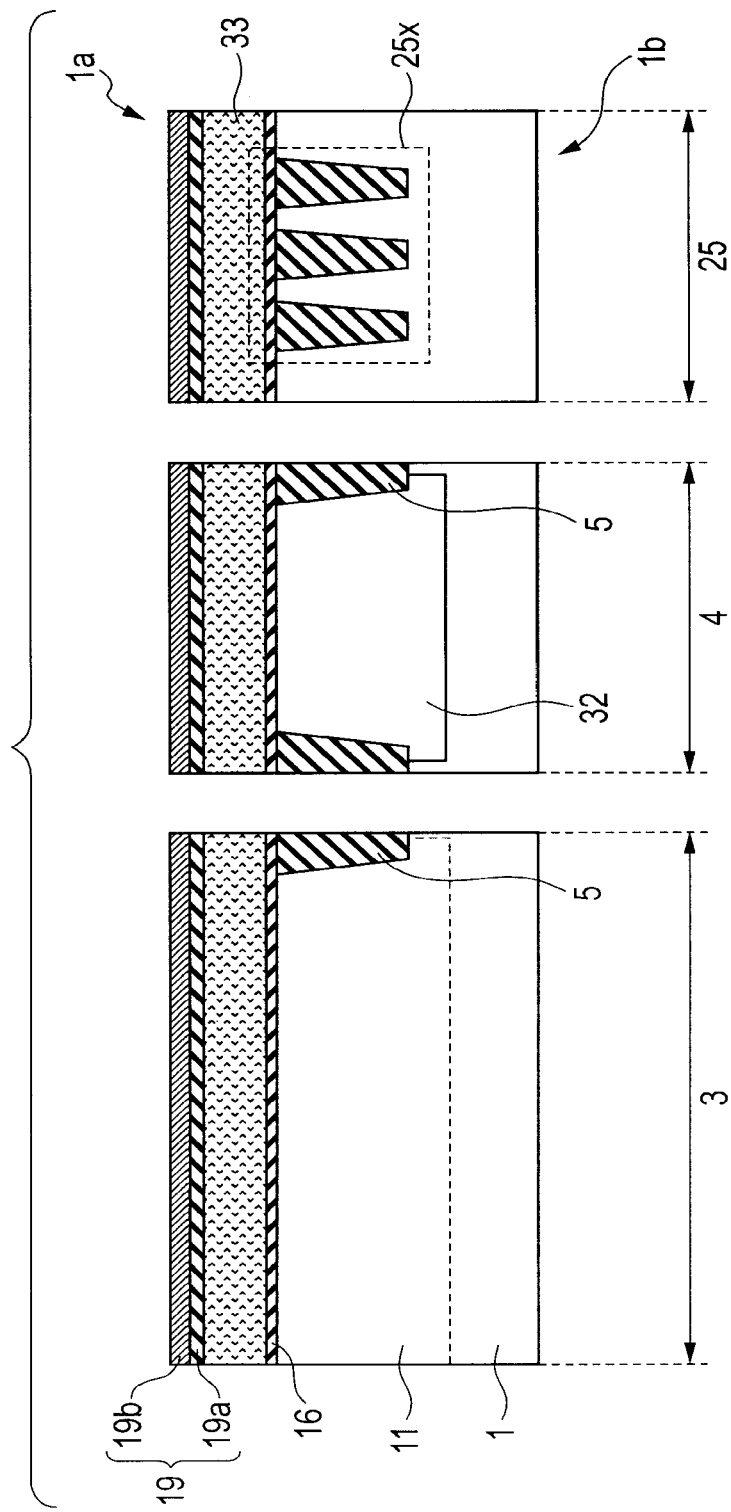
FIG. 14 is a device process flow cross-sectional view corresponding to the B-B' cross section of FIG. 6 (in the step of depositing a cap insulating film)
Figure 15:
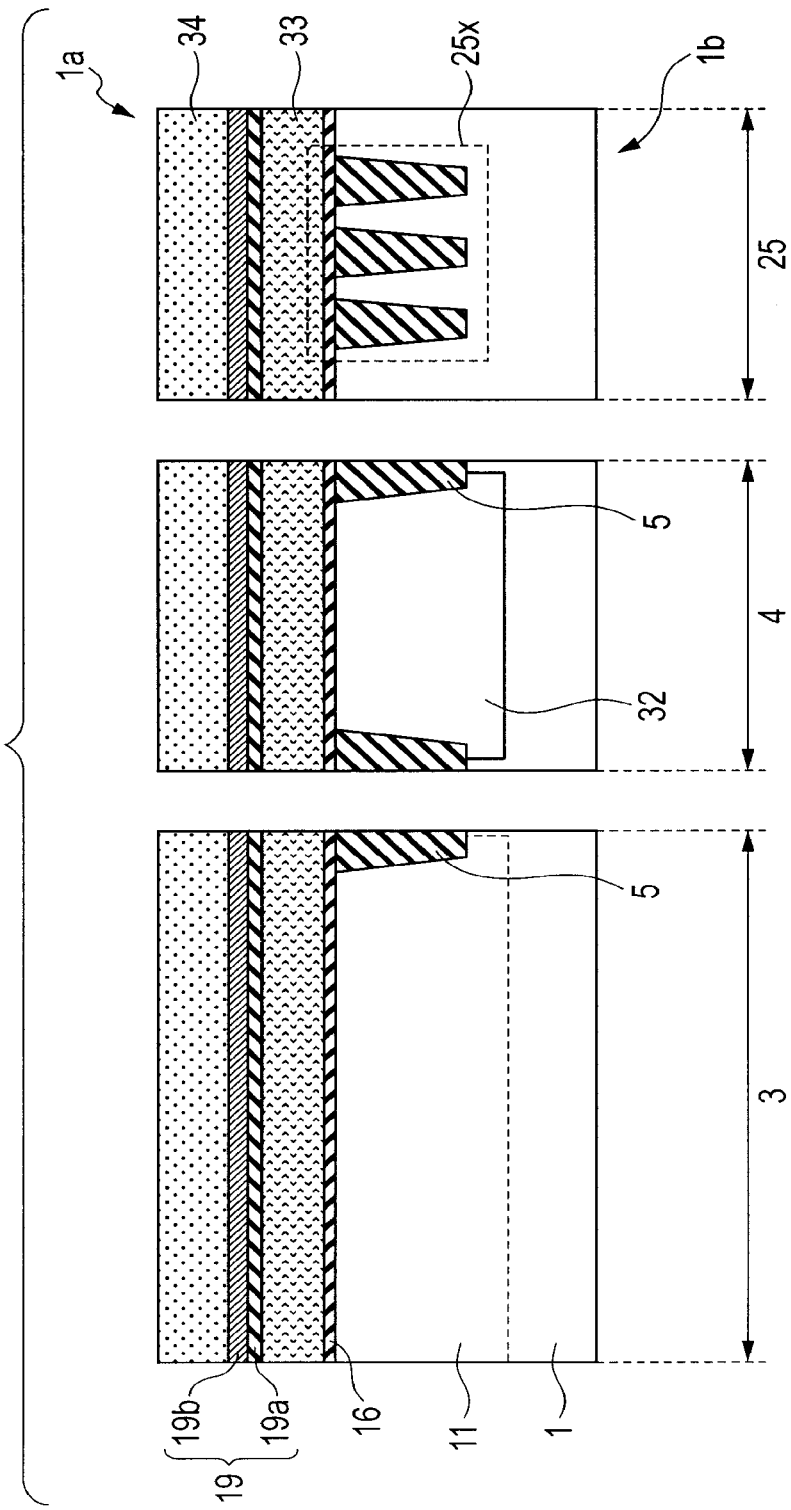
FIG. 15 is a device process flow cross-sectional view corresponding to the B-B' cross section of FIG. 6 (in the step of coating a resist for processing gate electrodes in the memory cell portion)
Figure 16:
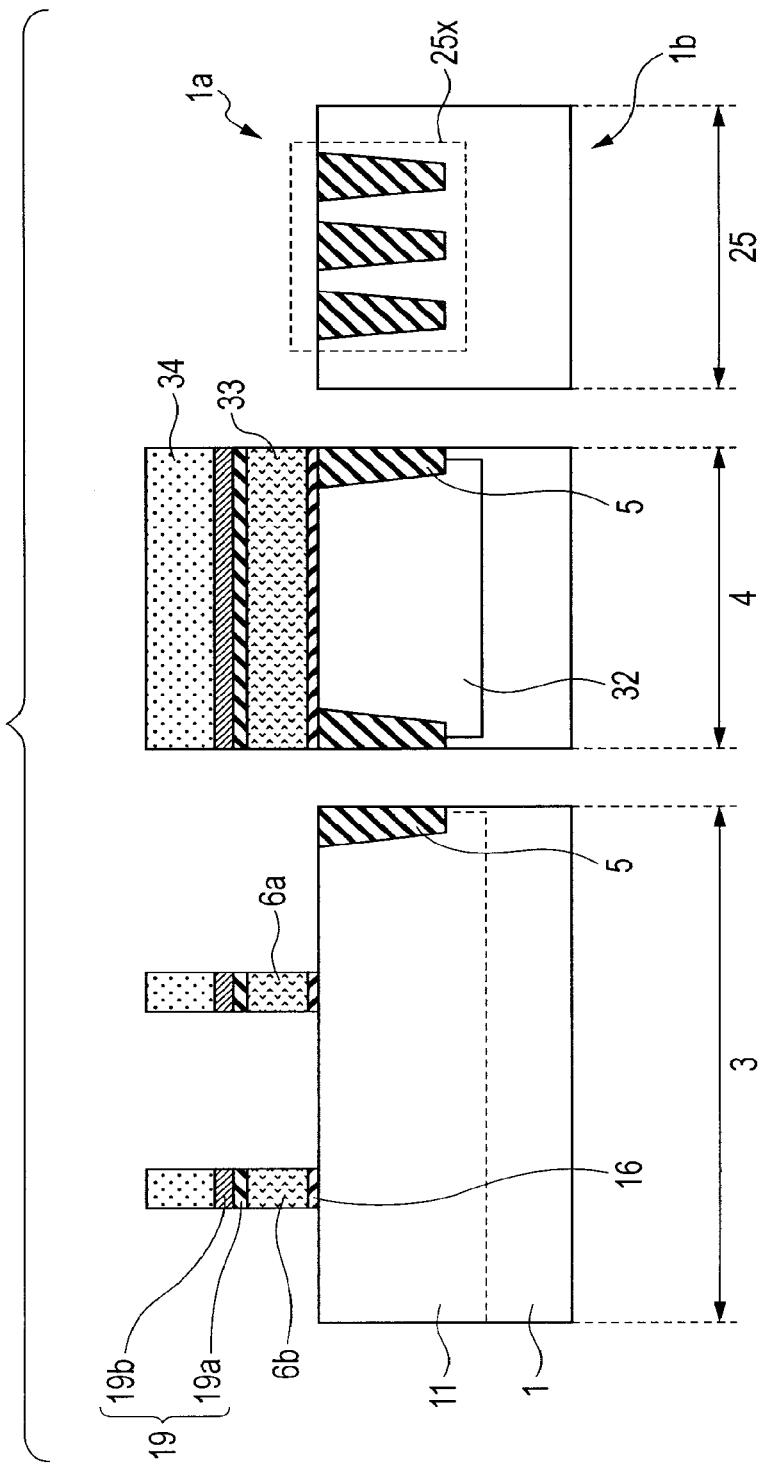
FIG. 16 is a device process flow cross-sectional view corresponding to the B-B' cross section of FIG. 6 (in the step of processing the gate electrodes in the memory cell portion)
Figure 17:
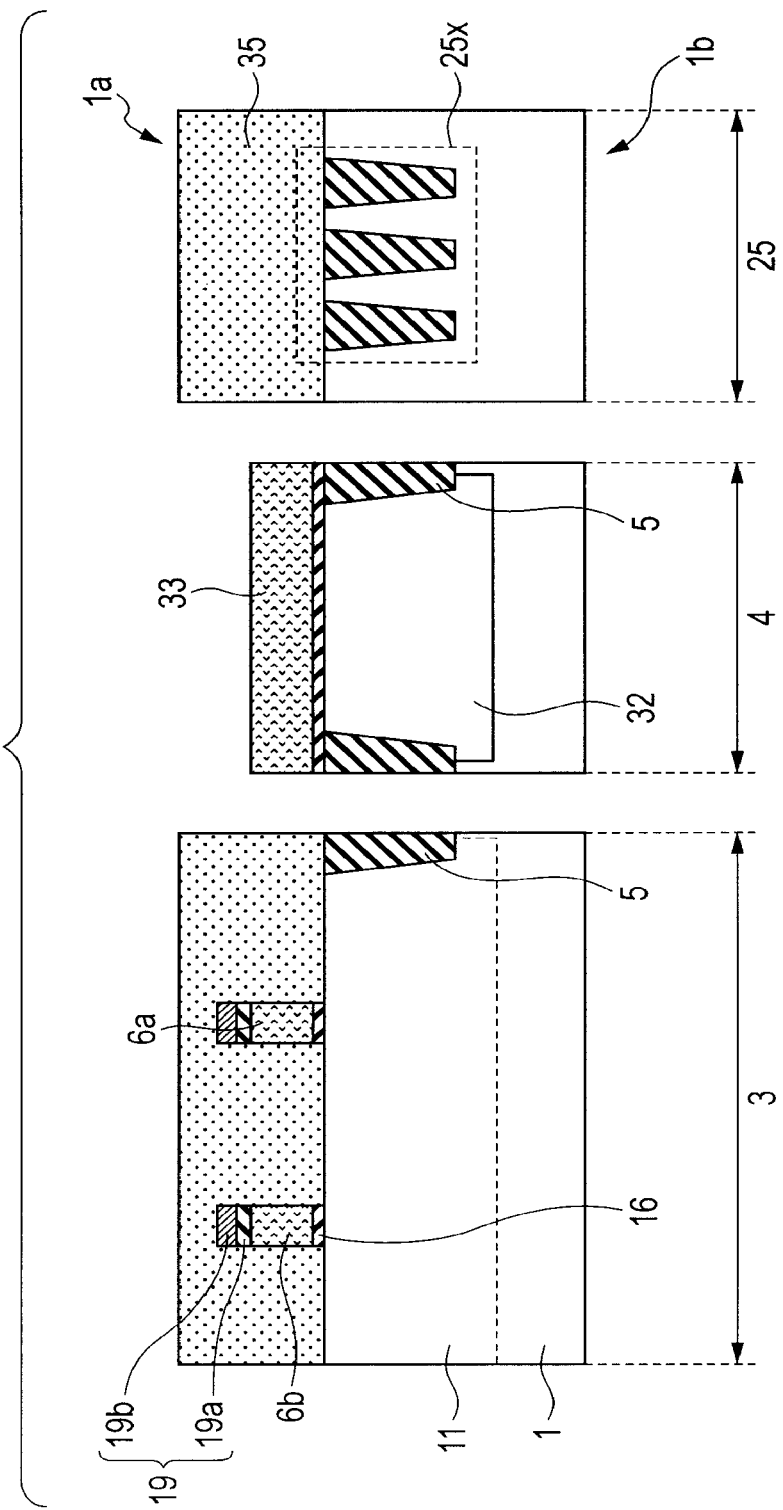
FIG. 17 is a device process flow cross-sectional view corresponding to the B-B' cross section of FIG. 6 (in the step of removing the cap insulating film in the peripheral circuit portion)
Figure 18:
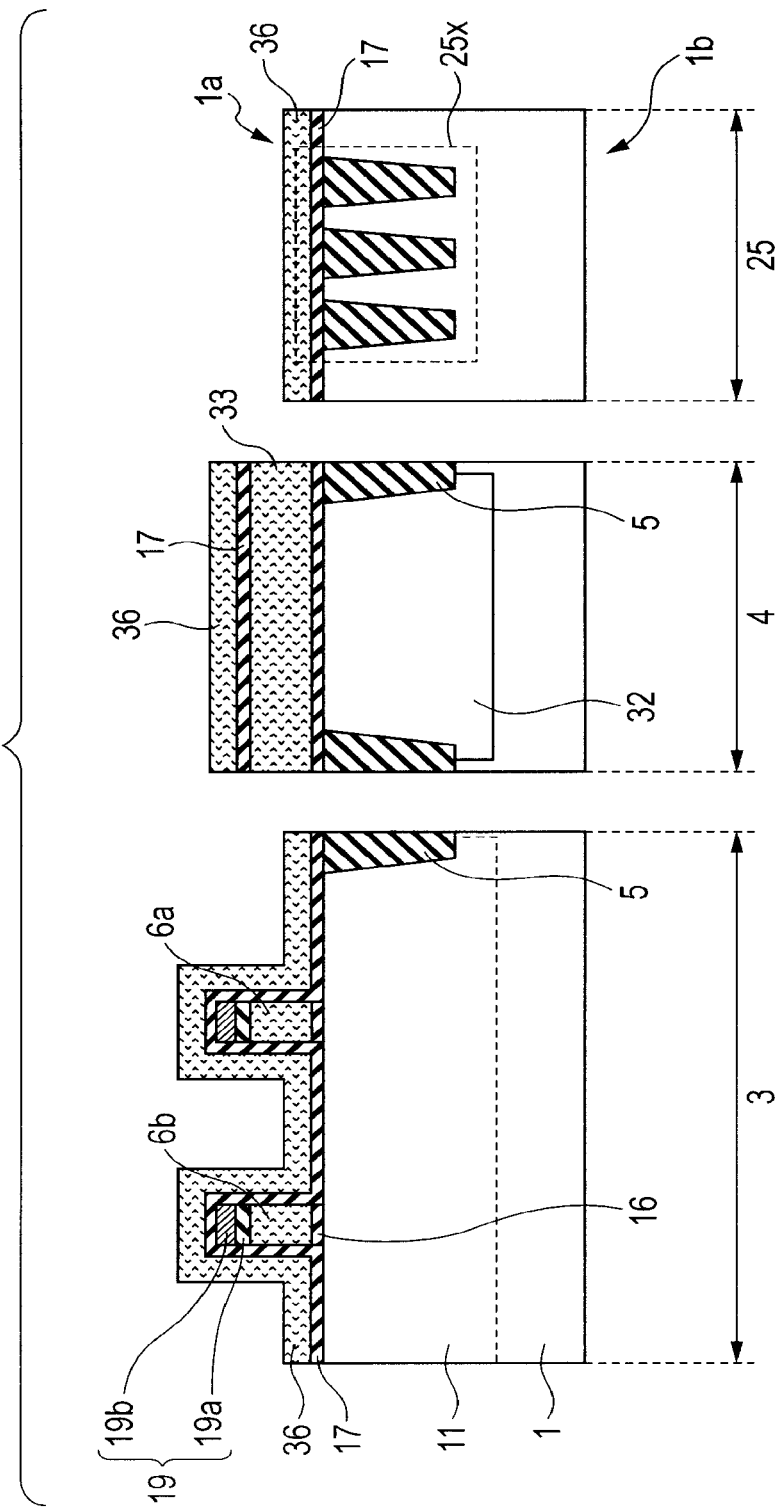
FIG. 18 is a device process flow cross-sectional view corresponding to the B-B' cross section of FIG. 6 (in the step of depositing the ONO film and a second polysilicon layer)
Figure 19:
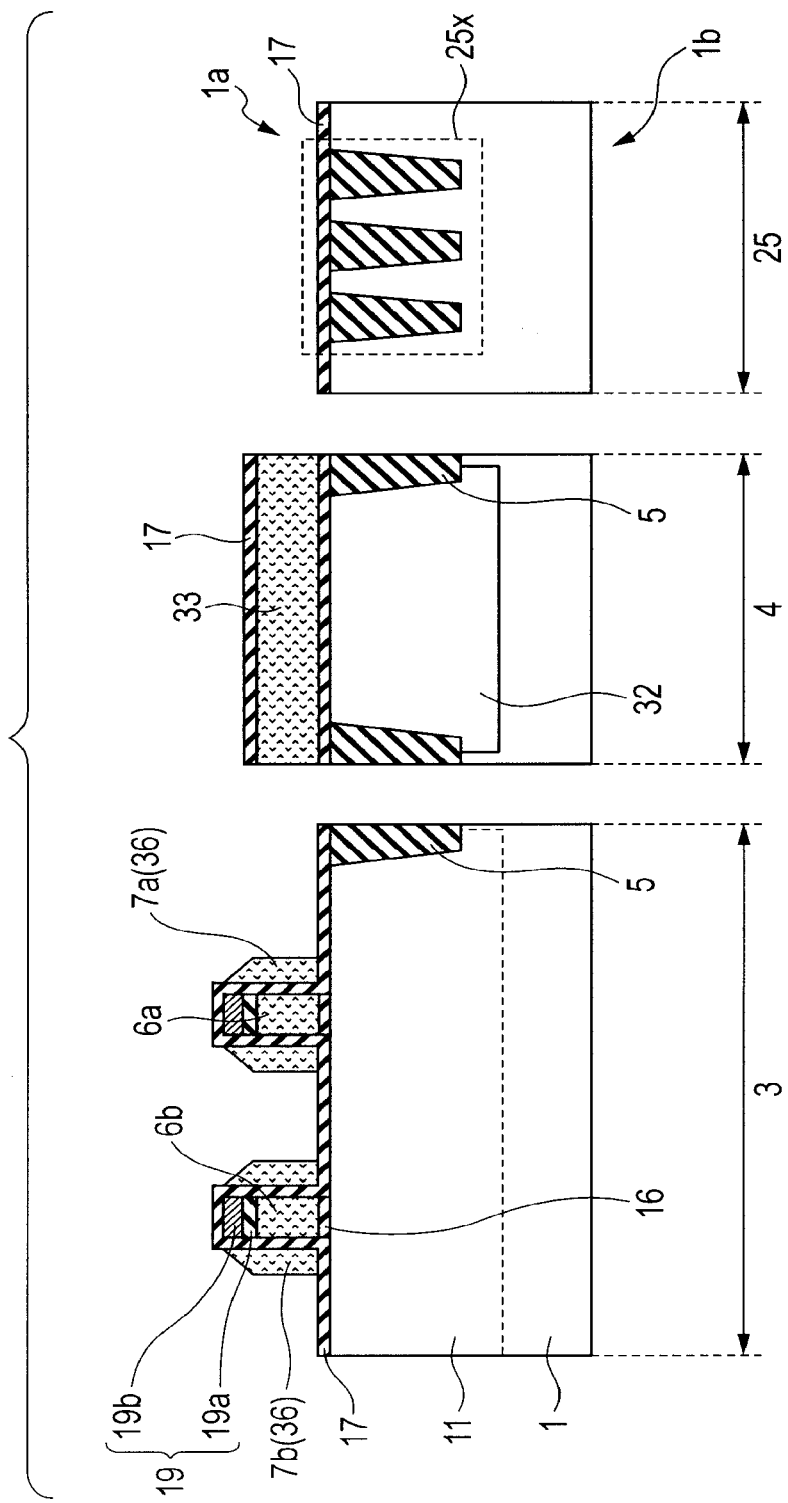
FIG. 19 is a device process flow cross-sectional view corresponding to the B-B' cross section of FIG. 6 (in the step of etching the second polysilicon layer by self-alignment)
Figure 20:
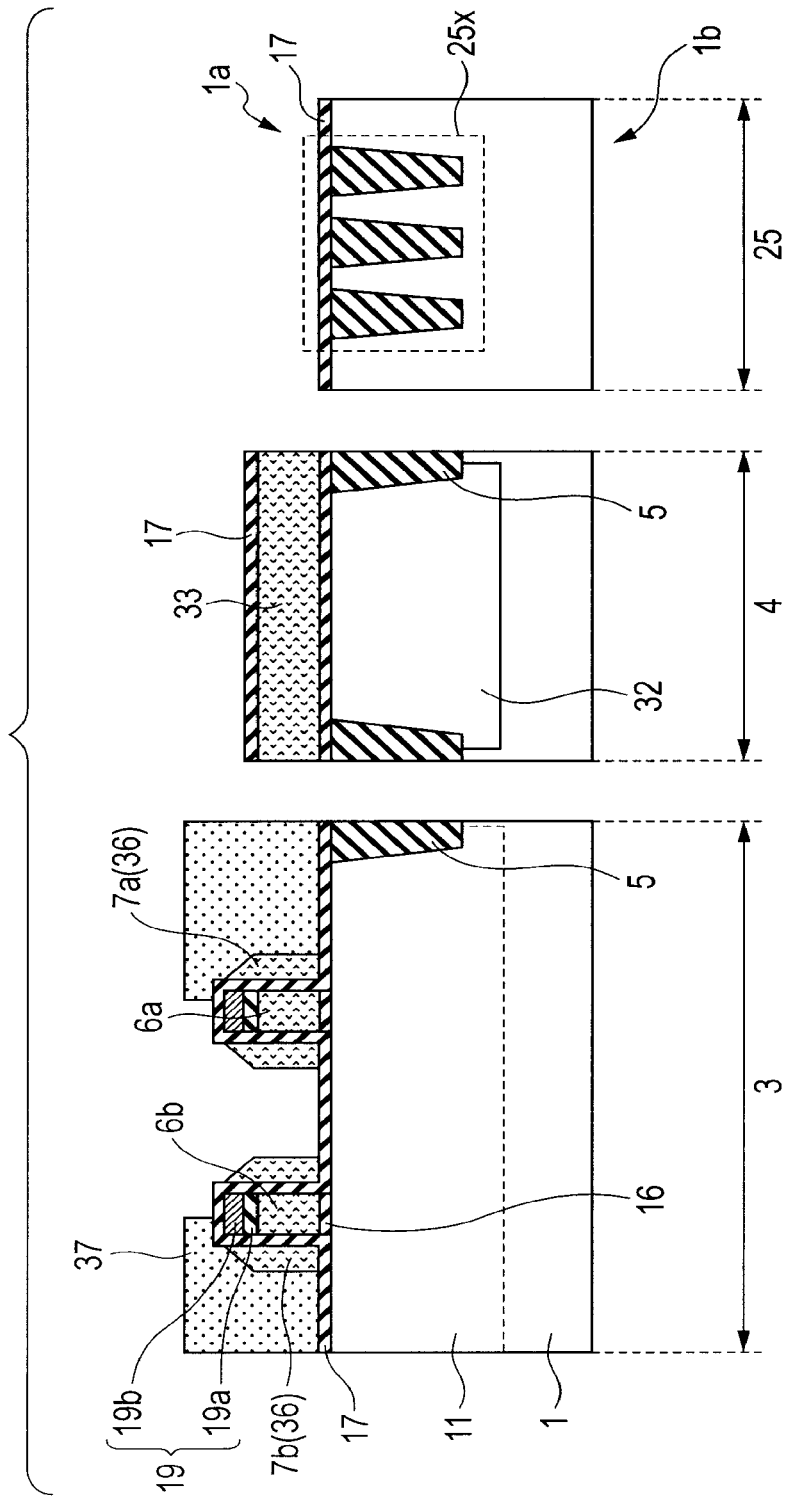
FIG. 20 is a device process flow cross-sectional view corresponding to the B-B' cross section of FIG. 6 (in the step of patterning a resist film for processing the ONO film and the inner gate electrodes)
Figure 21:
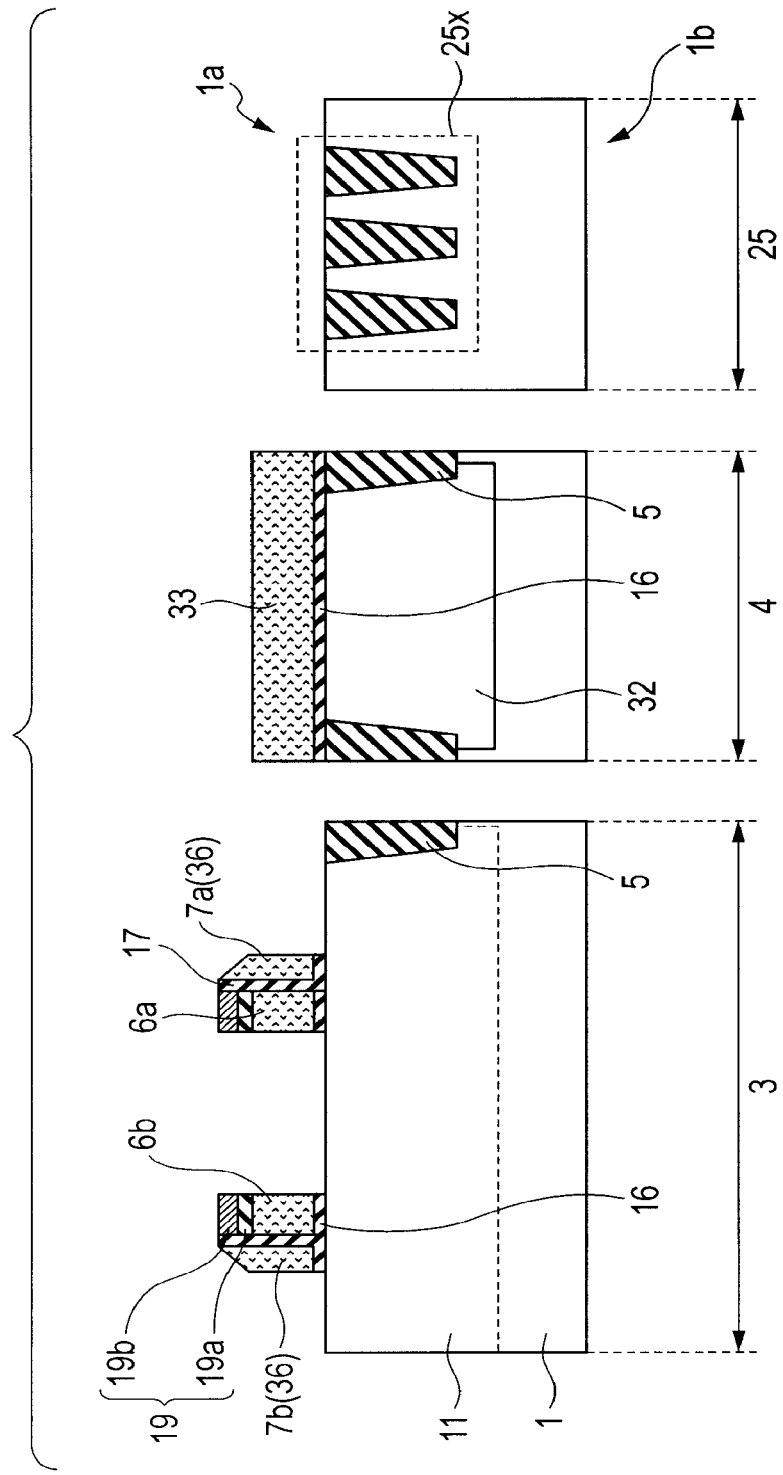
FIG. 21 is a device process flow cross-sectional view corresponding to the B-B' cross section of FIG. 6 (in the step of etching the ONO film and the inner gate electrodes)
Figure 22:
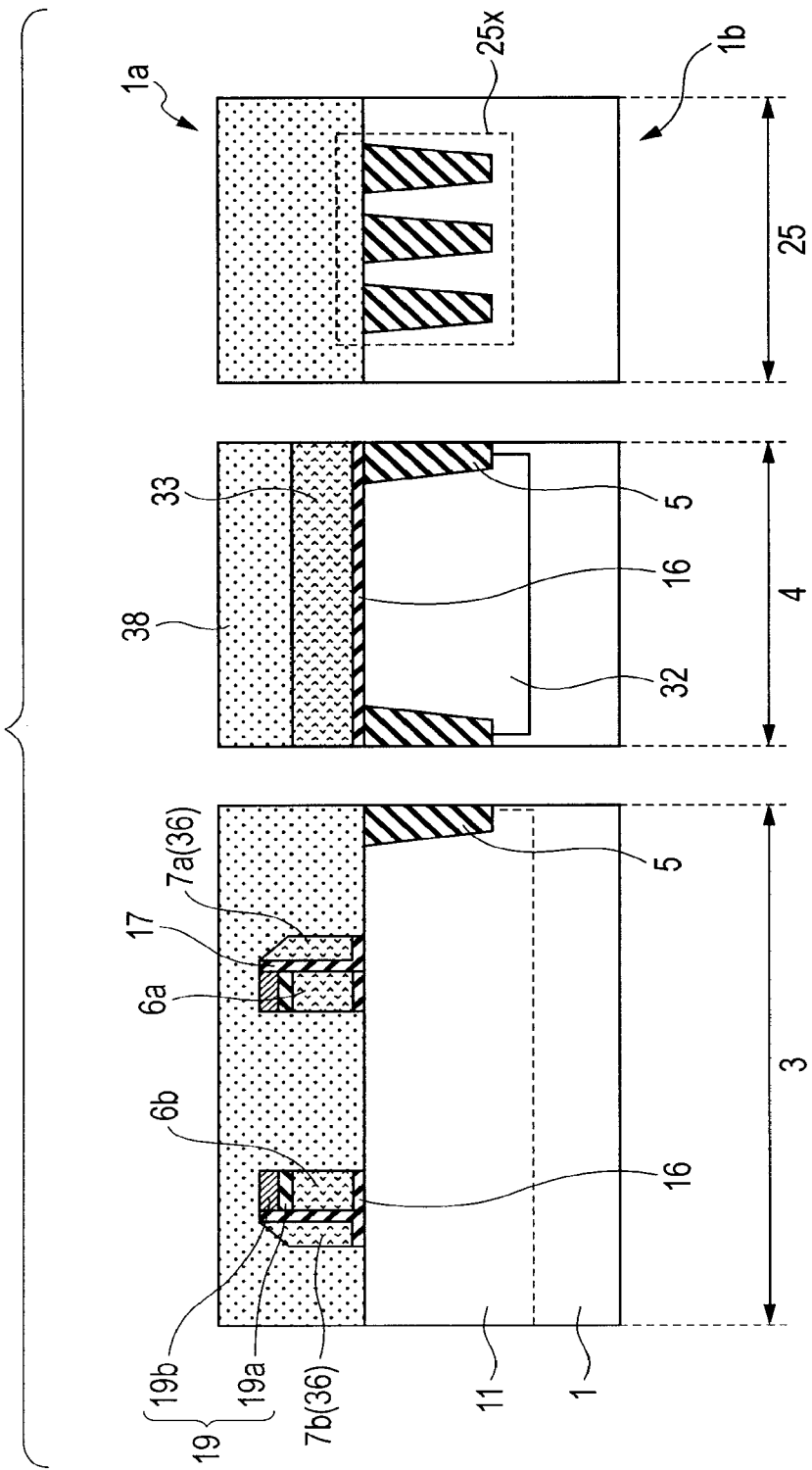
FIG. 22 is a device process flow cross-sectional view corresponding to the B-B' cross section of FIG. 6 (in the step of coating a resist film for processing a gate electrode in the peripheral circuit portion)
Figure 23:
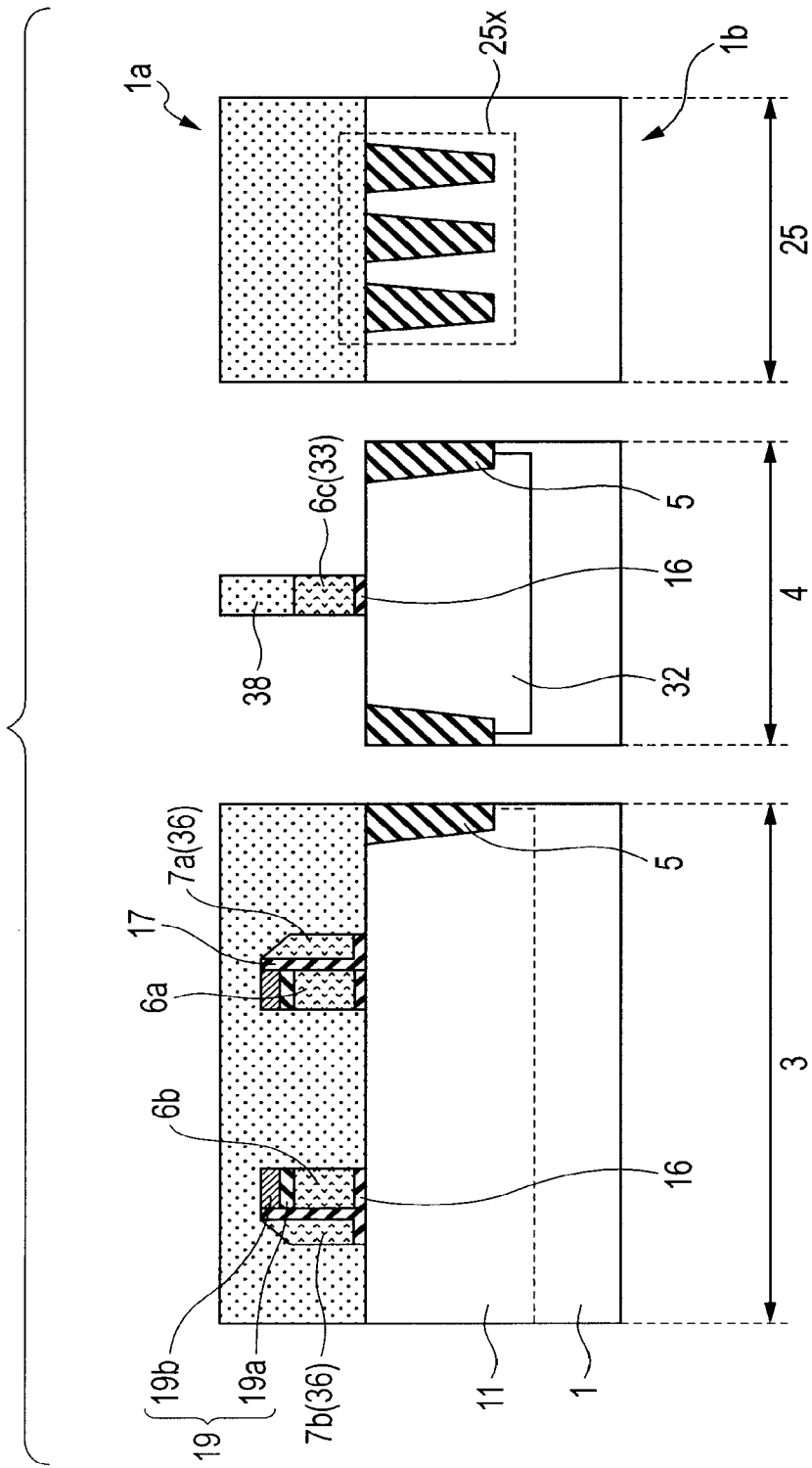
FIG. 23 is a device process flow cross-sectional view corresponding to the B-B' cross section of FIG. 6 (in the step of processing the gate electrode in the peripheral circuit portion)
Figure 24:
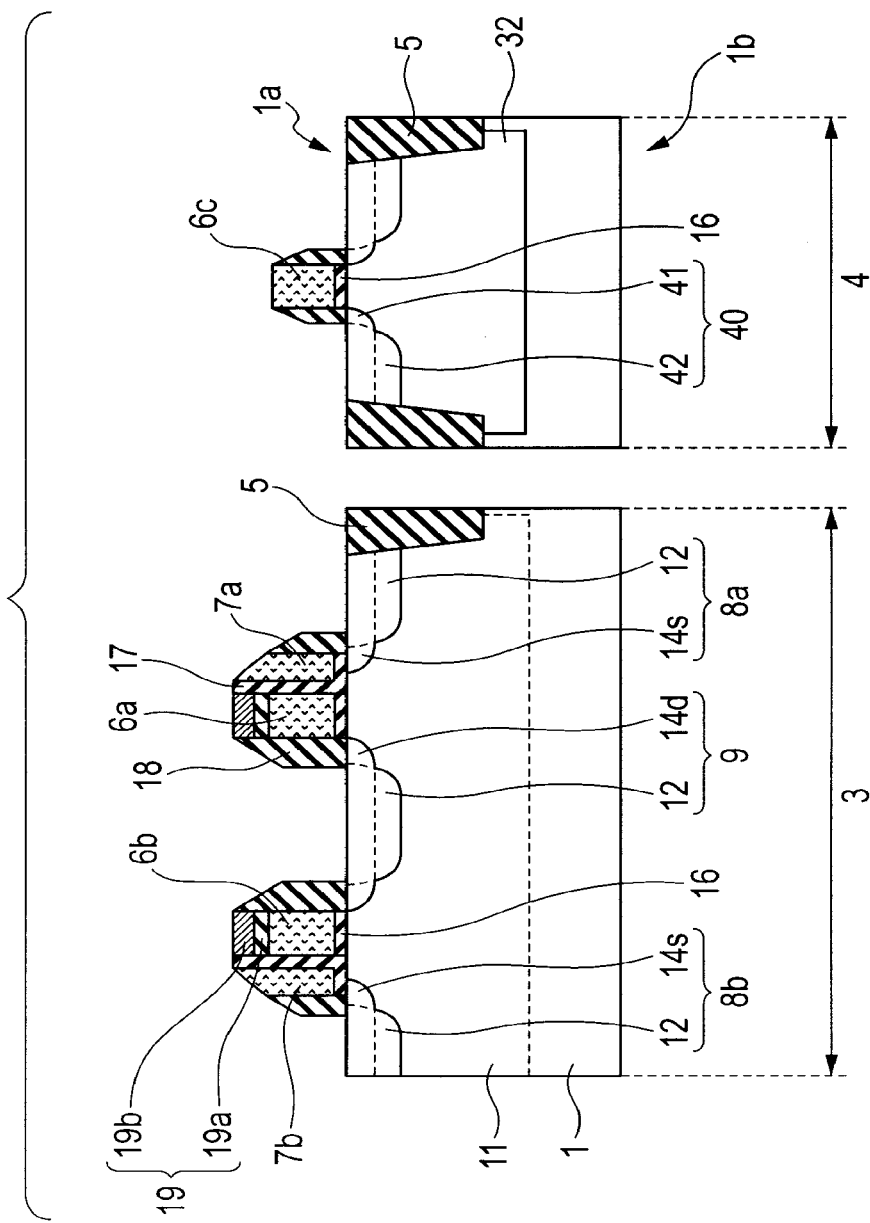
FIG. 24 is a device process flow cross-sectional view corresponding to the B-B' cross section of FIG. 6 (in the steps of forming sidewall spacers, and introducing source/drain regions)
Figure 25:
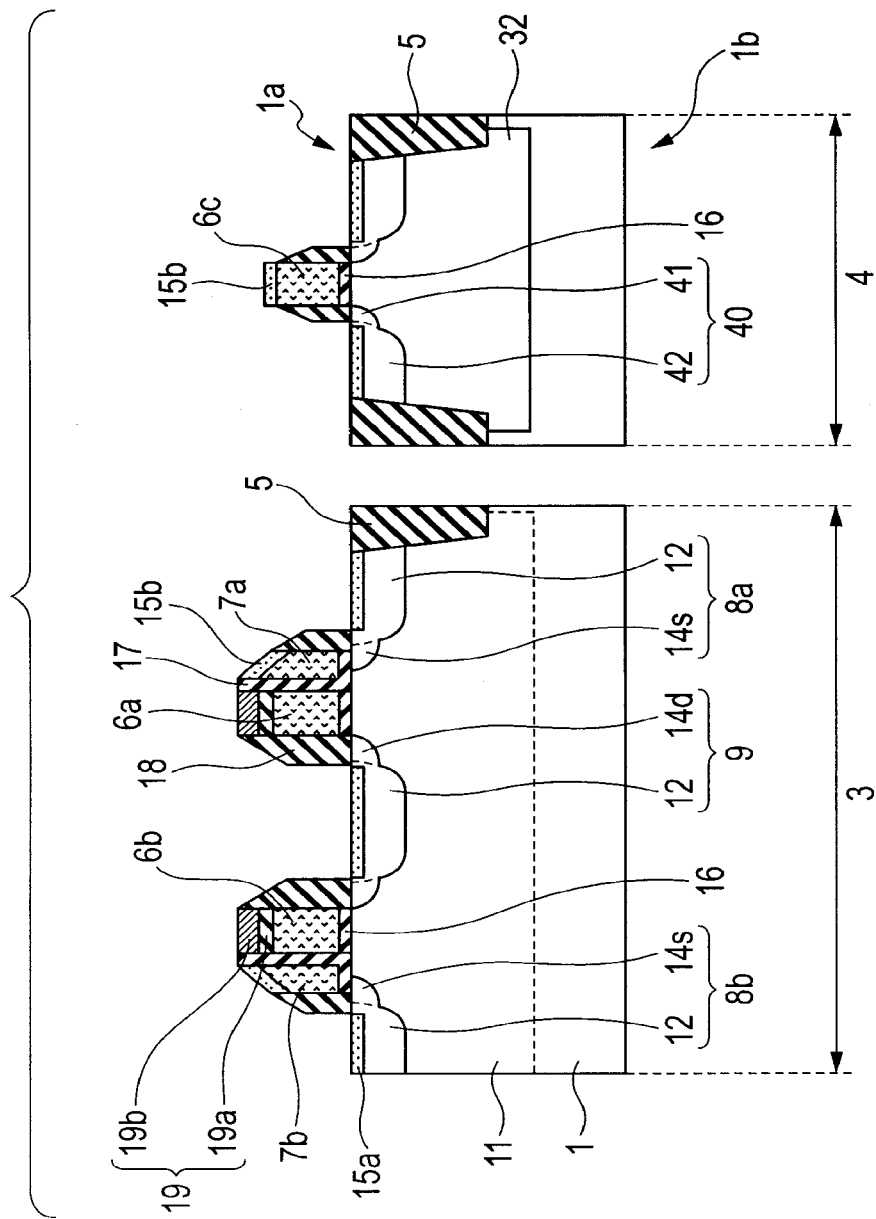
FIG. 25 is a device process flow cross-sectional view corresponding to the B-B' cross section of FIG. 6 (in the step of silicidation)
Figure 26:
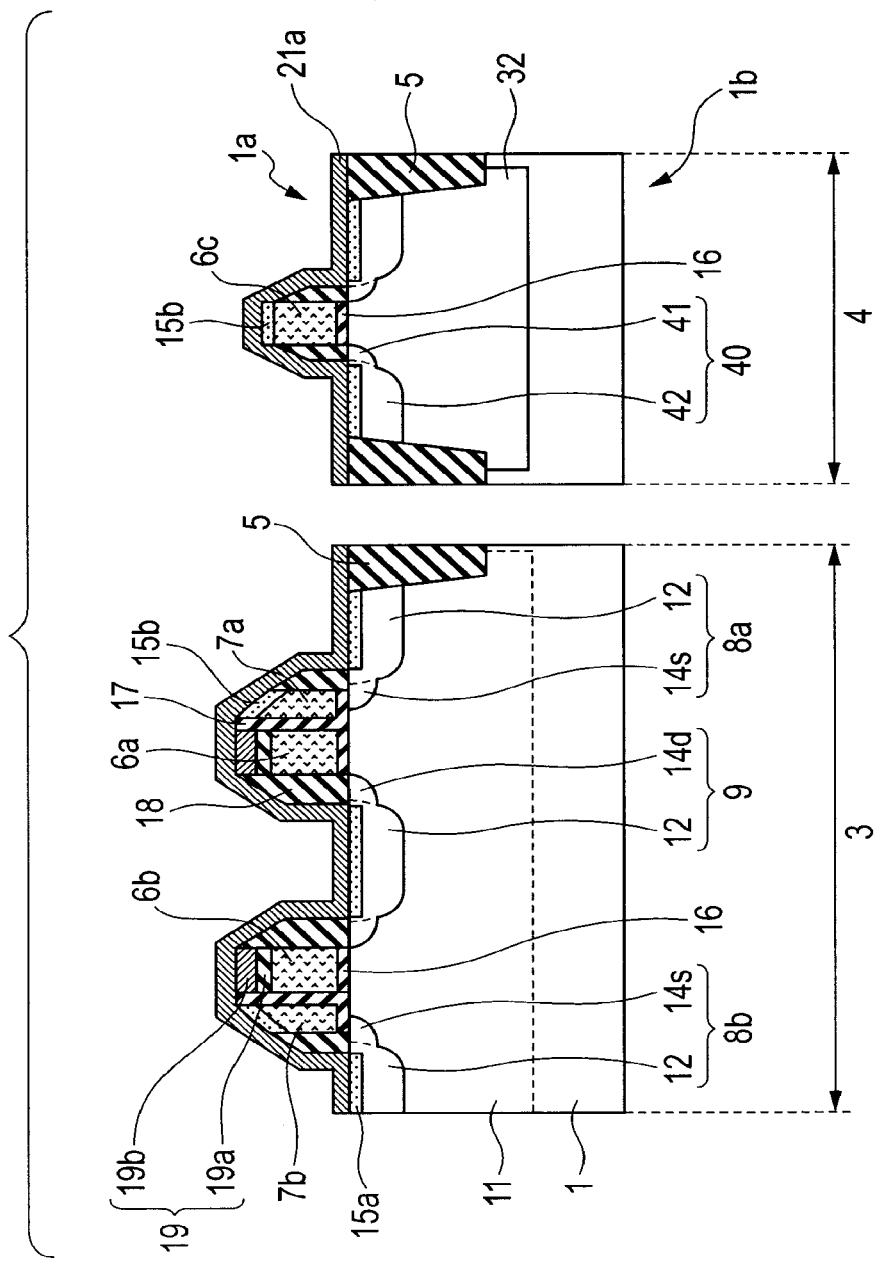
FIG. 26 is a device process flow cross-sectional view corresponding to the B-B' cross section of FIG. 6 (in the step of depositing a silicon nitride film over a contact)
Figure 27:
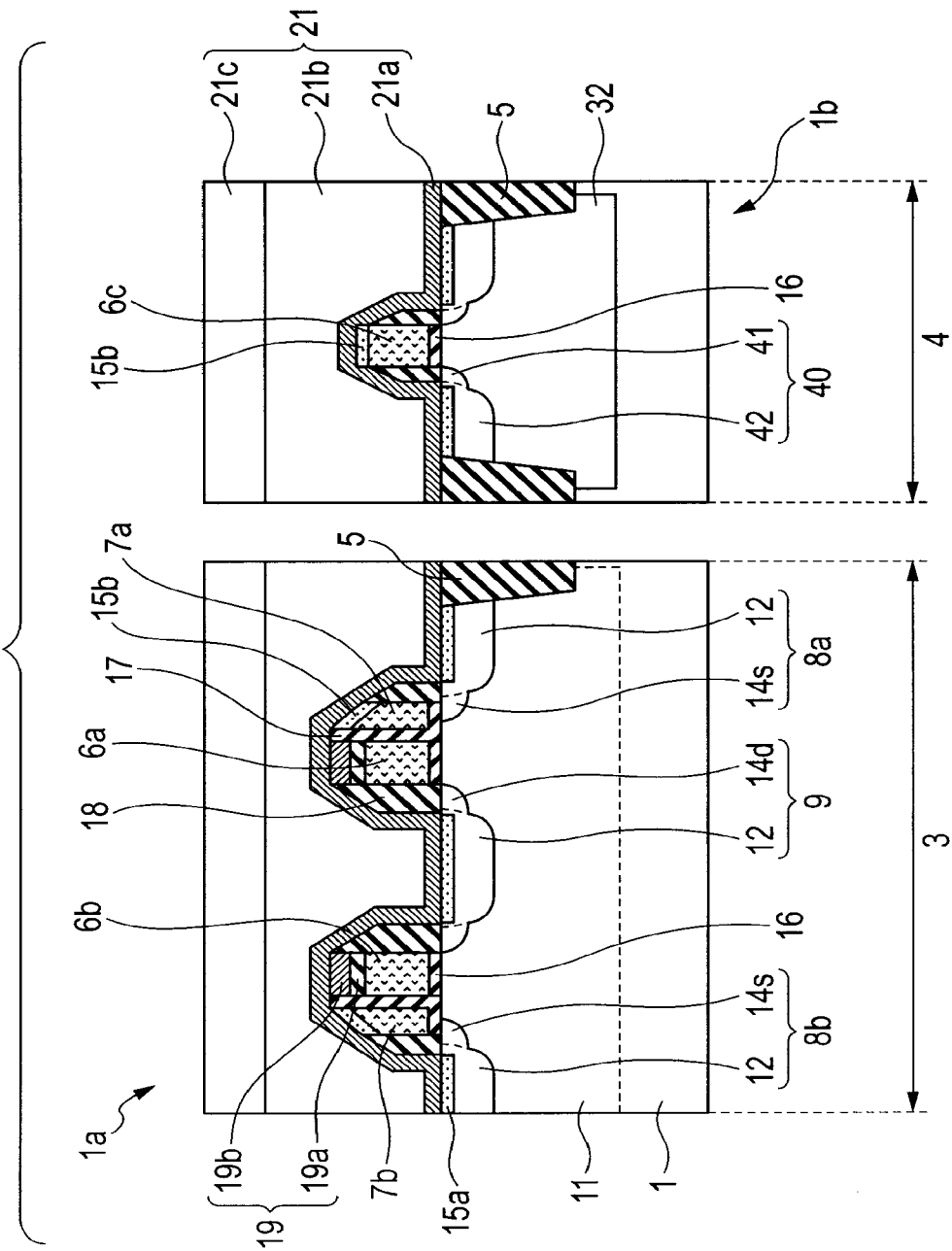
FIG. 27 is a device process flow cross-sectional view corresponding to the B-B' cross section of FIG. 6 (in the step of depositing a premetal insulating film)
Figure 28:
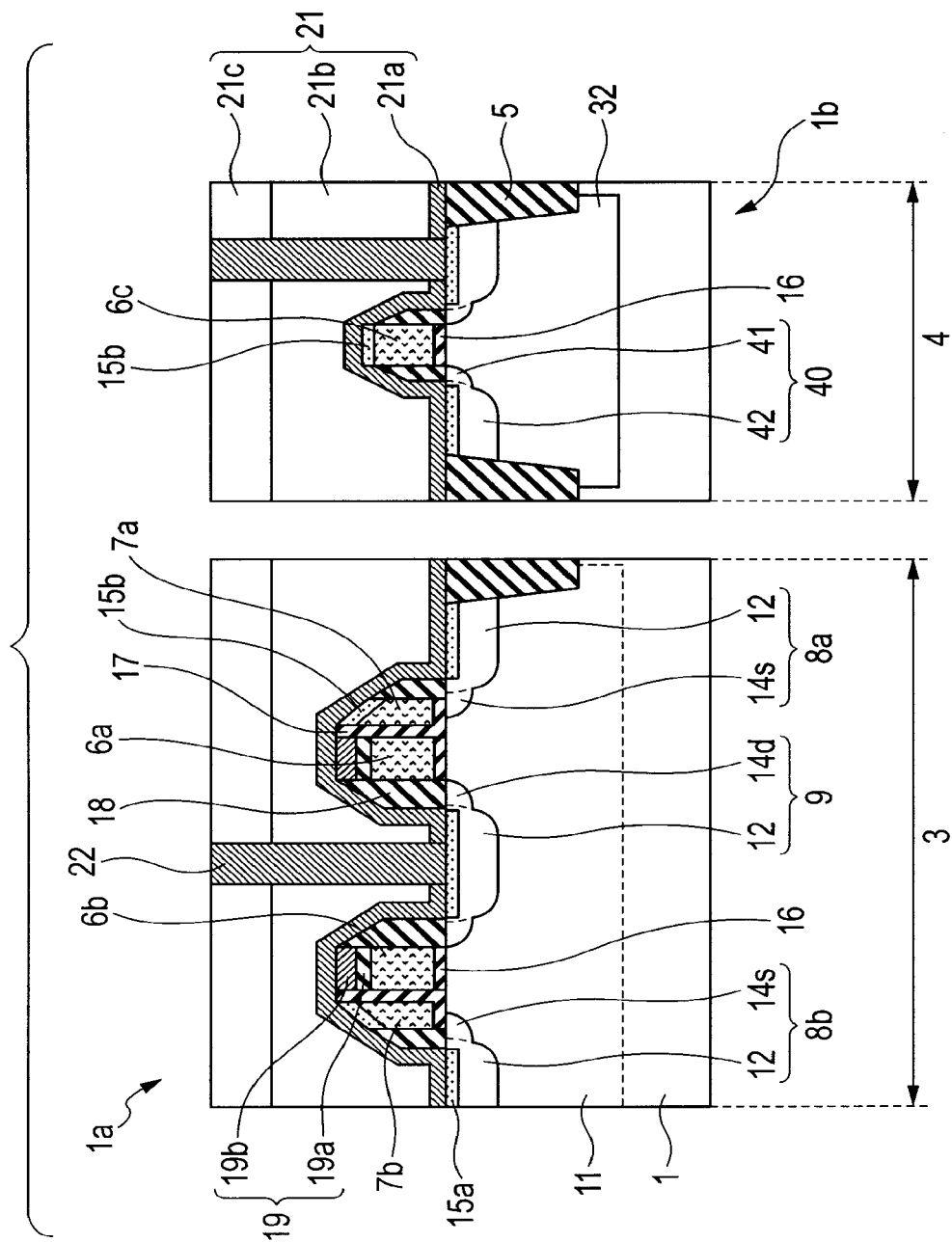
FIG. 28 is a device process flow cross-sectional view corresponding to the B-B' cross section of FIG. 6 (in the step of forming tungsten plugs)
Figure 29:
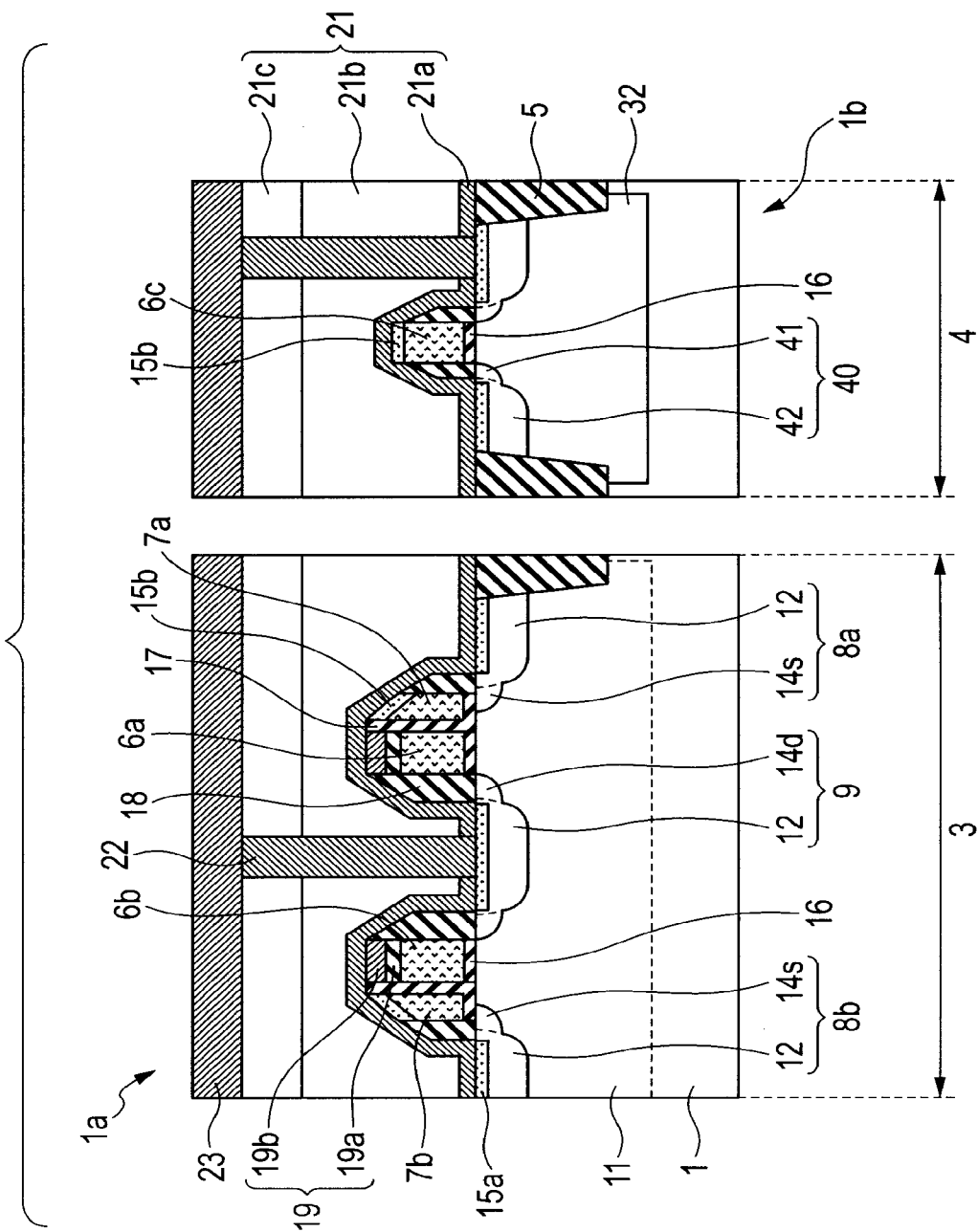
FIG. 29 is a device process flow cross-sectional view corresponding to the B-B' cross section of FIG. 6 (in the step of forming a first-layer metal wiring)

FIG. 6 is a partial top view of a wafer illustrating mutual positional relations among the memory cell portion, a peripheral circuit portion, an alignment target pattern, and a chip region in the split-gate flash memory shown in FIG. 1. FIG. 7 is a device process flow cross-sectional view corresponding to a B-B' cross section of FIG. 6 (in which a memory cell array portion further corresponds to an A-A" cross section of FIG. 1, and the same applies to the subsequent drawings of FIGS. 8 to 29) (in the step of depositing a silicon nitride film for processing the STI regions). FIG. 8 is a device process flow cross-sectional view corresponding to the B-B' cross section of FIG. 6 (in the step of coating a resist film for processing the STI regions). FIG. 9 is a device process flow cross-sectional view corresponding to the B-B' cross section of FIG. 6 (in the step of patterning the resist film for processing the STI regions). FIG. 10 is a device process flow cross-sectional view corresponding to the B-B' cross section of FIG. 6 (in the step of filling and planarizing the STI regions). FIG. 11 is a device process flow cross-sectional view corresponding to the B-B' cross section of FIG. 6 (in the step of introducing a P-type well). FIG. 12 is a device process flow cross-sectional view corresponding to the B-B' cross section of FIG. 6 (in the step of introducing an N-type well). FIG. 13 is a device process flow cross-sectional view corresponding to the B-B' cross section of FIG. 6 (in the steps of gate oxidation, and depositing a first polysilicon layer). FIG. 14 is a device process flow cross-sectional view corresponding to the B-B' cross section of FIG. 6 (in the step of depositing the cap insulating film). FIG. 15 is a device process flow cross-sectional view corresponding to the B-B' cross section of FIG. 6 (in the step of coating a resist for processing the gate electrodes in the memory cell portion). FIG. 16 is a device process flow cross-sectional view corresponding to the B-B' cross section of FIG. 6 (in the step of processing the gate electrodes in the memory cell portion). FIG. 17 is a device process flow cross-sectional view corresponding to the B-B' cross section of FIG. 6 (in the step of removing the cap insulating film in the peripheral circuit portion). FIG. 18 is a device process flow cross-sectional view corresponding to the B-B' cross section of FIG. 6 (in the step of depositing the ONO film and a second polysilicon layer). FIG. 19 is a device process flow cross-sectional view corresponding to the B-B' cross section of FIG. 6 (in the step of etching the second polysilicon layer by self-alignment). FIG. 20 is a device process flow cross-sectional view corresponding to the B-B' cross section of FIG. 6 (in the step of patterning a resist film for processing the ONO film and the inner gate electrodes). FIG. 21 is a device process flow cross-sectional view corresponding to the B-B' cross section of FIG. 6 (in the step of etching the ONO film and the inner gate electrodes). FIG. 22 is a device process flow cross-sectional view corresponding to the B-B' cross section of FIG. 6 (in the step of coating a resist film for processing a gate electrode in the peripheral circuit portion). FIG. 23 is a device process flow cross-sectional view corresponding to the B-B' cross section of FIG. 6 (in the step of processing the gate electrode in the peripheral circuit portion). FIG. 24 is a device process flow cross-sectional view corresponding to the B-B' cross section of FIG. 6 (in the steps of forming sidewall spacers, and introducing source/drain regions). FIG. 25 is a device process flow cross-sectional view corresponding to the B-B' cross section of FIG. 6 (in the step of silicidation). FIG. 26 is a device process flow cross-sectional view corresponding to the B-B' cross section of FIG. 6 (in the step of depositing a silicon nitride film over a contact). FIG. 27 is a device process flow cross-sectional view corresponding to the B-B' cross section of FIG. 6 (in the step of depositing a premetal insulating film). FIG. 28 is a device process flow cross-sectional view corresponding to the B-B' cross section of FIG. 6 (in the step of forming tungsten plugs). FIG. 29 is a device process flow cross-sectional view corresponding to the B-B' cross section of FIG. 6 (in the step of forming a first-layer metal wiring). Based on the drawings, a description will be given of the outline of a wafer process in the method of manufacturing a semiconductor integrated circuit device in an embodiment of the present invention.

First, referring to FIG. 6, a layout of a target device and the like over a wafer 1 will be described. As shown in FIG. 6, the memory cell portion 3 (memory cell array) occupies a part of a chip region 2. The chip region 2 is a product circuit region where an actual product circuit is formed. In the vicinity of the memory cell portion 3, a memory peripheral circuit 4 having a CMOS or CMIS structure is normally provided. In a scribe region 64 outside the chip region 2, an alignment target pattern 25 is placed. The alignment target pattern 25 includes an X-direction alignment target pattern 25x, a Y-direction alignment target pattern 25y, and the like. Next, using device cross sections corresponding to the B-B' cross section of FIG. 6 (in which the memory cell array portion further corresponds to the A-A" cross section of FIG. 1), the outline of the wafer process will be described. Note that, because of illustrative limitations, each of the cross sections shown below depicts a part of each of the memory cell portion 3, the memory peripheral circuit 4, the X-direction alignment target pattern 25x, and the like. Of the memory peripheral circuit 4, a part of the P-channel portion having the CMOS or CMIS structure is shown.

As shown in FIG. 7, respective cross sections correspond to the memory cell array 3, the peripheral circuit portion 4, and the alignment target pattern portion 25 arranged from left to right. As a starting material, the wafer 1 is prepared. Examples of the wafer 1 that can be shown include a P-type single-crystal silicon wafer (silicon-based single-crystal wafer) and the like. Note that the wafer 1 may be either an epitaxial wafer or a SOI wafer. Examples of the wafer 1 that can be shown in terms of the size thereof include a 300ϕ wafer (having a substantially circular shape of a diameter of about 300 mm). Note that, in addition thereto, a 200ϕ wafer, a 450® wafer, and the like can also be shown as the examples thereof. The process steps will be described hereinbelow.

As shown in FIG. 7, over substantially the entire first main surface 1a (opposite to the back surface 1b) of the wafer 1, a silicon dioxide film (pad silicon oxide film) 26 having a thickness of, e.g., about 10 nm is formed first by thermal oxidation. As a thermal oxidation process, a single-wafer lamp heating method (which may also be a batch process) in, e.g., a hydrogen/oxygen mixed gas atmosphere under reduced pressure or the like may be used appropriately (hereinafter referred to as "$H_2/O_2$-mixed-gas-atmosphere reduced-pressure oxidation"). The pad silicon oxide film 26 is formed to protect the wafer 1 from etching damage when the STI regions are processed. Subsequently, over substantially the entire surface of the pad silicon oxide film 26, a silicon nitride film 27 for processing the STI regions having a thickness of, e.g., about 90 nm is deposited by a Chemical Vapor Deposition (CVD) method or the like.

Next, as shown in FIG. 8, a resist film 28 for processing the STI regions is coated over substantially the entire surface of the silicon nitride film 27. Subsequently, the wafer 1 over which the resist film 28 for processing the STI regions is coated is processed by a lithography process or the like in Section 3 or 4. Here, by way of example, only the outline of the step of forming the STI regions is described correspondingly to Section 3 (see Section 3 for the details thereof).

That is, by the method shown in Section 3, the resist film 28 is developed to result in a state as shown in FIG. 9. Subsequently, in a state where there is the patterned resist film 28, anisotropic dry etching is executed to etch the silicon film 27, the pad silicon oxide film 26, and the first main surface 1a (surface region of a silicon member) of the wafer 1, and form isolation trenches. Thereafter, the resist film 28 is removed. Further, over the main surface 1a of the wafer 1 and in the isolation trenches, a buried insulating film 5 is deposited by, e.g., a CVD method or the like.

Subsequently, the first main surface 1a of the wafer 1 is planarized by a Chemical Mechanical Polishing (CMP) method or the like to result in a state as shown in FIG. 10, whereby the STI regions 5 (group of STI regions arranged in a matrix) and the target pattern 25 are completed. In FIG. 10, for ease of description, the X-direction alignment target pattern 25x is shown by way of example. However, at the same time as the STI regions 5 (group of STI regions arranged in a matrix) and the target pattern 25x are formed, the Y-direction alignment target pattern 25y is also formed. Next, as shown in FIG. 11, in a state where the portions other than the memory cell portion 3 are covered with a resist film 29 for P-well introduction, the P-well 11 is formed in the memory cell portion 3 by ion implantation.

Next, as shown in FIG. 12, in a state where the portions other than the peripheral circuit portion 4 are covered with a resist film 31 for N-well introduction, an N-well 32 is formed by ion implantation. Thereafter, the resist film 31 is removed.

Next, as shown in FIG. 13, over the first main surface 1a of the wafer 1, the gate insulating film 16 having a thickness of, e.g., about 7 nm is formed by, e.g., the $H_2/O_2$-mixed-gas-atmosphere reduced-pressure oxidation. Further, over the gate insulating film 16, a first-layer polysilicon film 33 having a thickness of, e.g., about 140 nm is deposited by, e.g., a CVD method or the like.

Next, as shown in FIG. 14, over the first-layer polysilicon film 33, the cap insulating film 19 comprised of, e.g., a lower-layer cap silicon oxide film 19a (having a thickness of, e.g., about 10 nm) and an upper-layer cap silicon nitride film 19b (having a thickness of, e.g., about 50 nm) is deposited by, e.g., a CVD method or the like.

Next, as shown in FIG. 15, over the cap insulating film 19, a resist film 34 for patterning selection gates is coated. Subsequently, the wafer 1 over which the resist film 34 is coated is introduced into a lithography apparatus (including an exposure apparatus) and, using the X-direction alignment target pattern 25x, alignment in the X-direction (row direction) is executed. Likewise, using the Y-direction alignment target pattern 25y, alignment in the Y-direction (column direction) is executed and, using an optical mask, selective exposure to light of the memory cell portion 3 is performed (in other words, using the X-direction alignment target pattern 25x and the Y-direction alignment target pattern 25y each transferred using the mask of FIG. 30 described in Section 3, alignment in the X-direction and the Y-direction is executed). This means that alignment during the patterning of the selection gates is executed using the positions in the X-direction of the group of STI regions arranged in a matrix as a reference. Accordingly, as shown in FIG. 1, it is possible to minimize, e.g., the displacement in the X direction (row direction) between the end portion 24a of the STI region 5b and the selection gate electrode 6a.

Here, if it is assumed that a positive resist, e.g., is used, the resist in the peripheral circuit portion 4 is not basically exposed to light, while the resist over the alignment target pattern 25 is substantially entirely exposed to light. After the exposure is thus performed, the resist film 34 is subjected to a development process.

Using the patterned resist film 34 as a mask, anisotropic dry etching is executed to result in a state as shown in FIG. 16. That is, a multilayer film comprised of the selection gate electrode 6a and the cap insulating film and a multilayer film comprised of the selection gate electrode 6b and the cap insulating film 19 are formed. Thereafter, the resist film 34 is removed.

Next, as shown in FIG. 17, when the cap insulating film 19b formed over the first-layer polysilicon film 33 in the peripheral circuit portion 4 is removed, in a state where the portions other than the peripheral circuit portion 4 is covered with a resist film 35, wet etching (using, e.g., a hot-phosphoric-acid-based silicon nitride film etchant and a hydrofluoric-acid-based silicon dioxide film etchant) is executed to the first main surface 1a of the wafer 1, thereby removing the cap insulating film 19b in the peripheral circuit portion 4. In the step of removing the cap insulating film 19b, the cap insulating film 19a is used as an etching stopper. Thereafter, the resist film 35 is removed. The cap insulating film 19a formed in the peripheral circuit portion 4 is subjected to the subsequent cleaning step or the like, and removed.

Next, as shown in FIG. 18, the Oxide Nitride Oxide (ONO) film 17 is deposited over substantially the entire first main surface 1a of the wafer 1 by, e.g., a CVD method or the like. Subsequently, over substantially the entire main surface 1a of the wafer 1, a second-layer polysilicon film 36 having a thickness of, e.g., about 50 nm is deposited by, e.g., a CVD method or the like.

Next, as shown in FIG. 19, anisotropic dry etching is executed to substantially the entire first main surface 1a of the wafer 1 to leave, into sidewall shapes, the second-layer polysilicon film 36 a part of which is to serve as the memory gate electrodes 7a and 7b on respective both sides of the multilayer film comprised of the selection gate electrode 6a and the cap insulating film 19 and the multilayer film comprised of the selection gate electrode 6b and the cap insulating film 19.

Next, as shown in FIG. 20, in a state where a part of each of the pair of selection gate electrodes 6a and 6b in the memory cell portion 3, the memory gate electrodes 7a and 7b to be left therein, the peripheral circuit portion 4, and the alignment target pattern portion 25 are covered with a resist film 37, isotropic dry etching of polysilicon is successively executed to remove the exposed second-layer polysilicon film 36. Then, after the resist film 37 is removed, wet etching of the silicon dioxide film, the silicon nitride film, and the like is executed to remove the exposed ONO film 17, resulting in a state as shown in FIG. 21. In this manner, the first and second electrode lines 7a and 7b are formed by self-alignment along the pair of word lines 6a and 6b.

Next, as shown in FIG. 22, a resist film 38 for processing a memory peripheral circuit gate is coated over substantially the entire first main surface 1a of the wafer 1. Subsequently, the wafer 1 over which the resist film 38 is coated is introduced into a lithography apparatus (including an exposure apparatus) and, using the X-direction alignment target pattern 25x and the Y-direction alignment target pattern 25y (in other words, the target pattern transferred by exposure using the optical mask of FIG. 30 described in Section 3), alignment in the X-direction (row) direction and the Y-direction (column direction) is executed and, using the optical mask, selective exposure to light of the peripheral circuit portion 4 is performed. If it is assumed that a positive resist, e.g., is used, the resist in the memory cell portion 3 and over the alignment target pattern 25 is not basically exposed to light. After the exposure is thus performed, the resist film 38 is subjected to a development process. Here, the description has been given of the case where the X-direction alignment target pattern 25x and the Y-direction alignment target pattern 25y each used during the patterning of the selection gate electrodes 6 are also used during the patterning of an electrode 6c to be formed in the peripheral circuit portion 4. In this case, for the exposure to light of the STI regions 5 in the peripheral circuit portion 4, it is preferable to use a target pattern transferred by exposure using the optical mask of FIG. 30. However, for the exposure to light of the STI regions 5 in the peripheral circuit portion, a target pattern transferred by exposure using the optical mask of FIG. 31 can also be used. In that case, it is preferable that, in addition to the X-direction alignment target pattern 25x and the Y-direction alignment target pattern 25y, an X-direction alignment target pattern and a Y-direction alignment target pattern each used during the patterning of the electrode 6c to be formed in the peripheral circuit portion 4 are further formed using the optical mask of FIG. 31.

Next, as shown in FIG. 23, using the patterned resist film 38 as a mask, anisotropic dry etching is executed to form the gate electrode 6c in the peripheral circuit portion 4. Thereafter, the resist film 38 is removed.

Next, referring to FIG. 24, a description will be given of the formation of the sidewall spacers 18 and the introduction of the source/drain regions into the individual portions by ion implantation. As shown in FIG. 24, prior to the formation of the sidewall spacers 18, the N-type drain extension region 14d, the N-type source extension regions 14s, P-type extension regions 41, and the like are successively introduced. Then, over substantially the entire main surface 1a of the wafer 1, a silicon dioxide film is deposited as an insulating film by, e.g., a CVD method or the like. Thereafter, anisotropic dry etching is executed to form the sidewall spacers 18. Subsequently, P-type high-concentration regions 42, the N-type high-concentration regions 12, and the like are successively introduced. Here, as an insulating film for forming the sidewall spacers, a silicon dioxide film is used, but the insulating film for forming the sidewall spacers is not limited to the silicon dioxide film. The sidewall spacers can also be formed of a silicon nitride film or a multilayer film of a silicon dioxide film and a silicon nitride film.

Next, as shown in FIG. 25, as the silicide layers 15a (over the source/drain regions) and the silicide layers 15b (over the memory gates), nickel silicide layers, e.g., are formed. As the silicide layers 15b, besides nickel silicide layers, cobalt silicide layers, titanium silicide layers, or nickel silicide layers containing platinum may also be formed.

Next, as shown in FIG. 26, over substantially the entire first main surface 1a of the wafer 1, a silicon nitride film 21a (having a thickness of, e.g., about 40 nm), which is a part of the premetal insulating film 21, is deposited by, e.g., a DVD method or the like.

Next, as shown in FIG. 27, over substantially the entire main surface 1a of the wafer 1, an ozone-TEOS-silicon-oxide-based film 21b (having a thickness of, e.g., about 170 nm) and a plasma-TEOS-silicon-oxide-based film 21c (having a thickness of, e.g., about 100 nm), each of which is a part of the premetal insulating film 21, are successively deposited. Subsequently, as necessary, planarization by a CMP process is executed. It is also possible that a plasma-TEOS-silicon-oxide-based film, e.g., may be further formed.

Next, as shown in FIG. 28, contact holes are formed, and the tungsten plugs 22 are buried therein via barrier metal films of titanium and titanium nitride or the like.

Next, as shown in FIG. 29, the first-layer copper buried wiring 23 (bit lines) is formed by a single damascene method. Thereafter, the required numbers of wiring layers and inter-layer insulating films are stacked to complete the device.

§3. Description of Process (Multiple Exposure Process) of Forming STI Regions in Method of Manufacturing Semiconductor Integrated Circuit Device in Embodiment of Present Invention, Etc. (Mainly Using FIGS. 30 to 41)

Figure 30:
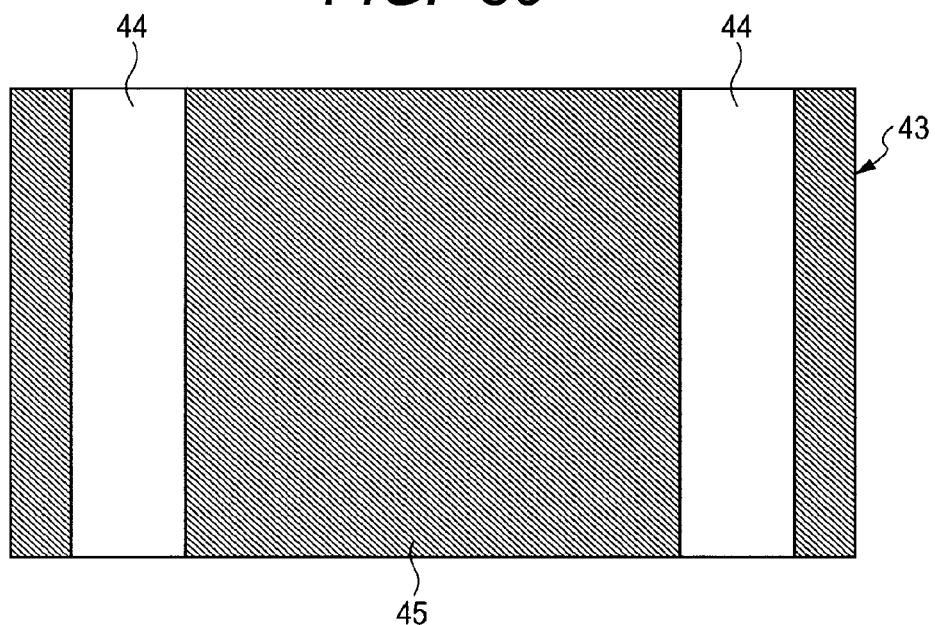
FIG. 30 is a mask plan view showing an example of a pattern of an optical mask (first optical mask) in a portion corresponding to FIG. 1 in the device process flow cross sections of FIGS. 8 to 10 (STI forming step)
Figure 31:
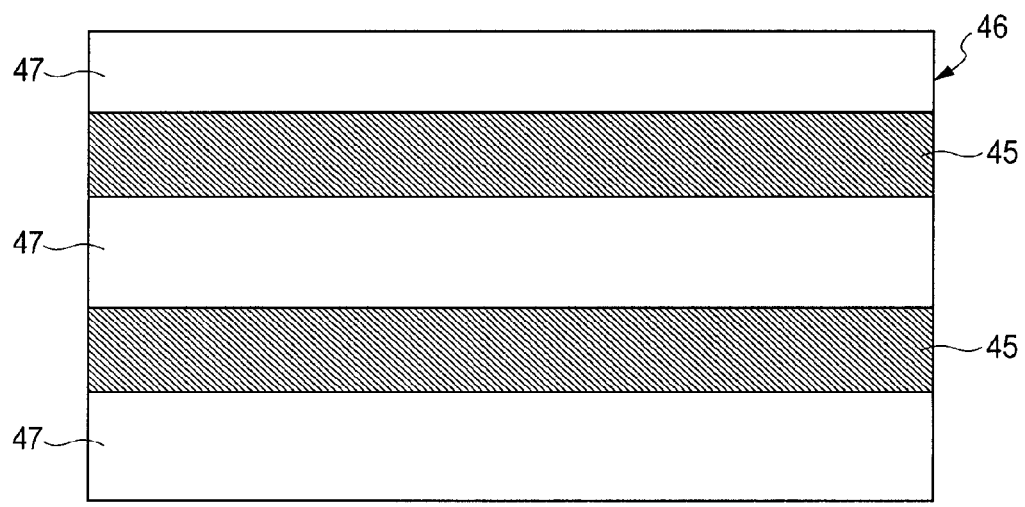
FIG. 31 is a mask plan view showing an example of a pattern of an optical mask (second optical mask) in the portion corresponding to FIG. 1 in the device process flow cross sections of FIGS. 8 to 10 (STI forming step)
Figure 32:
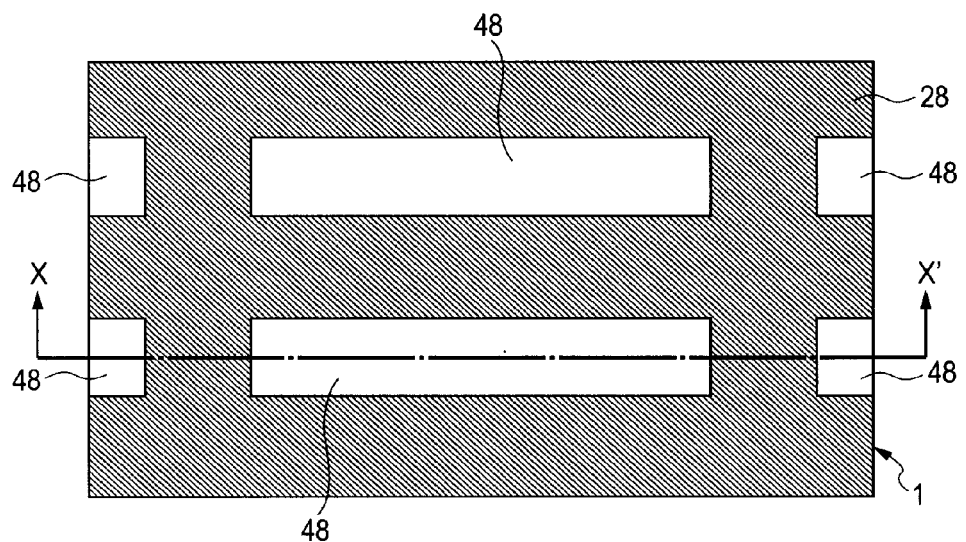
FIG. 32 is a device top view of the portion corresponding to FIG. 1 in the device process flow cross section of FIG. 9 (STI forming step)
Figure 33:
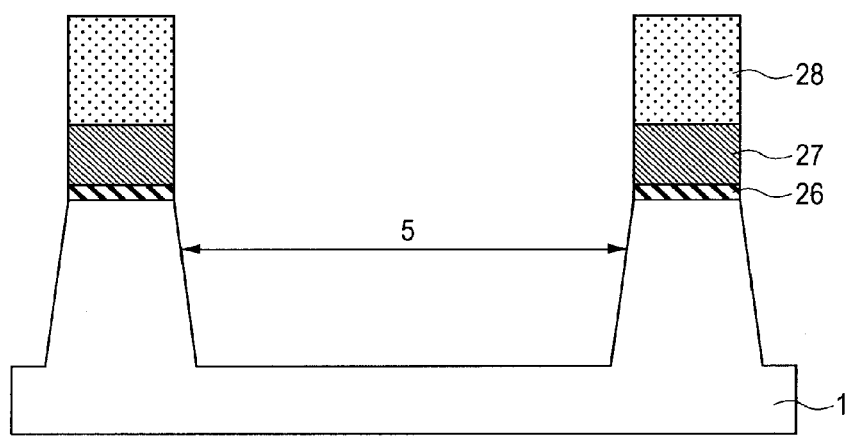
FIG. 33 is a device cross-sectional view associated with an X-X' cross section of FIG. 32.
Figure 34:
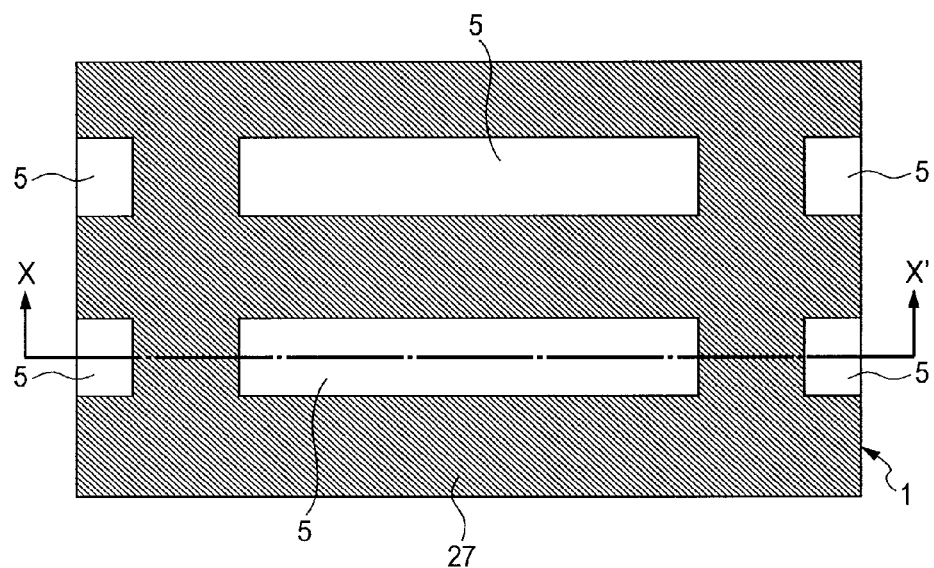
FIG. 34 is a device top view of the portion corresponding to FIG. 1 at the time when a resist film is removed after the step of FIG. 31.
Figure 35:
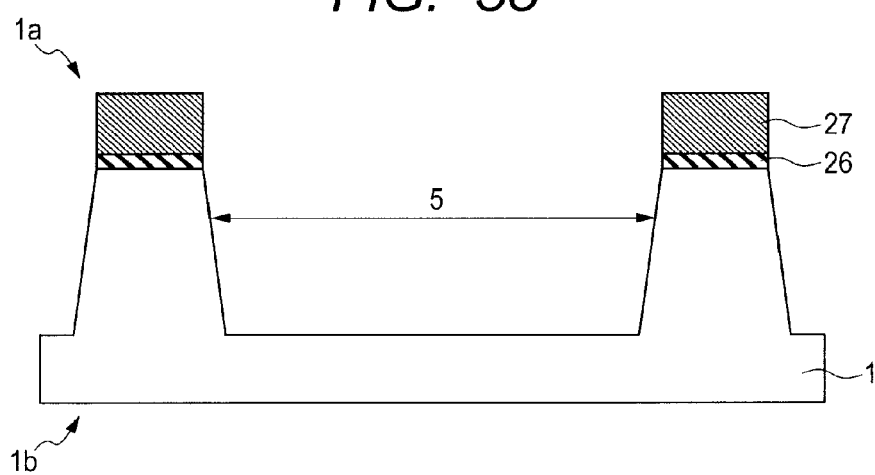
FIG. 35 is a device cross-sectional view associated with an X-X' cross section of FIG. 34.
Figure 36:
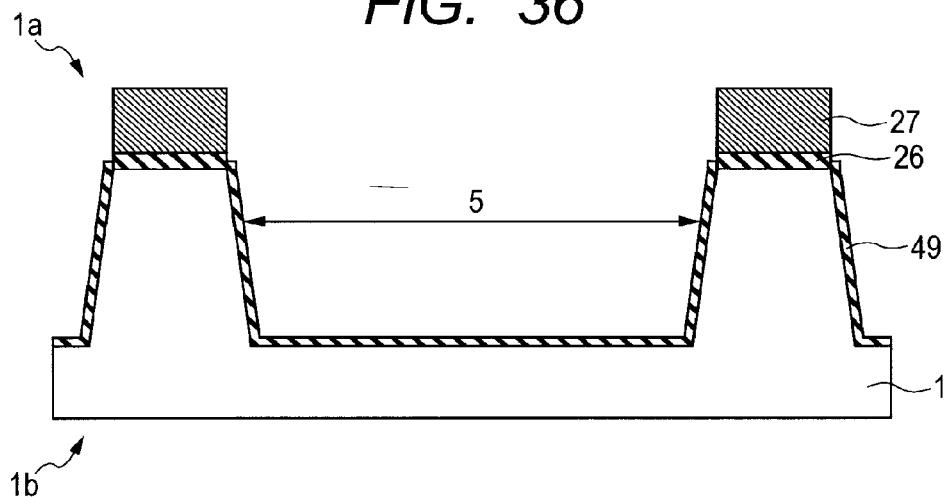
FIG. 36 is a device top view of the portion corresponding to FIG. 1 at the time when a liner silicon oxide film is deposited after the step of FIG. 34.
Figure 37:
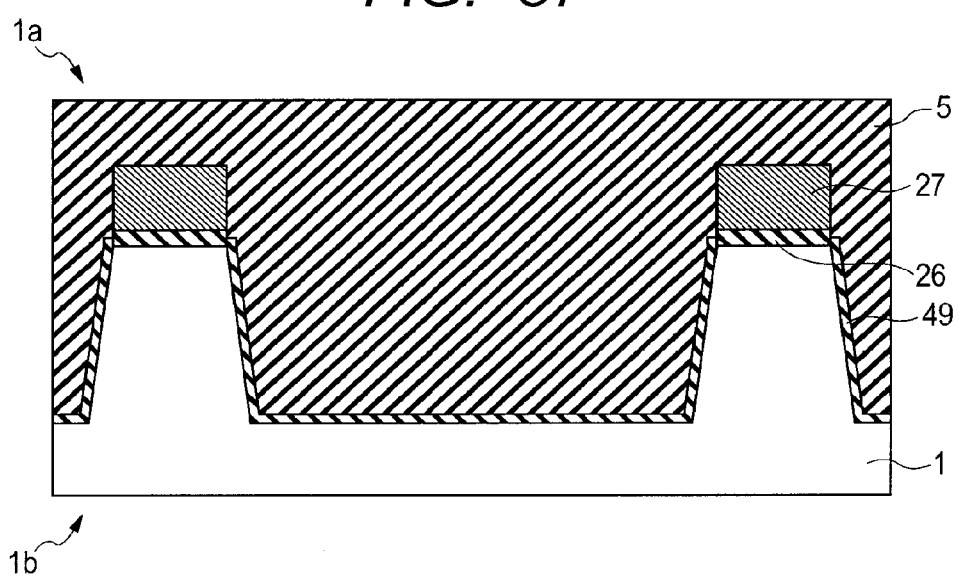
FIG. 37 is a device top view of the portion corresponding to FIG. 1 at the time when isolation trenches are each filled with a silicon dioxide film after the step of FIG. 36.
Figure 38:
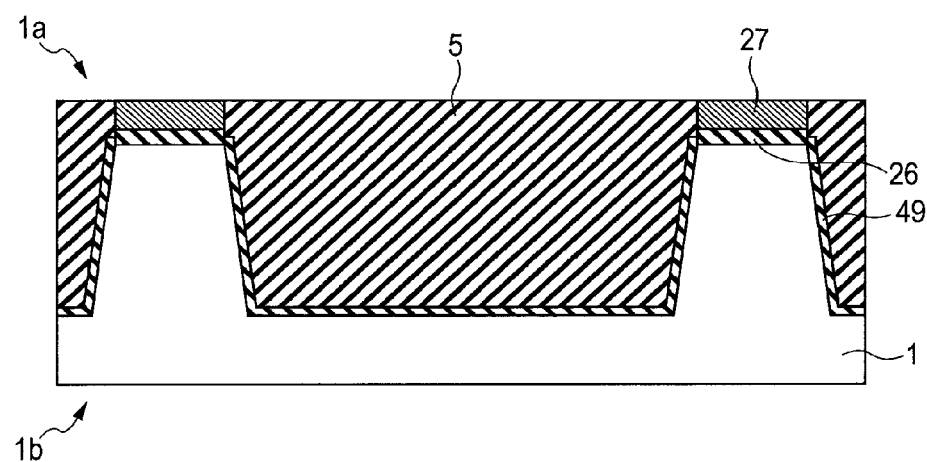
FIG. 38 is a device top view of the portion corresponding to FIG. 1 at the time when the unneeded buried silicon dioxide film is removed by chemical mechanical polishing after the step of FIG. 37.
Figure 39:
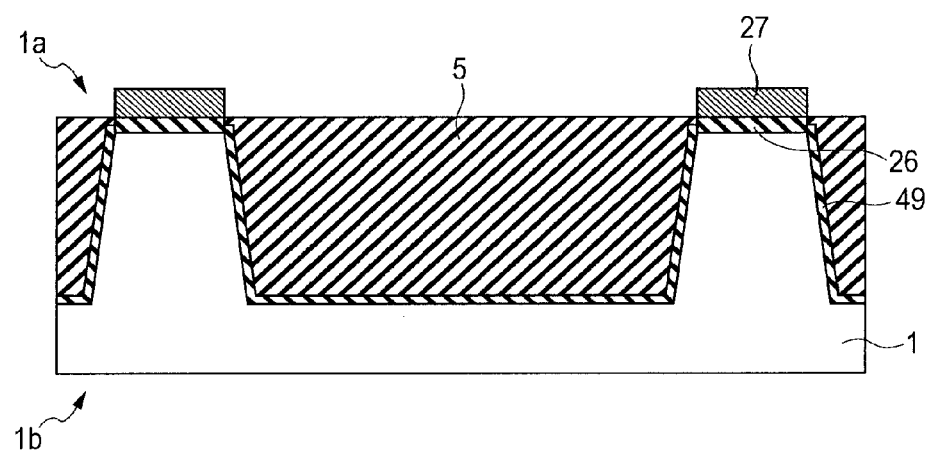
FIG. 39 is a device top view of the portion corresponding to FIG. 1 at the time when a process of etching the silicon dioxide film is executed before a silicon nitride film is removed after the step of FIG. 38.
Figure 40:
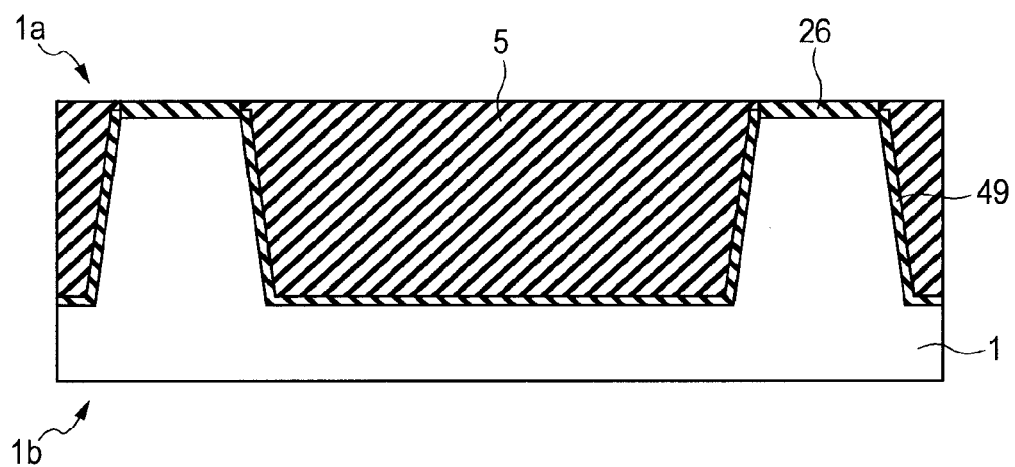
FIG. 40 is a device top view of the portion corresponding to FIG. 1 at the time when a process of removing the silicon nitride film is executed after the step of FIG. 39.
Figure 41:
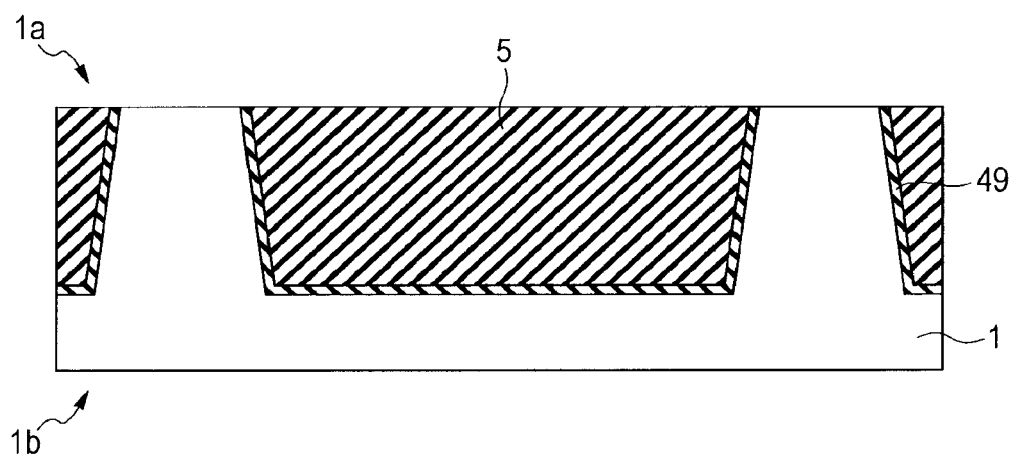
FIG. 41 is a device top view of the portion corresponding to FIG. 1 at the time when a process of etching the silicon dioxide film (including a cleaning process and the like) is executed after the silicon nitride film is removed after the step of FIG. 40.

FIG. 30 is a mask plan view showing an example of a pattern of an optical mask (first optical mask) in a portion corresponding to FIG. 1 in the device process flow cross sections of FIGS. 8 to 10 (STI forming step). FIG. 31 is a mask plan view showing an example of a pattern of an optical mask (second optical mask) in the portion corresponding to FIG. 1 in the device process flow cross sections of FIGS. 8 to 10 (STI forming step). FIG. 32 is a device top view of the portion corresponding to FIG. 1 in the device process flow cross section of FIG. 9 (STI forming step). FIG. 33 is a device cross-sectional view associated with an X-X' cross section of FIG. 32. FIG. 34 is a device top view of the portion corresponding to FIG. 1 at the time when a resist film is removed after the step of FIG. 31. FIG. 35 is a device cross-sectional view associated with an X-X' cross section of FIG. 34. FIG. 36 is a device top view of the portion corresponding to FIG. 1 at the time when a liner silicon oxide film is deposited after the step of FIG. 34. FIG. 37 is a device top view of the portion corresponding to FIG. 1 at the time when isolation trenches are each filled with a silicon dioxide film after the step of FIG. 36. FIG. 38 is a device top view of the portion corresponding to FIG. 1 at the time when the unneeded buried silicon dioxide film is removed by chemical mechanical polishing after the step of FIG. 37. FIG. 39 is a device top view of the portion corresponding to FIG. 1 at the time when a process of etching the silicon dioxide film is executed before a silicon nitride film is removed after the step of FIG. 38. FIG. 40 is a device top view of the portion corresponding to FIG. 1 at the time when a process of removing the silicon nitride film is executed after the step of FIG. 39. FIG. 41 is a device top view of the portion corresponding to FIG. 1 at the time when a process of etching the silicon dioxide film (including a cleaning process and the like) is executed after the silicon nitride film is removed after the step of FIG. 40. Based on the drawings, a description will be given of the process (multiple exposure process) of forming the STI regions in the method of manufacturing the semiconductor integrated circuit device in the embodiment of the present invention.

In the state of FIG. 8 described in Section 2, the wafer 1 is introduced into a reduced projection exposure apparatus and, using a first optical mask 43 and a second optical mask 46 as shown in FIGS. 30 and 31, the resist film 28 for processing the STI regions (which is a negative resist film herein) is exposed to light in the order of, e.g., figure numbers. That is, without interposing a development step between individual exposure steps, two exposure steps are performed continuously using the first optical mask 43 and the second optical mask 46. Note that the order of the exposure steps may be inverted. In the first optical mask 43, a group of first linear openings 44 and mask light shielding portions 45 defining the first linear openings 44 are provided. On the other hand, in the second optical mask 46, a group of second linear openings 47 and the mask light shielding portions 45 defining the second linear openings 47 are provided. When the resist film 28 is developed, a pattern as shown in FIG. 32 is obtained. That is, in the resist film 28, a plurality of unit openings 48 each having a substantially rectangular shape longer in the row direction than in the column direction are formed in a matrix arranged in the column direction and the row direction. Thus, the exposure steps are performed using the respective two optical masks 43 and 46, and a pattern as shown in FIG. 32 is produced from the resist film 28 by the subsequent development. Therefore, it is necessary for the resist film 28 used in Section 3 to be a negative resist film.

Figure 54:
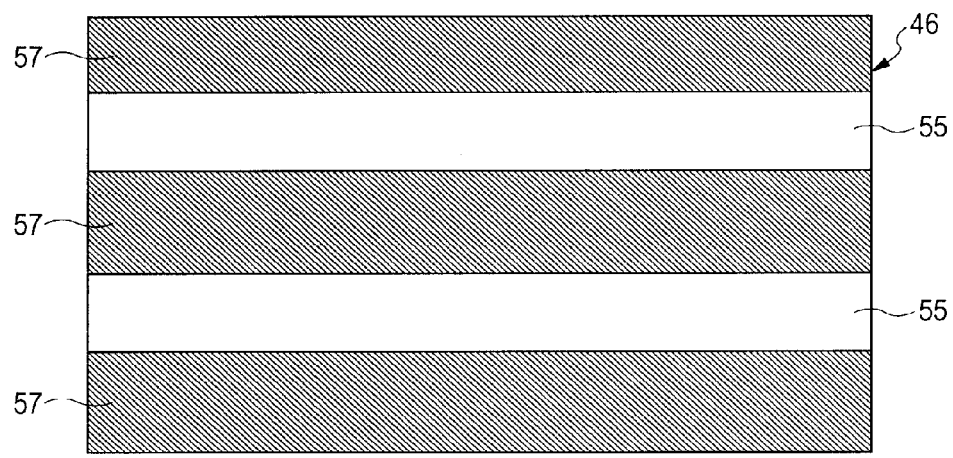
FIG. 54 is a mask plan view showing an example (when a positive resist is used) of a second optical mask for the device portion of FIG. 1, which is for illustrating the process of forming the STI regions in the method of manufacturing the semiconductor device in the another embodiment of the present invention.

Next, as shown in FIG. 33, in a state where there is the developed resist film 28, an anisotropic dry etching process is executed to the silicon nitride film 27 for processing the STI regions, the pad silicon oxide film 26, and the silicon surface region of the first main surface 1a of the wafer 1 so that the STI regions 5, i.e., isolation trenches are formed. By thus performing the exposure steps in the two orthogonal directions using the masks for the respective directions, a proximity effect at an end portion of each of the rectangular shapes can be avoided, and the end portion of the rectangular shape can be avoided from being rounded. This is because, in the present embodiment, during the formation of the STI regions 5, the two exposure steps are performed using the respective two linear masks having no corner portion to form the resist film 28 having a rectangular shape. Because the linear masks have no end portion or no corner portion, they are free from the influence of the proximity effect. When the end portions of the rectangular shapes are rounded, the memory gate electrodes 7 are formed undesirably over the rounded areas of the STI regions 5, which results in a concern that the characteristics of the memory cells fluctuate. However, according to the present embodiment, it is possible to avoid such fluctuations in the characteristics of the memory cells. In addition, there is no need to ensure a margin considering roundness, and the memory cell region can be reduced in size. When the resist film 28 is removed, states as shown in FIGS. 34 and 35 are provided. Note that the patterning of the STI regions 5 in the peripheral circuit portion 4 may be performed in the same manner as in the memory cell portion 3 but, in general, if the patterning is executed using either one of the optical masks of FIGS. 30 and 31, a simpler process is achieved. In the method described in Section 5, the patterning of the STI regions 5 in the peripheral circuit portion 4 may be performed in the same manner as in the memory cell portion 3 but, in general, if the patterning is executed using either one of the optical masks of FIGS. 47 and 54, a simpler process is achieved. In the case with the method described in Section 5, if consideration is given to compatibility with the other portions, the use of the optical mask of FIG. 54 is most preferred.

Next, as shown in FIG. 36, by subjecting the inner surfaces of the exposed isolation trenches 5 to a thermal oxidation process, liner silicon oxide films 49 are formed. Note that the thermal oxidation process may also be the $H_2/O_2$-mixed-gas-atmosphere reduced-pressure oxidation described above. In that case, the surface of the silicon nitride film 27 for processing the STI regions is also oxidized.

Next, as shown in FIG. 37, over substantially the entire main surface 1a of the wafer 1, the buried insulating film 5 such as, e.g., a silicon dioxide film is deposited by, e.g., a CVD method using a High Density Plasma (HDP).

Next, as shown in FIG. 38, to the first main surface 1a of the wafer 1, a CMP process is executed using the silicon nitride film 27 as a stopper. Then, as shown in FIG. 39, the exposed excess buried insulating film 5 is etched back using a hydrofluoric-acid-based etchant. Subsequently, as shown in FIG. 40, the silicon nitride film 27 is removed using a hot phosphoric acid or the like. Further, by executing a surface cleaning process using a hydrofluoric-acid-based etchant, the pad silicon oxide film 26 and the surface layer of the buried insulating film 5 are removed, resulting in a state as shown in FIG. 41. This is exactly the state of FIG. 10 described in Section 2.

§4. Description of Alignment Target Pattern Used in Exposure Step in Method of Manufacturing Semiconductor Integrated Circuit Device in Embodiment of Present Invention, Etc. (Mainly Using FIGS. 42 to 46)

Figure 42:
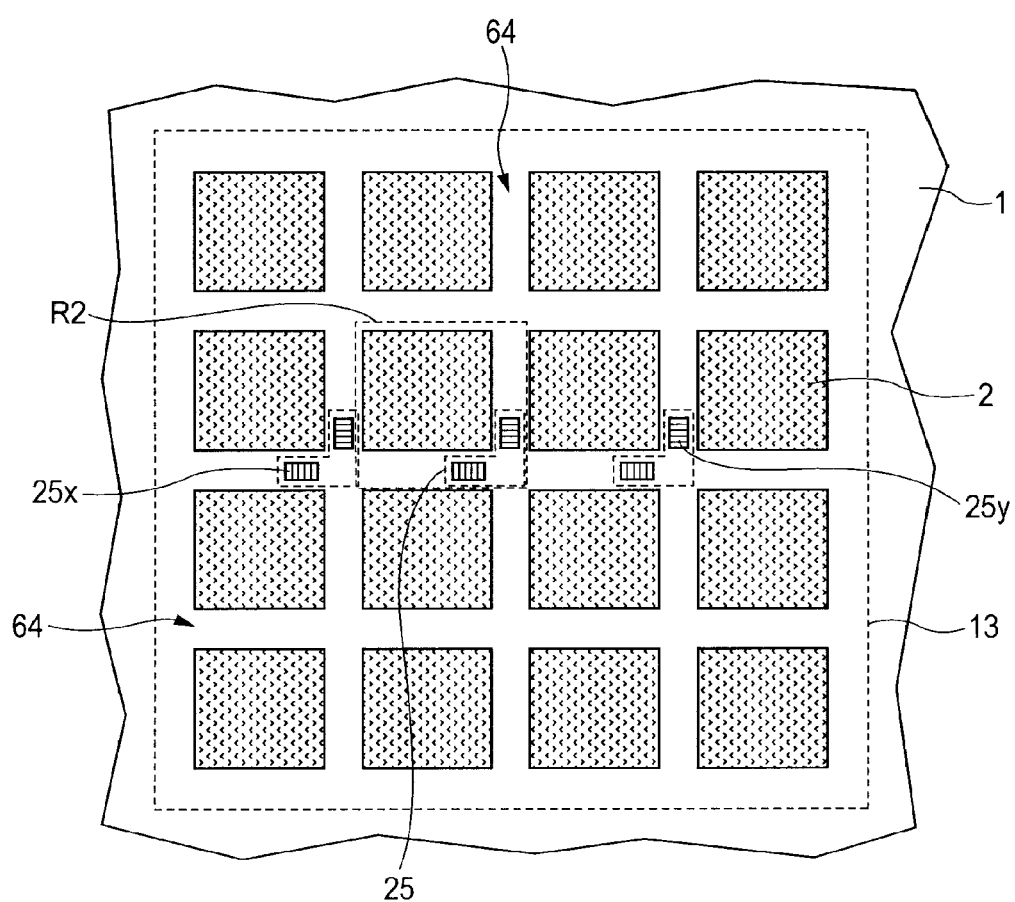
FIG. 42 is a top view of a wafer portion for illustrating the layout of the wafer, a unit exposure region, the chip region, the alignment target pattern, and the like in reduced projection exposure (FIG. 6 corresponds to the chip and a peripheral region R2 thereof)
Figure 43:
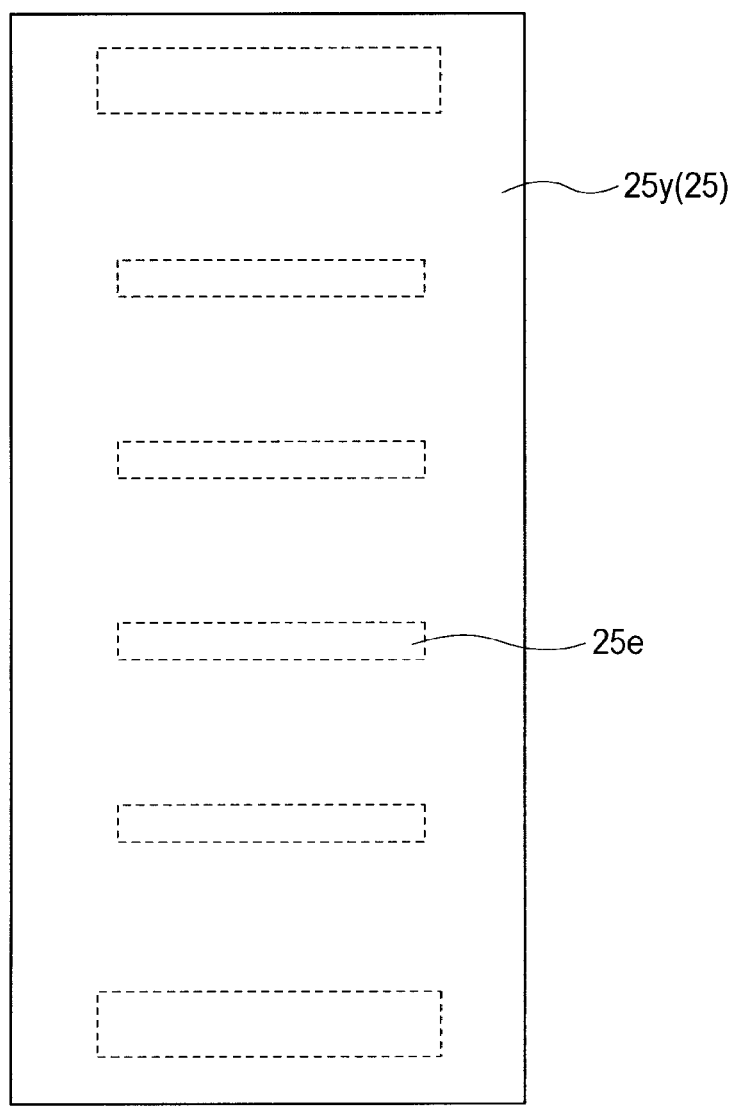
FIG. 43 is an enlarged top view of a Y-direction alignment target pattern of FIG. 42.
Figure 44:
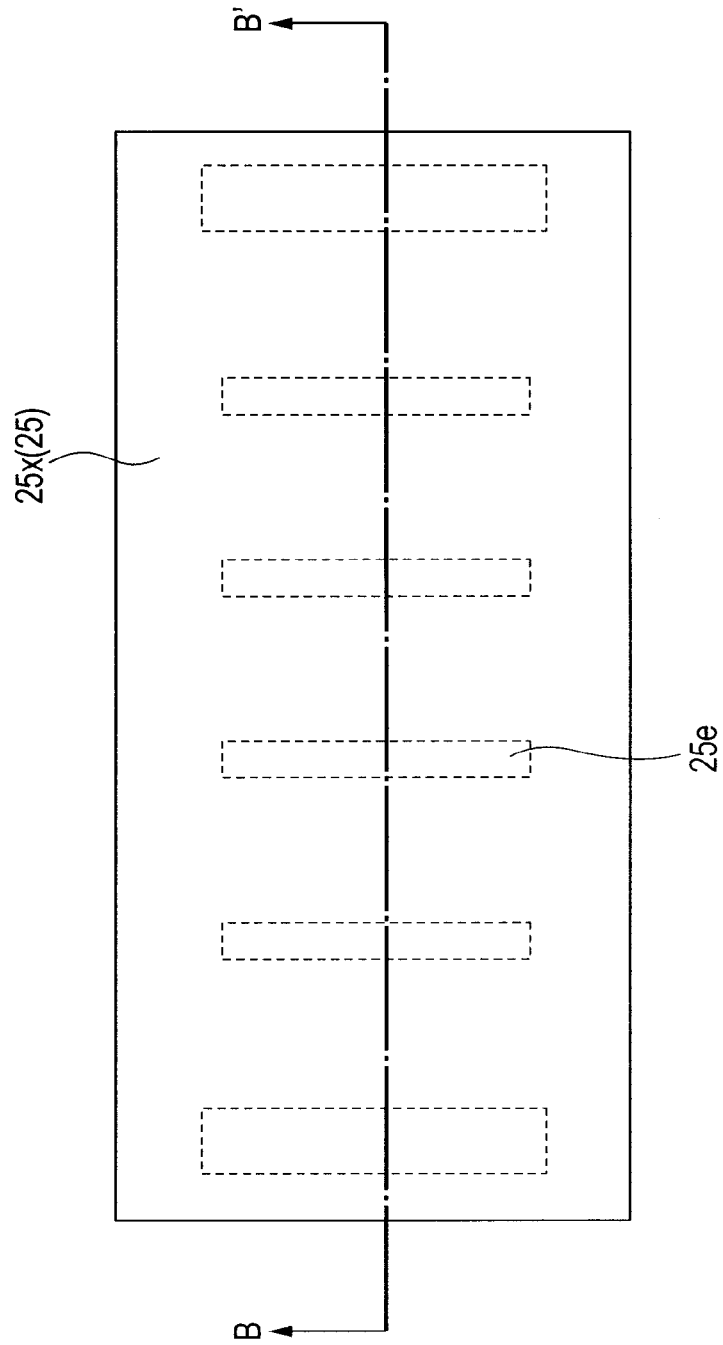
FIG. 44 is an enlarged top view of an X-direction alignment target pattern of FIG. 42.
Figure 45:
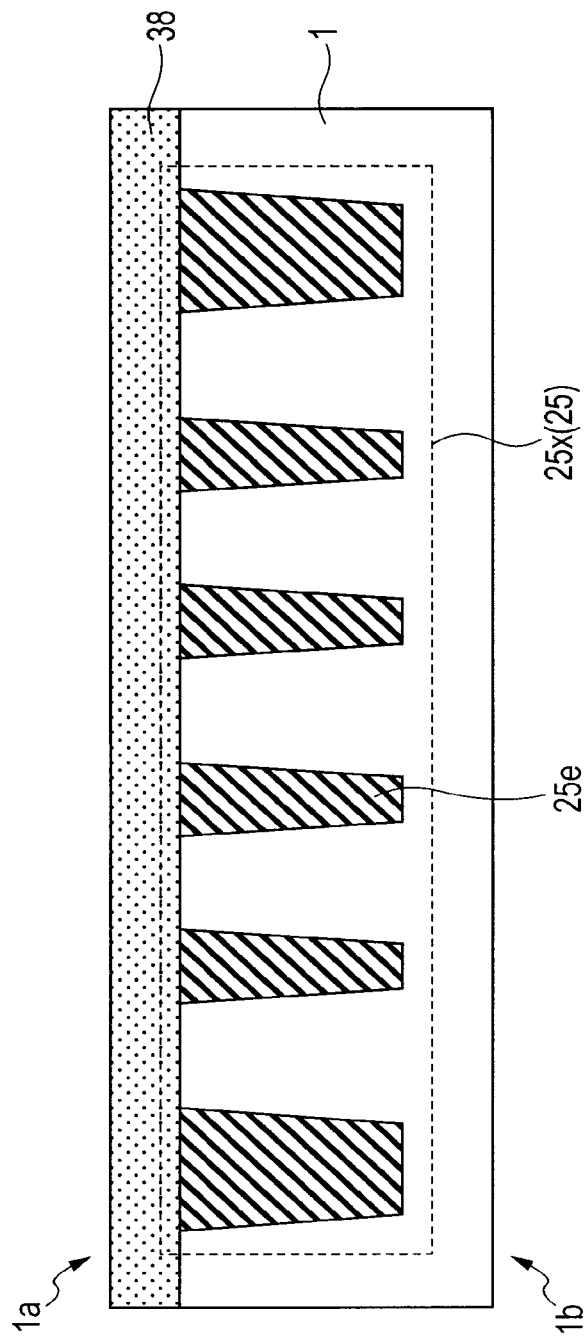
FIG. 45 is an enlarged cross-sectional view of an example of the alignment target pattern corresponding to a B-B' cross section of FIG. 44.
Figure 46:
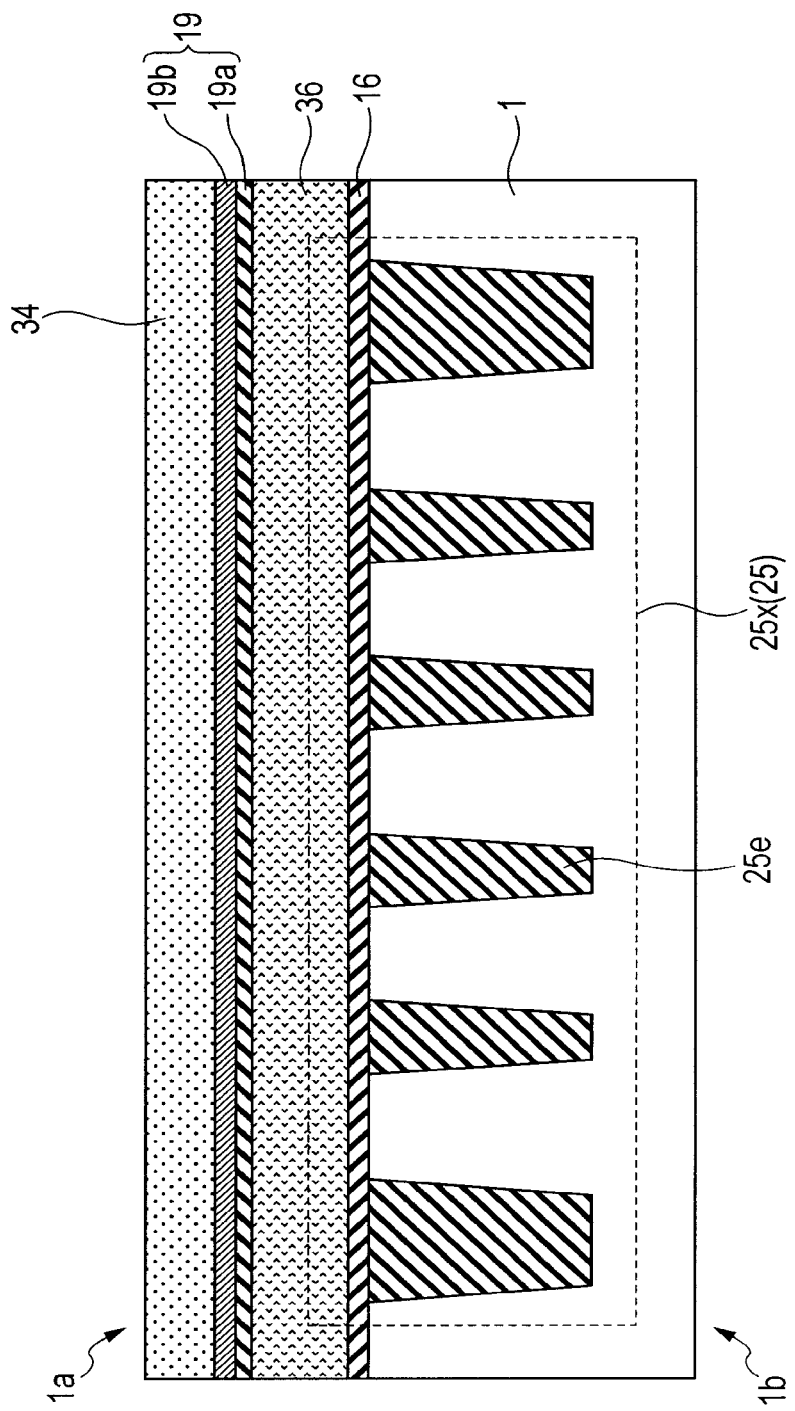
FIG. 46 is an enlarged cross-sectional view of another example of the alignment target pattern corresponding to the B-B' cross section of FIG. 44.

FIG. 42 is a top view of a wafer portion for illustrating the layout of the wafer, a unit exposure region, the chip region, the alignment target pattern, and the like in reduced projection exposure (FIG. 6 corresponds to the chip and a peripheral region R2 thereof). FIG. 43 is an enlarged top view of the Y-direction alignment target pattern of FIG. 42. FIG. 44 is an enlarged top view of the X-direction alignment target pattern of FIG. 42. FIG. 45 is an enlarged cross-sectional view of an example of the alignment target pattern corresponding to a B-B' cross section of FIG. 44. FIG. 46 is an enlarged cross-sectional view of another example of the alignment target pattern corresponding to the B-B' cross section of FIG. 44. Based on the drawings, a description will be given of the alignment target pattern used in an exposure process in the method of manufacturing the semiconductor integrated circuit device in each of the embodiments of the present invention.

In an exposure process in a lithography process used in the patterning of the STI regions described in Section 3, the patterning of the gate electrodes, or the like, e.g., reduced projection exposure, a plurality of the chip regions 2 are normally included in a region that can be exposed to light at a time in the exposure of the wafer 1 using an optical mask, i.e., a unit exposure region 13 (shot region), as shown in FIG. 42. In the scribe region 64 between the plurality of chip regions 2, the alignment target patterns 25 each formed of individual patterned layers normally exist (in general, the plurality of the alignment target patterns 25 exist in each of the directions of unit patterned layers). During alignment in each exposure step, the proper target patterns 25 each belonging to a previous process layer are normally combined into a set of those for the X- and Y-directions, and used. It is also possible to use the target patterns belonging to different process layers for the X- and Y-directions, but it is preferred to use the target patterns formed by the same exposure step. In the present invention, as the target patterns used when the selection gate electrodes 6 are patterned, the X-direction alignment target patterns 25x and the Y-direction alignment target patterns 25y that are produced in the process of forming the STI regions are used. The X-direction alignment target patterns 25x and the Y-direction alignment target patterns 25y when the resist film used during the etching of the selection gate electrodes 6 are preferably formed by the exposure step when the linear openings 44 extending in the column direction are formed in the resist film 28. This is because, by the linear openings 44 extending in the column direction, the widths of the STI regions 5 in the row direction in the region where the memory cell array is formed are determined, and it is necessary to prescribe the positions of the selection gate electrodes 6 with respect to the widths. This can allow the memory gate electrodes 7 formed into sidewall shapes over the side walls of the selection gate electrodes 6 to be avoided from being formed in the vicinity of the end portions of the STI regions 5, and stabilize the characteristics of the memory cells.

An overall plan view of the Y-direction alignment target pattern 25y of each of the target patterns 25 formed in the process of forming the STI regions is shown in FIG. 43. In this example, each of element patterns 25e in the alignment target pattern has a rectangular shape (the same applies to those in the X-direction alignment target pattern 25x), but it is not limited to the rectangular shape. The element pattern 25e may also have another shape. Likewise, an overall plan view of the X-direction alignment target pattern 25x of each of the target patterns 25 formed in the process of forming the STI regions is shown in FIG. 44. The B-B' cross section of FIG. 44 is shown in each of FIGS. 45 and 46 correspondingly to FIGS. 22 and 15. Here, in FIG. 46, various films exist over the alignment target pattern 25, but the alignment target pattern 25 can be optically recognized due to level differences in the interfaces between the semiconductor substrate 1 and the element patterns 25e of the alignment target pattern. However, in FIG. 45, the alignment target pattern 25 can be more clearly recognized. In FIG. 46, the STI regions have small level differences, and are in a nearly flat state. As a result, it may be difficult to optically recognize the target pattern when various films are formed thereover. In that case, after the STI regions are formed, i.e., after the step shown in FIG. 10, a mask is added, such a resist film as to expose the alignment target pattern portion 25 is formed, and then the buried insulating films 5 formed in the STI regions are etched to emphasize the level difference between the wafer 1 and the target pattern. With the emphasized level difference, even when various films are formed thereafter, the formed various films reflect the emphasized level difference so that optical recognition of the target pattern is easy.

§5. Description of Process (Composite Mask Process) of Forming STI Regions in Method of Manufacturing Semiconductor Integrated Circuit Device in Another Embodiment of Present Invention, Etc. (Mainly Using FIGS. 47 to 57)

A process of forming the STI regions described in Section 5 is a variation of the example described in Section 3. The process described in Section 5 includes more complicated steps, but is advantageous in that a positive resist can be used. It will be appreciated that, if necessary, a negative resist may also be used over either or each of the masks.

Figure 47:
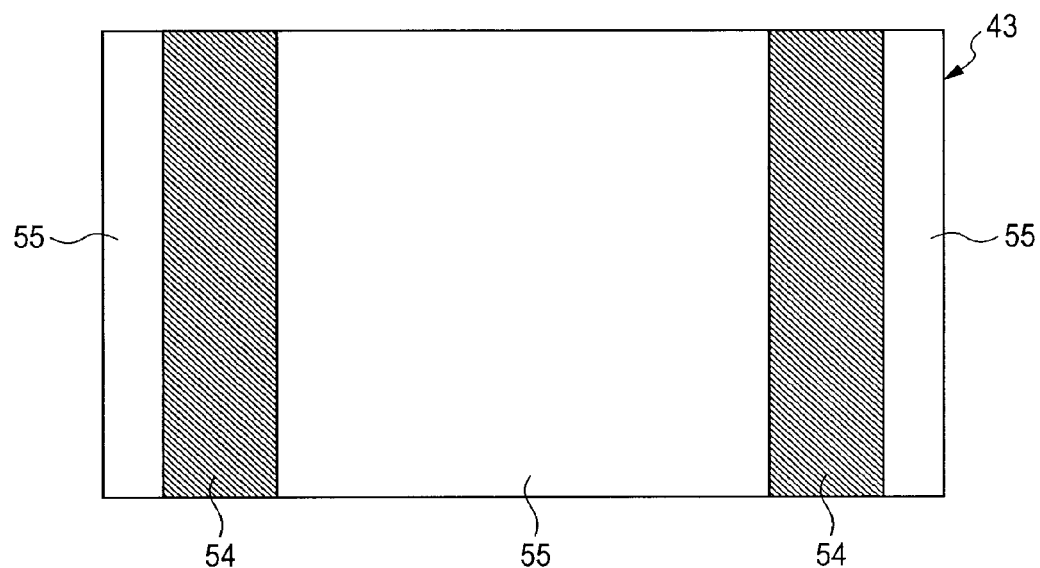
FIG. 47 is a mask plan view showing an example (when a positive resist is used) of a first optical mask for processing a hard mask for the device portion of FIG. 1, which is for illustrating a process of forming the STI regions in a method of manufacturing a semiconductor device in another embodiment of the present invention.
Figure 48:
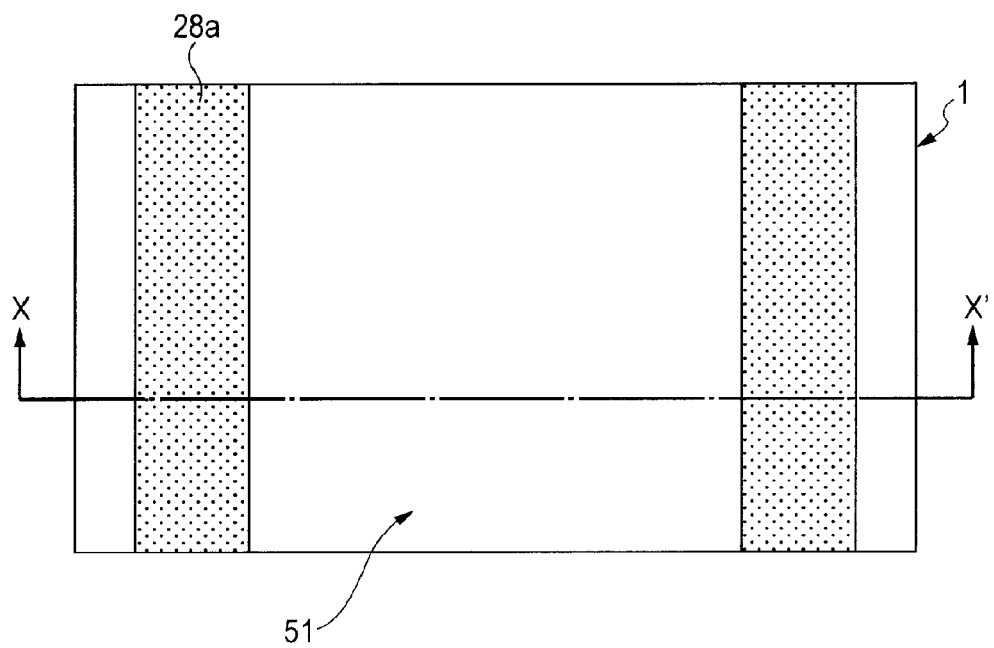
FIG. 48 is a plan view of a resist film pattern (first resist film) which has been exposed to light using the optical mask of FIG. 47, and developed.
Figure 49:
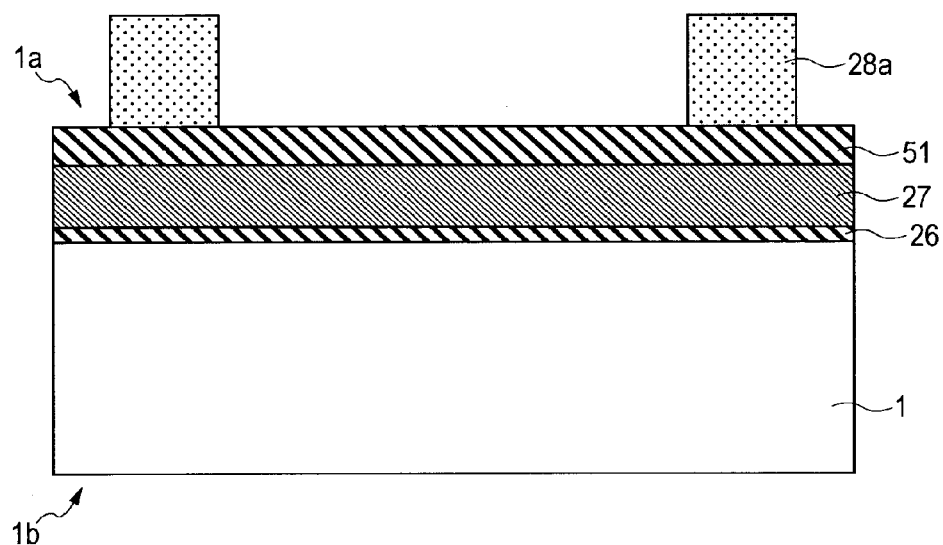
FIG. 49 is a device cross-sectional view corresponding to an X-X' cross section of FIG. 48.
Figure 50:
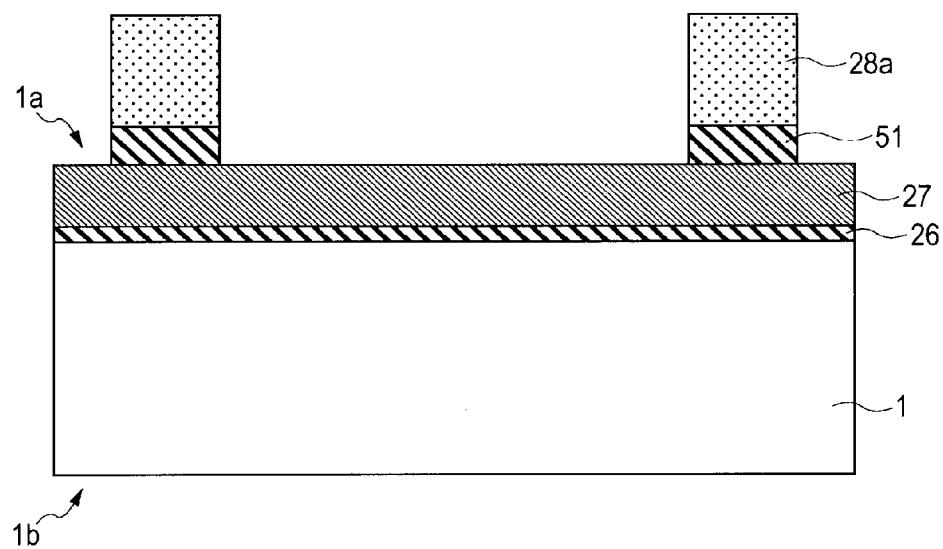
FIG. 50 is a device cross-sectional view (at the time when the etching of the hard mask is completed) subsequent to FIG. 49.
Figure 51:
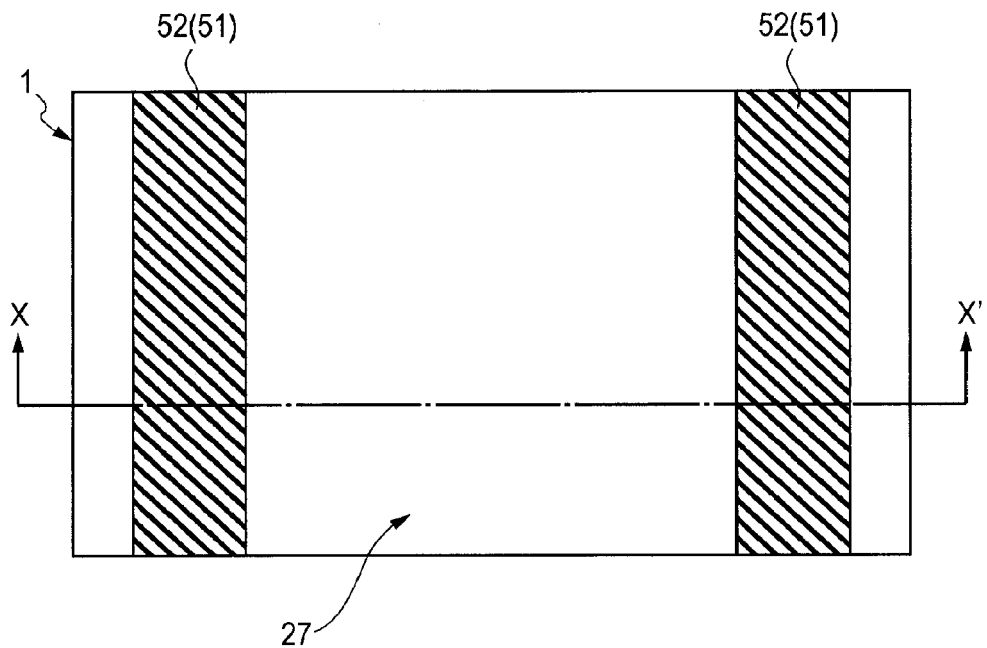
FIG. 51 is a device plan view (at the time when the removal of the first resist film is completed) subsequent to FIG. 50.
Figure 52:
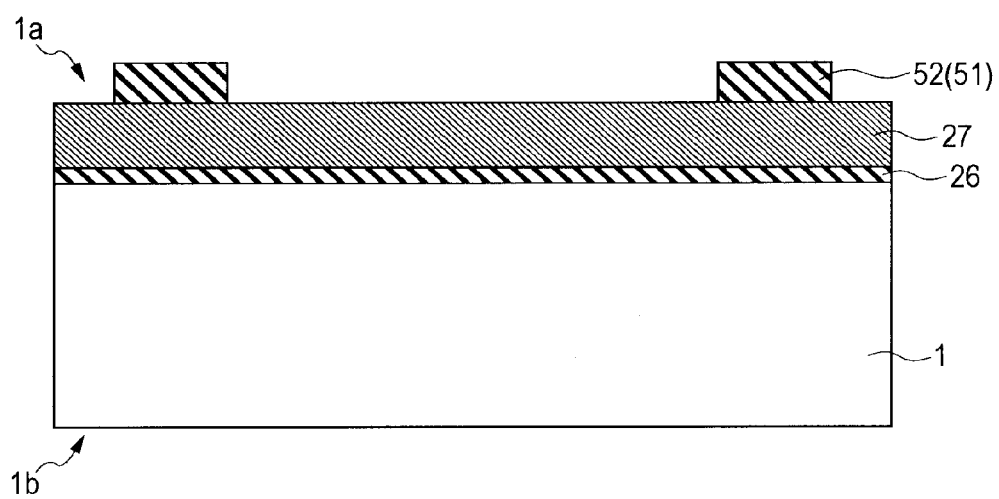
FIG. 52 is a device cross-sectional view corresponding to an X-X' cross section of FIG. 51.
Figure 53:
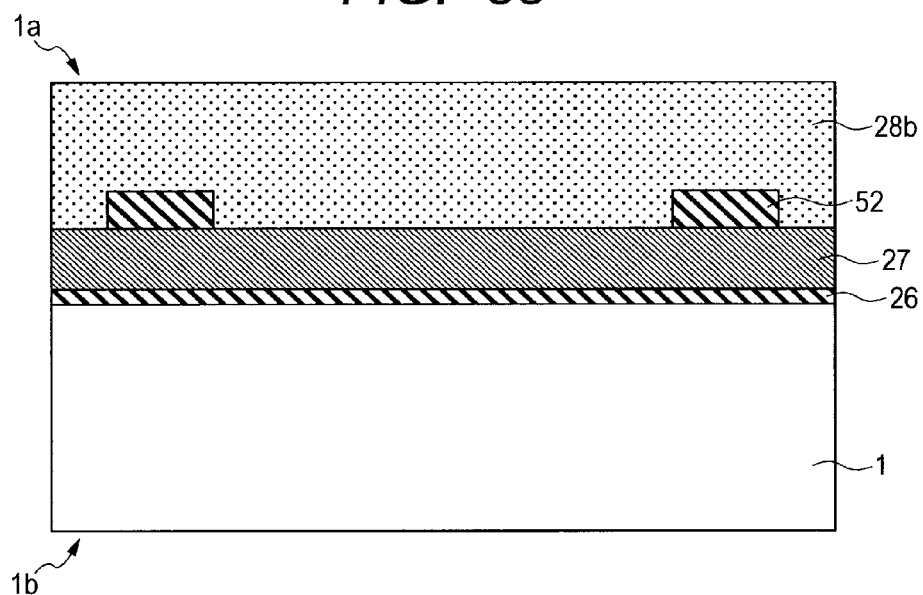
FIG. 53 is a device cross-sectional view (at the time when a second resist film is coated) subsequent to FIG. 52.
Figure 55:
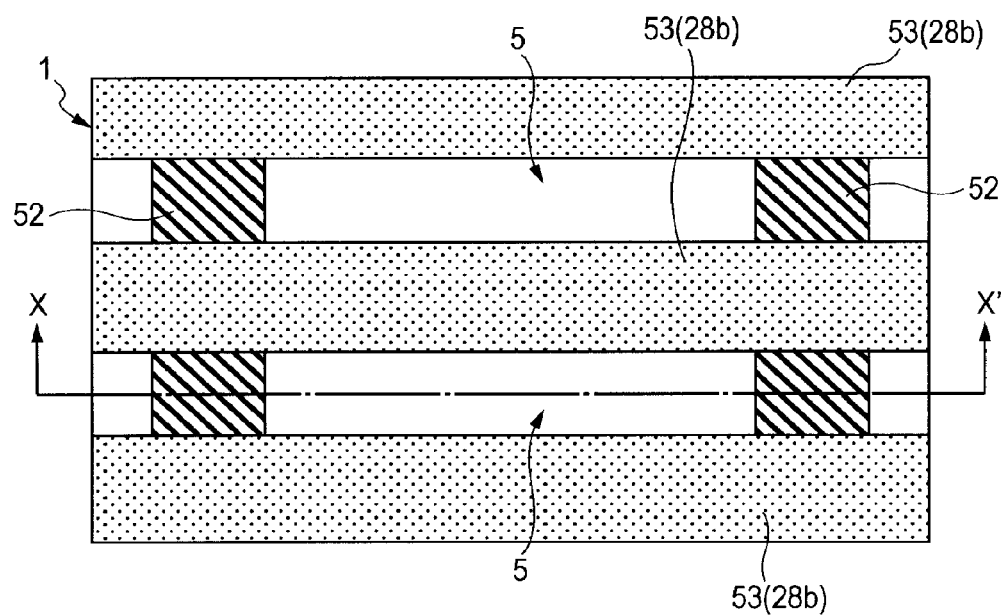
FIG. 55 is a device plan view of a resist film pattern (second resist film) which has been exposed to light using the optical mask of FIG. 54, and developed, subsequently to FIG. 53.
Figure 56:
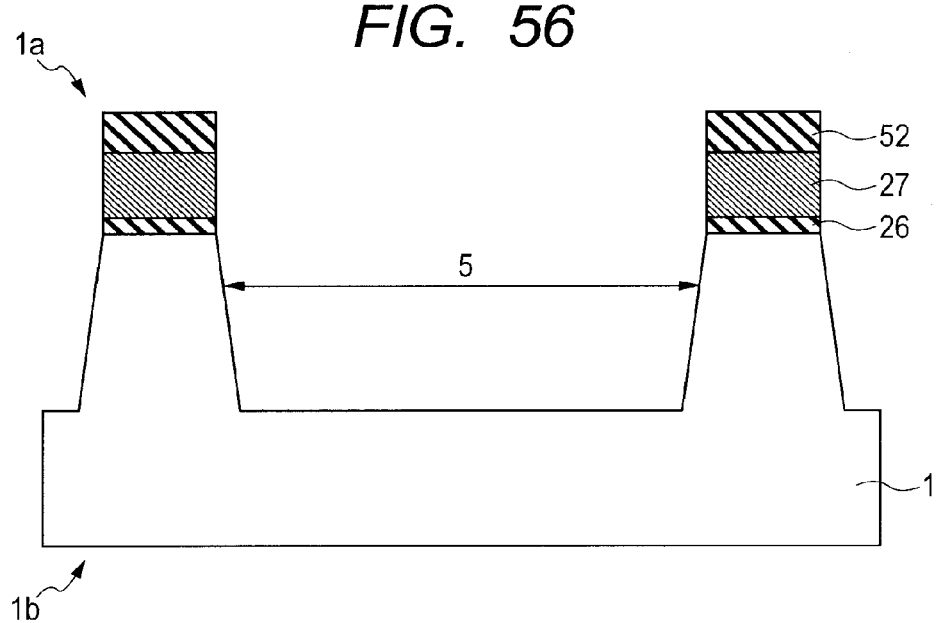
FIG. 56 is a device cross-sectional view corresponding to an X-X' cross section of FIG. 55.
Figure 57:
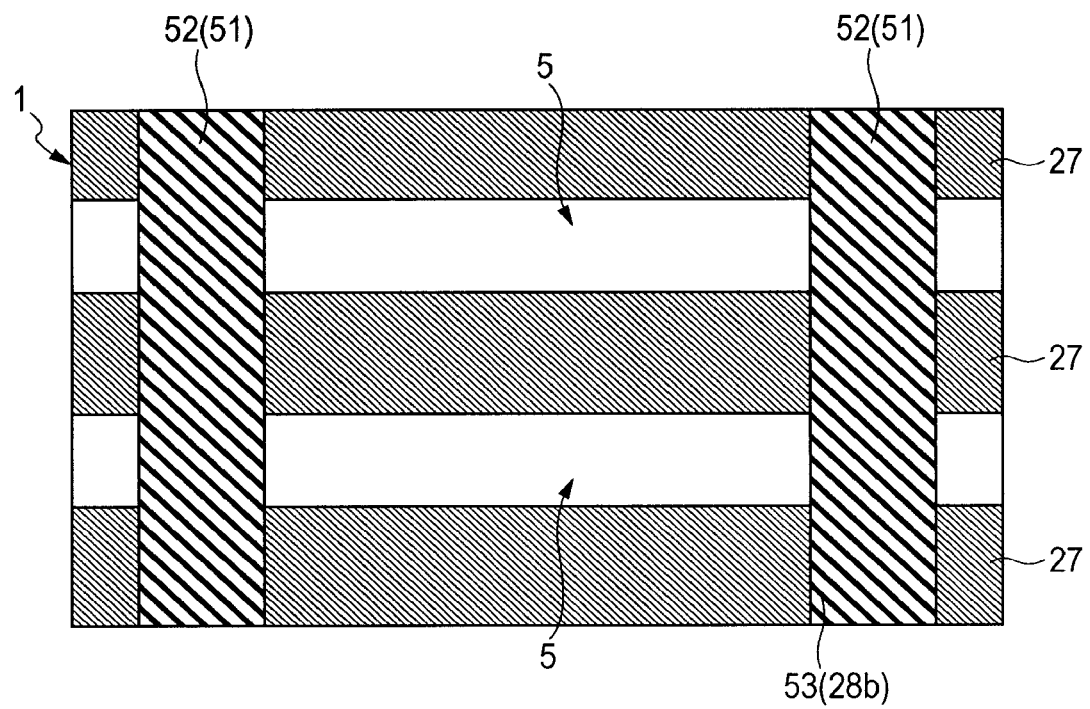
FIG. 57 is a device plan view (at the time when the removal of the second resist is completed) subsequent to FIG. 55.

FIG. 47 is a mask plan view showing an example (when a positive resist is used) of the first optical mask for processing a hard mask for the device portion of FIG. 1, which is for illustrating a process of forming the STI regions in a method of manufacturing a semiconductor device in another embodiment of the present invention. FIG. 48 is a plan view of a resist film pattern (first resist film) which has been exposed to light using the optical mask of FIG. 47, and developed. FIG. 49 is a device cross-sectional view corresponding to an X-X' cross section of FIG. 48. FIG. 50 is a device cross-sectional view (at the time when the etching of the hard mask is completed) subsequent to FIG. 49. FIG. 51 is a device plan view (at the time when the removal of the first resist film is completed) subsequent to FIG. 50. FIG. 52 is a device cross-sectional view corresponding to an X-X' cross section of FIG. 51. FIG. 53 is a device cross-sectional view (at the time when a second resist film is coated) subsequent to FIG. 52. FIG. 54 is a mask plan view showing an example (when a positive resist is used) of a second optical mask for the device portion of FIG. 1, which is for illustrating the process of forming the STI regions in the method of manufacturing the semiconductor device in the another embodiment of the present invention. FIG. 55 is a device plan view of a resist film pattern (second resist film) which has been exposed to light using the optical mask of FIG. 54, and developed, subsequently to FIG. 53. FIG. 56 is a device cross-sectional view corresponding to an X-X' cross section of FIG. 55. FIG. 57 is a device plan view (at the time when the removal of the second resist is completed) subsequent to FIG. 55. Based on the drawings, a description will be given of the process (composite mask process) of forming the STI regions in the method of manufacturing the semiconductor integrated circuit device in the another embodiment of the present invention.

In the state of FIG. 7 described in Section 2, over the silicon nitride film 27 for processing the STI regions, a silicon-oxide-based film having a thickness of, e.g., about 30 nm is deposited as a hard mask silicon oxide film 51 for processing the STI regions by, e.g., a CVD method or the like. The hard mask silicon oxide film 51 is used as an etching mask in the subsequent step of etching STI unit trench regions. Accordingly, in Section 5, the hard mask silicon oxide film 51 is used, but the etching mask is not limited thereto. Any etching mask may be used appropriately as long as it has a high etching selectivity to a wafer made of silicon. Subsequently, in the same manner as in FIG. 8, the resist film 28 for processing the STI regions is coated over the hard mask silicon oxide film 51 for processing the STI regions. Subsequently, the wafer 1 is introduced into the reduced projection exposure apparatus and, using the first optical mask 43 shown in FIG. 47, reduced projection exposure is executed. However, in this example, the resist film 28 for processing the STI regions of FIG. 8 is a first resist film 28a for processing the STI regions which is a positive resist. The first optical mask 43 includes a group of first linear shielding regions 54, mask openings 55 therebetween, and the like.

After the exposure, when the resist films 28a is developed, the linear first resist films 28a for processing the STI regions remain over the hard mask silicon oxide film 51 for processing the STI regions, as shown in FIG. 48. An X-X' cross section thereof is shown in FIG. 49.

Next, in this state, the hard mask silicon oxide film for processing the STI regions is patterned by, e.g., anisotropic dry etching or the like as shown in FIG. 50, thereby forming a group of first linear films 52 (FIGS. 51 and 52). Thereafter, when the first resist film 28a is removed, a state as shown in FIGS. 51 and 52 is provided.

Next, as shown in FIG. 53, over substantially the entire first main surface 1a of the wafer 1a, a second resist film 28b (e.g., a positive resist) for processing the STI regions is coated. Next, as shown in FIG. 54, a second optical mask 46 including a group of second linear shielding regions 57, the mask openings 55 therebetween, and the like is prepared. Subsequently, the wafer 1 over which the second resist film 28b is coated is introduced into the reduced projection exposure apparatus and, using the second optical mask 46 shown in FIG. 54, reduced projection exposure is executed. After the exposure, when the resist film 28b is developed, a group of second linear films 53 (FIG. 55) are obtained.

Next, in a state where there are the group of first linear films 52 and the group of second linear films 53 orthogonal to each other, anisotropic dry etching or the like is executed to the first main surface 1a of the wafer 1 to etch the silicon nitride film 27 for processing the STI regions, the pad silicon oxide film 26, and the silicon member of the surface 1a of the wafer 1. As a result, as shown in FIGS. 55 and 56, isolation trenches 5, i.e., STI unit trench regions each having a substantially rectangular shape longer in the row direction than in the column direction, and presenting a matrix configuration in the column direction and the row direction are formed. In the same manner as in Section 3, two exposure steps are performed using two linear masks, and the group of first linear films and the group of second linear films 53 each formed thereby are used as an etching mask for the STI unit trench regions each having a rectangular shape. Therefore, the end portions of the STI regions 5 can be avoided from being rounded. Additionally, in Section 5, for one of the etching masks for the STI unit trench regions, the group of linear films 52 comprised of silicon dioxide films are used. As a result, the STI regions 5 can be formed such that the end portions thereof are less rounded than those of the STI regions 5 formed in Section 3. However, an extra step for forming the group of linear films 52 comprised of silicon dioxide films is consequently added.

Subsequently, when the resist film 28b is removed, the upper surface of the wafer is in a state as shown in FIG. 57. This state corresponds to FIG. 35 in Section 3 and, thereafter, substantially the same process as in Section 3 may be continuously performed appropriately. The hard mask silicon oxide film 51 for processing the STI regions in FIG. 57 is automatically removed by the subsequent CMP process. In Section 3, the order of the two exposure steps for the resist film 28 is not specified. However, in Section 5, it is necessary to form the hard mask silicon oxide film 51 before the resist film 28b is deposited. However, the hard mask silicon oxide film 51 can be used either in the column direction or in the row direction.

§6. Description of Another Example of Device as Target of Method of Manufacturing Semiconductor Integrated Circuit Device in Each Embodiment of Present Invention, Etc. (Mainly Using FIGS. 58 and 59)

A flash memory described here is typically mounted as a dedicated memory on an independent chip, but may also be formed as an embedded memory. Here, the case where the flash memory is a dedicated memory will be specifically described. In the case where the flash memory is a dedicated memory, a wiring system is, e.g., a multilayer aluminum-based typical wiring 23 (FIG. 59), but only the first-layer wiring thereof will be described herein. In Section 6, a specific description will be given of a common-ground NOR flash memory, but the flash memory is not limited thereto. It will be appreciated that the flash memory is widely applicable to a flash memory having a similar STI region pattern in a matrix configuration.

In association with the manufacturing of the target device in Section 6, the processes described in Sections 2 to and the like can be executed without substantial modification or by applying thereto a correspondence relationship described below.

Figure 58:
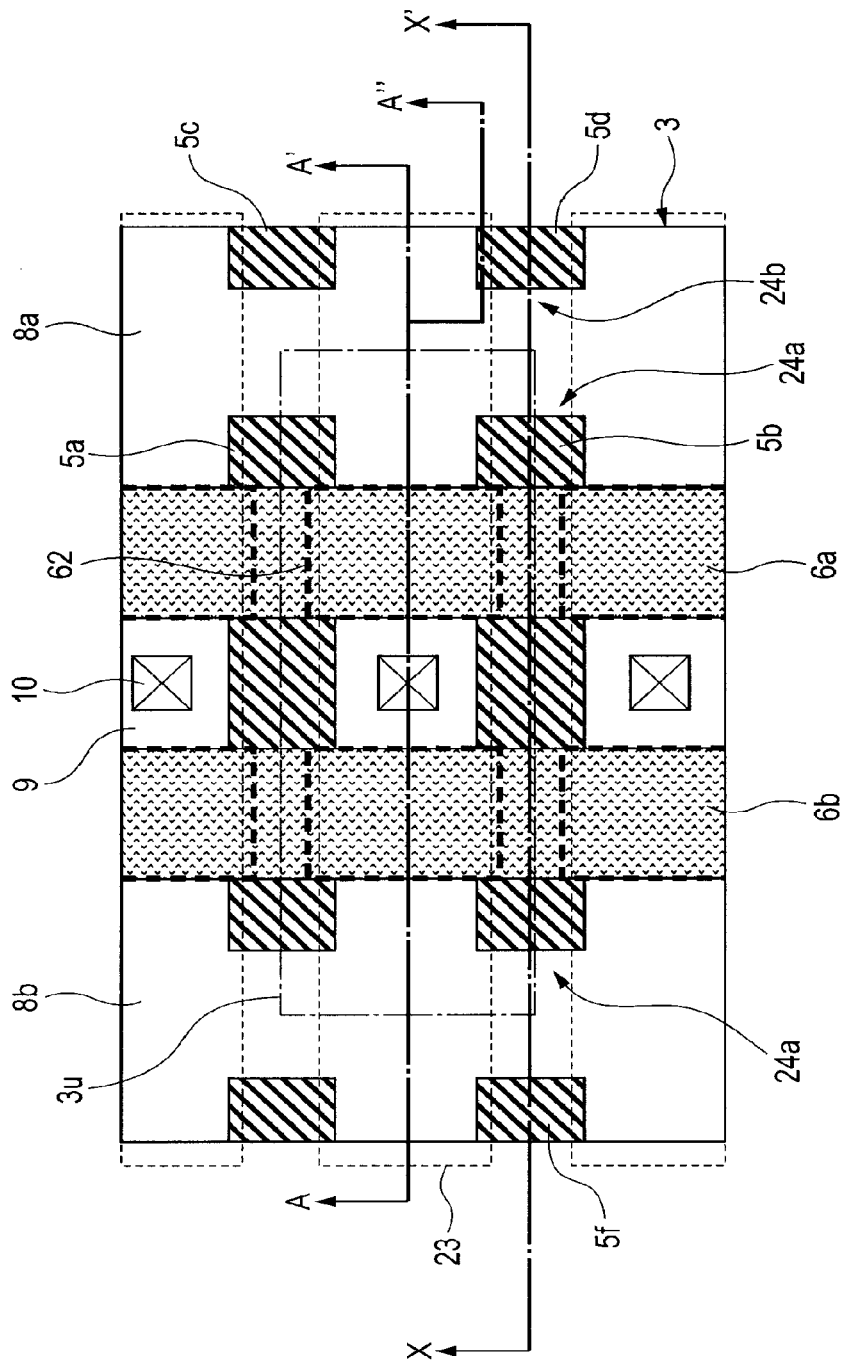
FIG. 58 is a device top view of a memory cell array portion corresponding to FIG. 1 in a NOR-type flash memory showing another example of a device as the target of the method of manufacturing the semiconductor device in each of the embodiments of the present invention.
Figure 59:
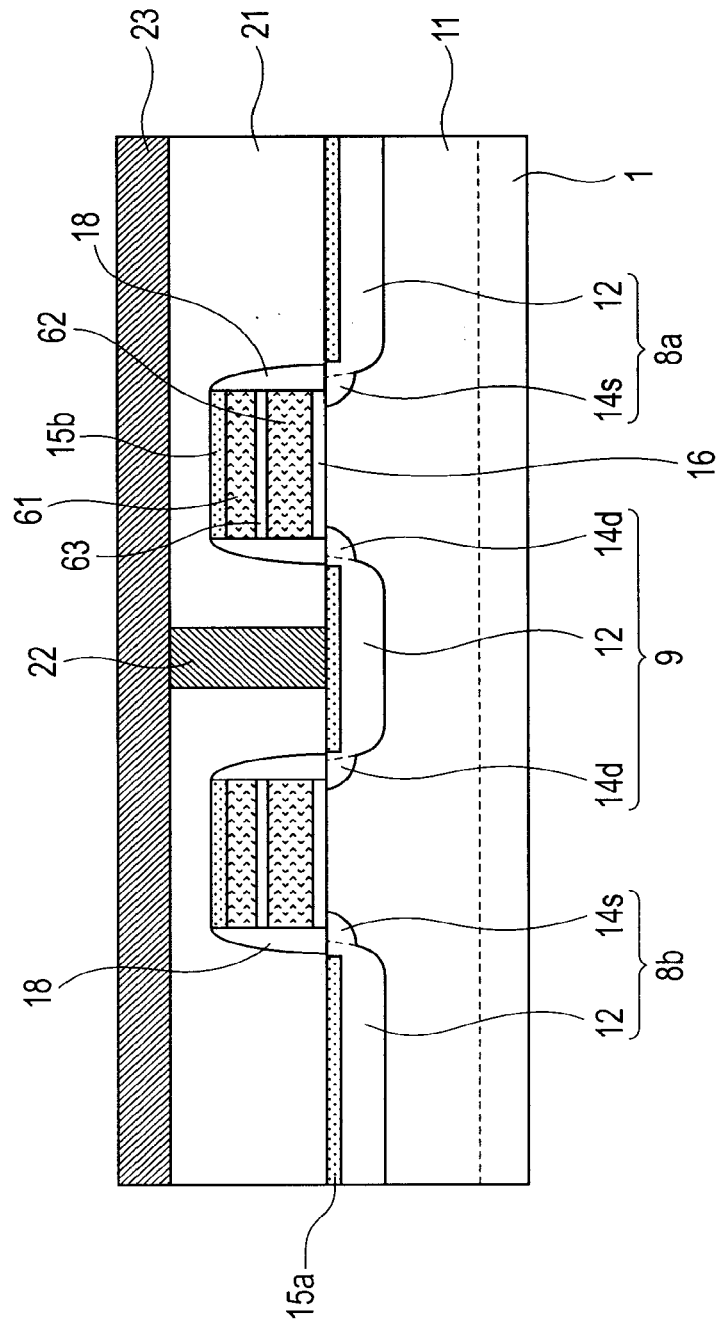
FIG. 59 is a device schematic cross-sectional view corresponding to an A-A' cross section of FIG. 58.

FIG. 58 is a device top view of a memory cell array portion corresponding to FIG. 1 in a NOR-type flash memory showing another example of a device as the target of the method of manufacturing the semiconductor device in each of the embodiments of the present invention. FIG. 59 is a device schematic cross-sectional view corresponding to an A-A' cross section of FIG. 58. Based on the drawings, a description will be given of another example of the device as the target of the method of manufacturing the semiconductor integrated circuit device in each of the embodiments of the present invention. Note that, since both of the plan structure and the cross-sectional structure are similar in numerous points to those in FIGS. 1 and 2 (Section 1), the description will be given mainly of the correspondence relationship therebetween and different points.

As shown in FIGS. 58 and 59, the individual shapes and arrangement of the STI regions 5a, 5b, 5c, 5d, 5e, and 5f are exactly the same as those in the example of Section 1. The largest difference from the example of Section 1 is that the control gate electrodes 6a and 6b are each formed of the second-layer polysilicon film (which is typically a polycide film). Under the control gate electrodes 6a and 6b, floating gates 62 (charge accumulation gates) each formed of the first-layer polysilicon film, and isolated correspondingly to the individual cells are provided.

Here, since the individual shapes and arrangement of the STI regions 5a, 5b, 5c, 5d, 5e, and 5f are exactly the same as those in the example of Section 1, the individual processes in Sections 3 and 5 are applicable thereto. At that time, as the control gate electrodes 6a and 6b, control gate electrodes corresponding to the selection gate electrodes 6a and 6b in Section 1 may be used appropriately.

§7. Description Related to Overall Lithography in Method of Manufacturing Semiconductor Integrated Circuit Device in Each Embodiment of Present Invention (1) In the exposure process described in Section 3 or 5, in the case of producing a 65-nm technology node product (including a product with a larger minimum dimension such as a 90-nm technology node product), it is preferable to perform exposure using a binary optical mask, an ArF excimer laser beam (at a wavelength of 193 nm), and a non-immersion reduced exposure apparatus. This is referred to as an "ArF non-immersion exposure method). (2) On the other hand, in the case of producing 45-nm and 32-nm technology node products, it is preferable to perform exposure using the method of (1) or a binary optical mask, an ArF excimer laser beam (at a wavelength of 193 nm), and an immersion reduced exposure apparatus (water or a high-refractivity liquid having a refractivity higher than that of water). The latter method is referred to as an "ArF immersion exposure method". (3) Further, in the case of producing 22-nm, 16-nm, and 10-nm technology node products, it is preferable to perform exposure using a binary optical mask and an Extreme Ultraviolet (EUV) reflective reduced projection exposure apparatus using a soft X-ray at a wavelength of about 15 nm. This is referred to as an "EUV exposure method". Note that, since a reflective optical mask is used in the EUV exposure method, each of the optical masks shown in the foregoing embodiments needs the following transformation. That is, light transmitting portions (openings) are transformed into reflecting portions, and light shielding portions are transformed into light absorbing portions (light attenuating portions). (4) Even when any of the foregoing exposure methods is used, since patterns for the STI regions are two-dimensional periodic patterns, i.e., patterns periodically arranged in rows and columns, a halftone phase shift mask, a Levenson-type alternating phase shift mask, or a phase shift mask in another form can be used appropriately instead of the binary optical mask.

§8. Summary

While the invention achieved by the present inventors has been specifically described heretofore based on the embodiments thereof, the present invention is not limited thereto. It will be appreciated that various modifications and changes can be made in the invention without departing from the gist thereof.

For example, in the foregoing embodiments, the specific description has been given using, as an example, the flash memory having split-gate flash memory cells each using the MONOS structure or the SONOS structure, but the present invention is not limited thereto. It will be appreciated that the present invention is applicable to an independent flash memory, a flash memory embedded in another chip, a Dynamic Random Access Memory (DRAM), a Static Random Access Memory (SRAM), other memories, and the like in each of which isolation regions have similar shapes and a similar arrangement.

What is claimed is:

1. A method of manufacturing a semiconductor integrated circuit device, comprising the steps of:
    (a) forming a silicon-nitride-based film over a first main surface of a wafer;
    (b) forming a silicon-oxide-based film over the silicon-nitride-based film;
    (c) processing the silicon-oxide-based film and a resist film disposed over the silicon-oxide-based film using a lithography process to form a group of first linear films extending in a column direction and openings such that the silicon-nitride-based film remains under the group of first linear films and the openings;
    (d) after the step (c), forming a resist film over the first main surface, and exposing the resist film to light;
    (e) subjecting the resist film to a development process to form a group of second linear films extending in a row direction;
    (f) after the step (e), in a state where there are the group of first linear films and the group of second linear films, performing an etching process to the first main surface to form, in a portion of the first main surface serving as a memory cell array, a plurality of STI unit trench regions each having a rectangular shape longer in the row direction than in the column direction into a matrix arranged in the column direction and the row direction;
    (g) forming a STI buried insulating film over the first main surface so as to be buried in the STI unit trench regions;
    (h) subjecting the STI buried insulating film located outside the STI unit trench regions to a planarization process to form a group of STI regions arranged in a matrix; and
    (i) after the step (h), forming first and second word lines longitudinally traversing, at predetermined space intervals, each row of the group of STI regions arranged in the matrix by a lithography process,
    wherein alignment in an exposure step in the lithography process in the step (i) is performed using positions in the column direction of the group of STI regions arranged in the matrix as a reference.

2. A method of manufacturing a semiconductor integrated circuit device according to claim 1, further comprising the step of:
    (j) after the step (i), forming first and second electrode lines along and outside respective first and second word lines by self-alignment.

3. A method of manufacturing a semiconductor integrated circuit device according to claim 1,
    wherein the planarization process includes a chemical mechanical polishing step.

4. A method of manufacturing a semiconductor integrated circuit device according to claim 1,
    wherein the memory cell array is a cell array of a NOR-type flash memory.

5. A method of manufacturing a semiconductor integrated circuit device according to claim 2,
    wherein the memory cell array is a cell array of a split-gate flash memory having a charge accumulation film.

6. A method of manufacturing a semiconductor integrated circuit device, comprising the steps of:
    (a) forming a silicon-nitride-based film over a first main surface of a wafer;
    (b) forming a silicon-oxide-based film over the silicon-nitride-based film;
    (c) processing the silicon-oxide-based film by a lithography process to form a group of first linear films extending in a first direction and openings such that the silicon-nitride-based film remains under the group of first linear films and the openings;
    (d) after the step (c), forming a resist film over the first main surface, and exposing the resist film to light;
    (e) subjecting the resist film to a development process to form a group of second linear films extending in a second direction perpendicular to the first direction;
    (f) after the step (e), in a state in which the group of first linear films and the group of second linear films have been formed, performing an etching process to the first main surface to form, in a portion of the first main surface serving as a memory cell array, a plurality of STI unit trench regions each having a rectangular shape longer in the first direction than in the second direction and formed into a matrix arranged in the first direction and the second direction;
    (g) forming a STI buried insulating film over the first main surface so as to be buried in the STI unit trench regions;
    (h) subjecting the STI buried insulating film located outside the STI unit trench regions to a planarization process to form a group of STI regions arranged in a matrix; and
    (i) after the step (h), forming first and second word lines longitudinally traversing, at predetermined space intervals, each row of the group of STI regions arranged in the matrix by a lithography process, wherein alignment in an exposure step in the lithography process in the step (i) is performed using positions in the second direction of the group of STI regions arranged in the matrix as a reference.

7. A method of manufacturing a semiconductor integrated circuit device according to claim 6, further comprising the step of:
   (j) after the step (i), forming first and second electrode lines along and outside respective first and second word lines by self-alignment.

8. A method of manufacturing a semiconductor integrated circuit device according to claim 6,
   wherein the planarization process includes a chemical mechanical polishing step.

9. A method of manufacturing a semiconductor integrated circuit device according to claim 6,
   wherein the memory cell array is a cell array of a NOR-type flash memory.

10. A method of manufacturing a semiconductor integrated circuit device according to claim 7,
    wherein the memory cell array is a cell array of a split-gate flash memory having a charge accumulation film.

11. A method of manufacturing a semiconductor integrated circuit device including memory cells, comprising the steps of:
    (a) forming a first film over a semiconductor substrate;
    (b) forming a second film over the silicon-nitride-based film;
    (c) patterning the first film by a lithography process to form a group of first patterns extending in a first direction and openings formed between the first patterns such that the second film remains under the group of first patterns and the openings;
    (d) after the step (c), forming a resist film over the semiconductor substrate, and exposing the resist film to light;
    (e) forming the resist film to a development process to form a group of second patterns extending in a second direction perpendicular to the first direction;
    (f) after the step (e), in a state in which the group of first patterns and the group of second patterns have been formed, performing an etching process to form, in a portion of the semiconductor substrate serving as a memory cell array, a plurality of STI unit trench regions each having a rectangular shape and formed into a matrix arranged in the first direction and the second direction;
    (g) burying an insulating film in the STI unit trench regions;
    (h) forming a group of STI regions arranged in a matrix by removing the insulating film located outside the STI unit trench regions; and
    (i) after the step (h), forming word lines extending in the first direction and longitudinally traversing each row of the group of STI regions by a lithography process,
    wherein alignment in an exposure step in the lithography process in the step (i) is performed using positions in the first direction of the group of STI regions as a reference.

12. A method of manufacturing a semiconductor integrated circuit device according to claim 11, further comprising the step of:
    (j) after the step (i), forming first and second electrode lines along and outside respective word lines by self-alignment.

13. A method of manufacturing a semiconductor integrated circuit device according to claim 11,
    wherein the planarization process includes a chemical mechanical polishing step.

14. A method of manufacturing a semiconductor integrated circuit device according to claim 11,
    wherein the memory cell array is a cell array of a NOR-type flash memory.

15. A method of manufacturing a semiconductor integrated circuit device according to claim 12,
    wherein the memory cell array is a cell array of a split-gate flash memory having a charge accumulation film.

\* \* \* \* \*